(12) United States Patent
Takahashi

(10) Patent No.: US 8,125,047 B2
(45) Date of Patent: Feb. 28, 2012

(54) SEMICONDUCTOR DEVICE AND METHOD OF MANUFACTURING THE SAME

(75) Inventor: Tsuyoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 585 days.

(21) Appl. No.: 12/174,010

(22) Filed: Jul. 16, 2008

(65) Prior Publication Data

US 2008/0272456 A1 Nov. 6, 2008

Related U.S. Application Data

(63) Continuation of application No. PCT/JP2006/300547, filed on Jan. 17, 2006.

(51) Int. Cl.
*H01L 31/05* (2006.01)

(52) U.S. Cl. ........ 257/522; 257/750; 257/775; 257/377; 257/E23.128

(58) Field of Classification Search ................... 257/522, 257/377, 750, 775, E23.128
See application file for complete search history.

(56) References Cited

U.S. PATENT DOCUMENTS

| | | |
|---|---|---|
| 6,309,958 B1 | 10/2001 | Okada |
| 2002/0089385 A1 | 7/2002 | Ishikawa et al. |
| 2003/0201851 A1 | 10/2003 | Yoshida et al. |
| 2006/0215858 A1 * | 9/2006 | Pedersen ........................ 381/191 |
| 2009/0206422 A1 * | 8/2009 | Illing et al. ..................... 257/419 |
| 2010/0140669 A1 * | 6/2010 | Xie ................................ 257/254 |

FOREIGN PATENT DOCUMENTS

| | | |
|---|---|---|
| JP | 2-143446 A | 6/1990 |
| JP | 6-310612 A | 11/1994 |
| JP | 9-162285 A | 6/1997 |
| JP | 10-242717 A | 9/1998 |
| JP | 11-17467 A | 1/1999 |
| JP | 11-145386 A | 5/1999 |
| JP | 2000-91426 A | 3/2000 |
| JP | 2000-232220 A | 8/2000 |
| JP | 2001-223331 A | 8/2001 |
| JP | 2002-190545 A | 7/2002 |
| JP | 2004-7424 A | 1/2004 |

OTHER PUBLICATIONS

International Search Report of PCT/JP2006/300547, date of mailing Apr. 4, 2006.

* cited by examiner

*Primary Examiner* — Minchul Yang

(57) ABSTRACT

A semiconductor device comprises a buffer layer 16 of an i-InAlAs layer formed over an SI-InP substrate 14, insulating films 24, 36 of BCB formed over the buffer layer 16, and a coplanar interconnection including a signal line 52 and ground lines 54 formed over the insulating film 36, a cavity 46 is formed in the SI-InP substrate 14, the buffer layer 16 and the insulating film below the signal line 52, and pillar-shaped supports in the cavity 46 support the insulating films 34, 36 which are the ceiling of the cavity 46.

9 Claims, 47 Drawing Sheets

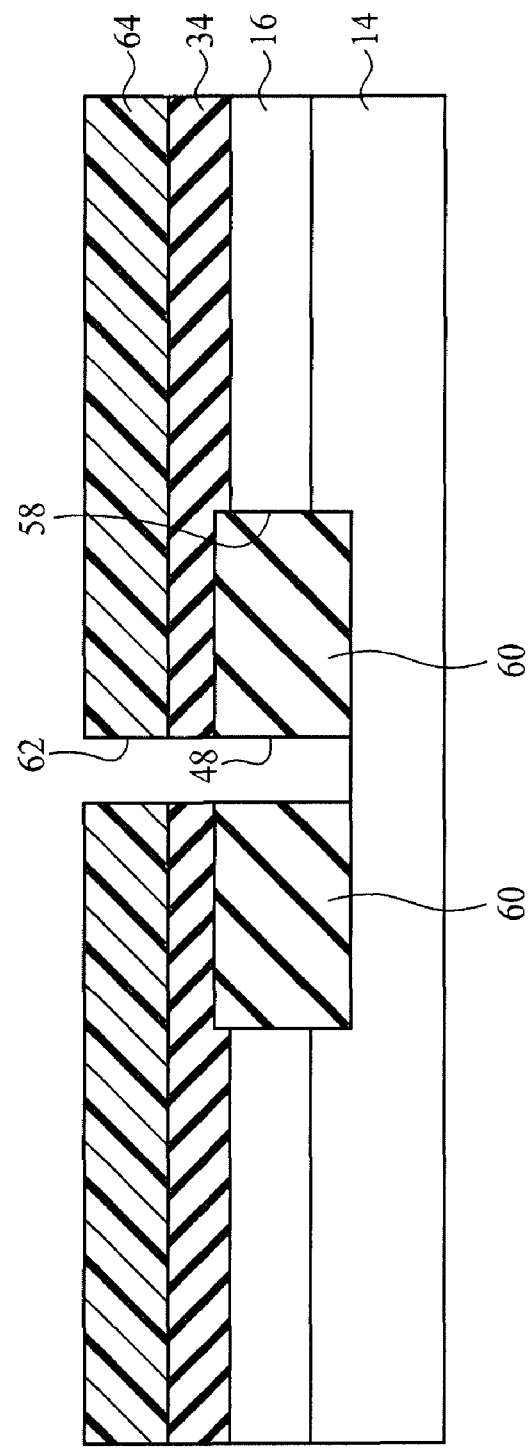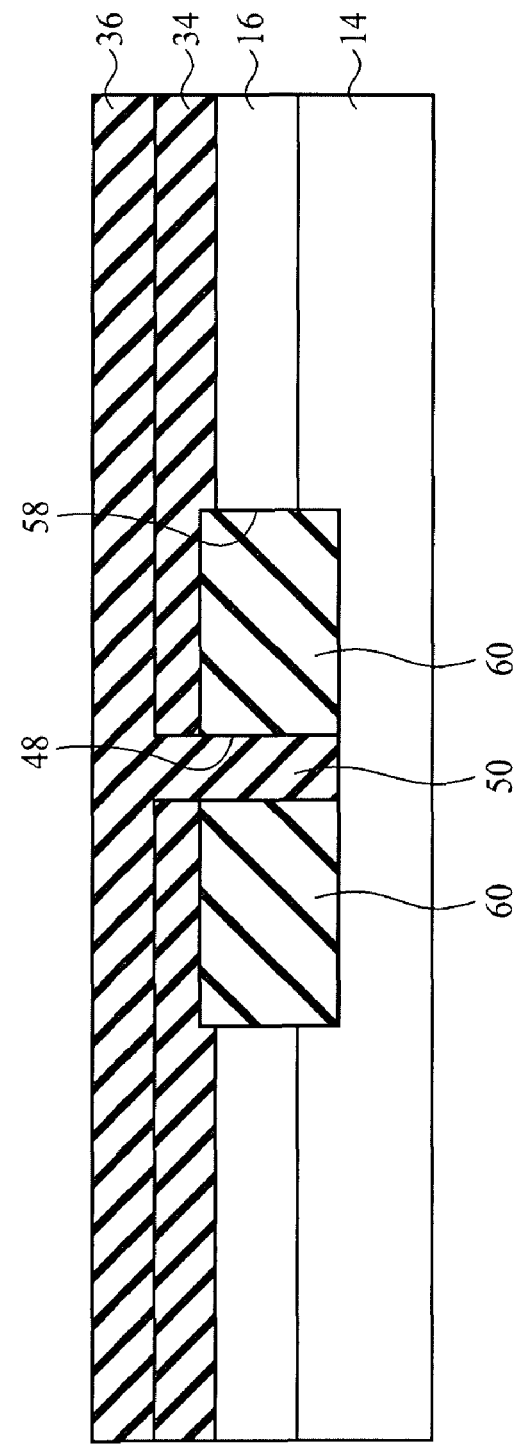
FIG. 5A
FIG. 5B

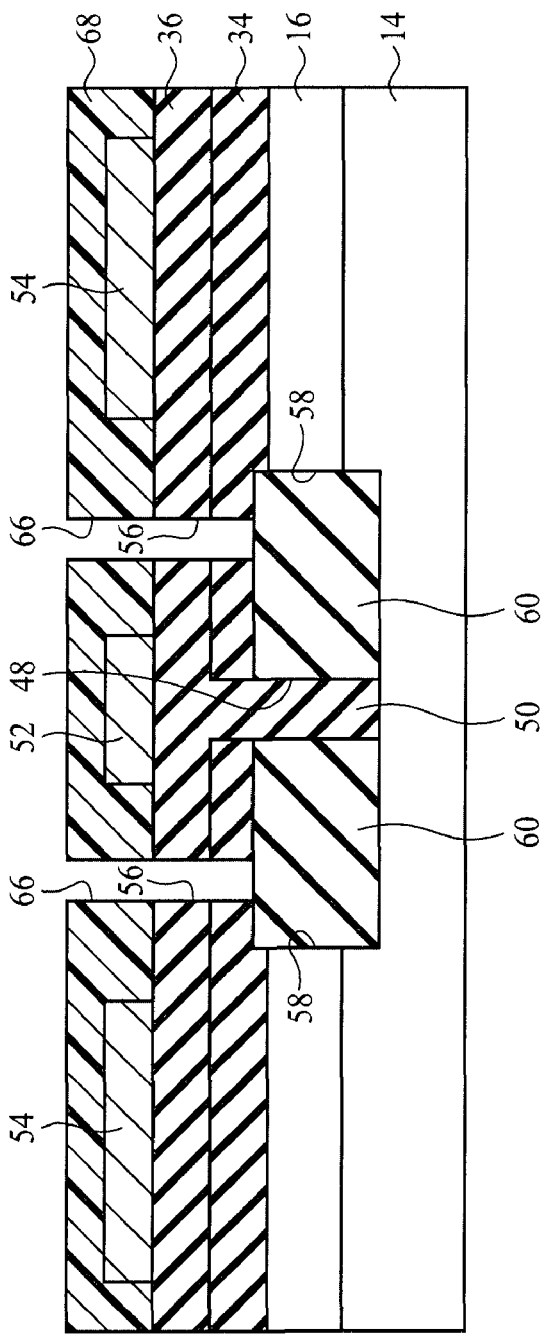
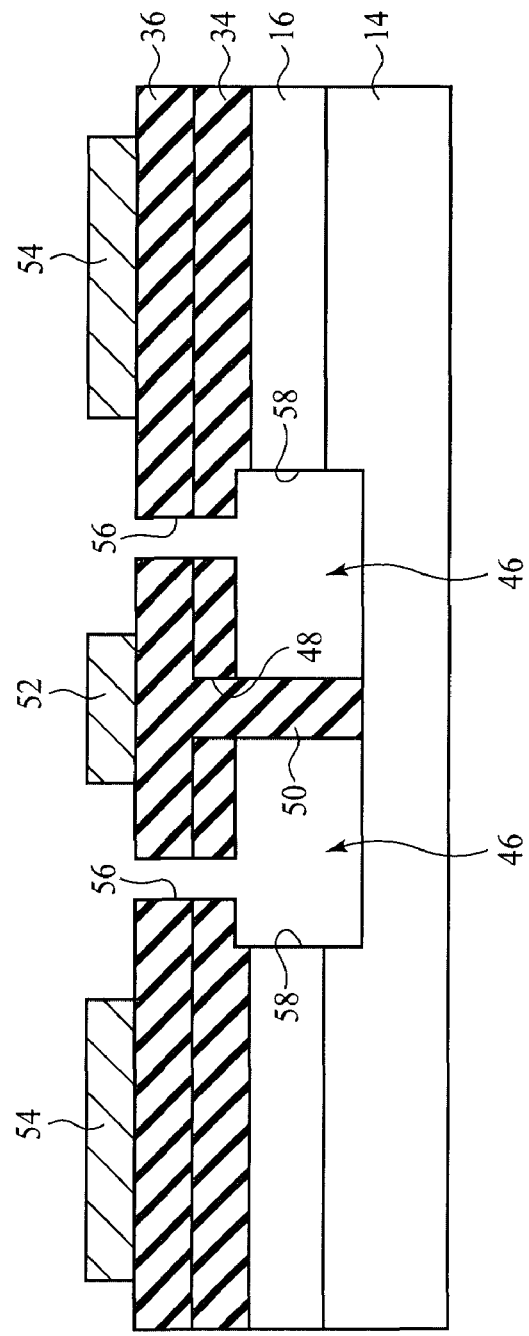
FIG. 7A
FIG. 7B

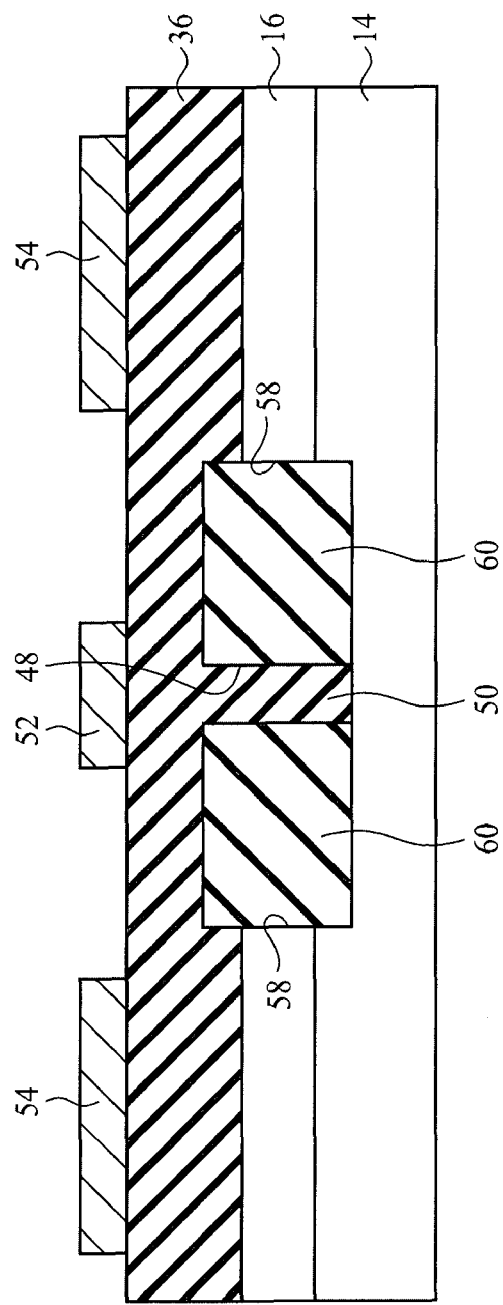
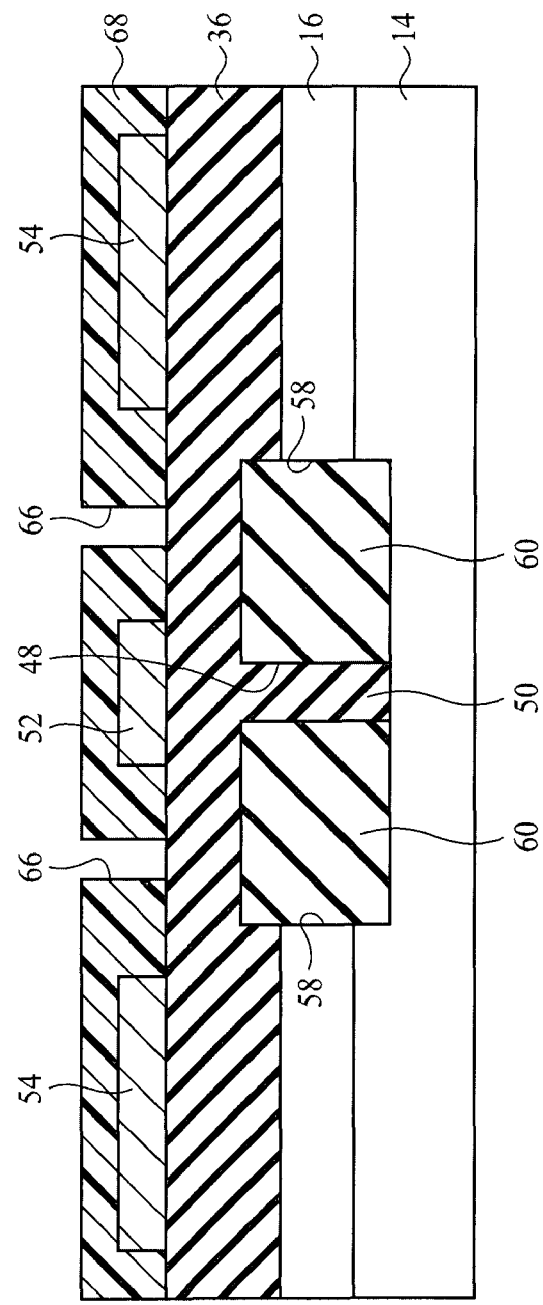
FIG. 11A
FIG. 11B

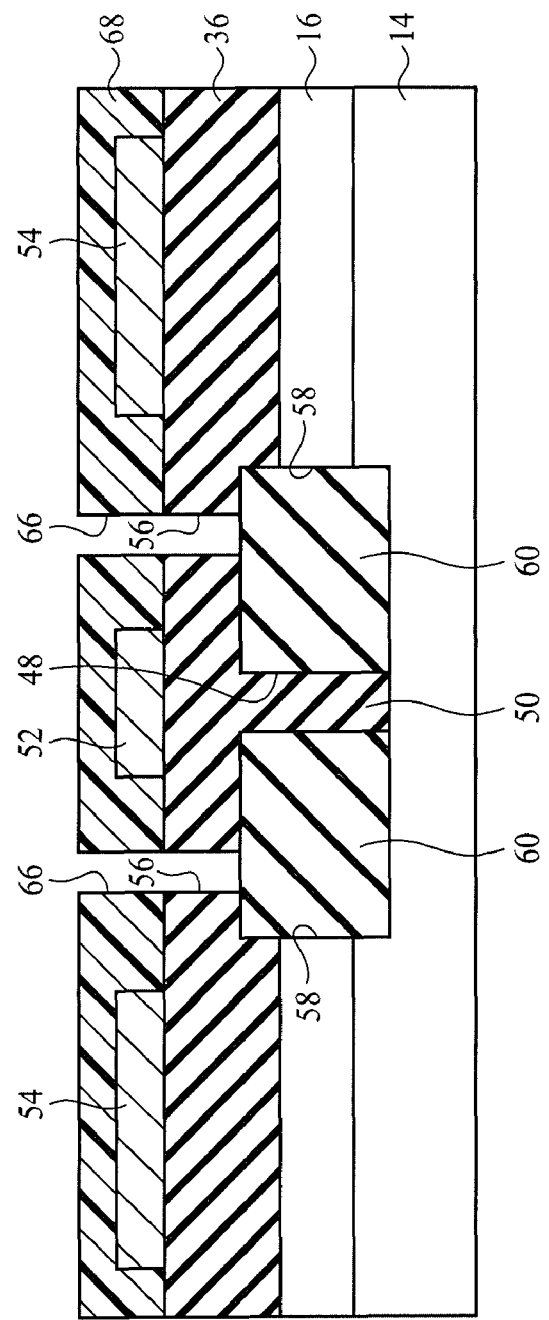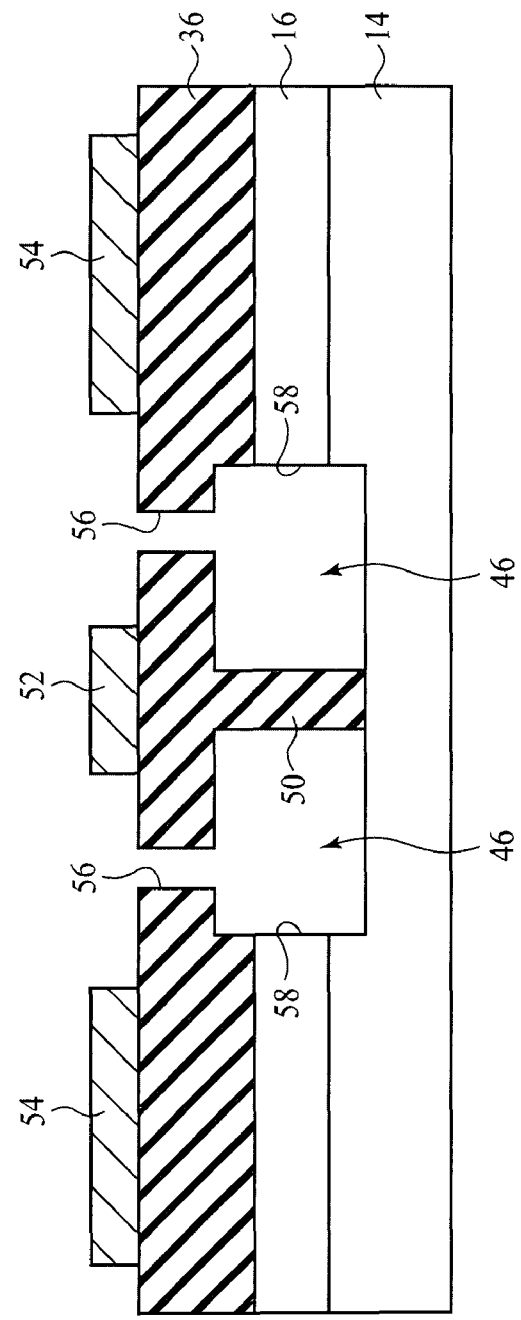
FIG. 12A
FIG. 12B

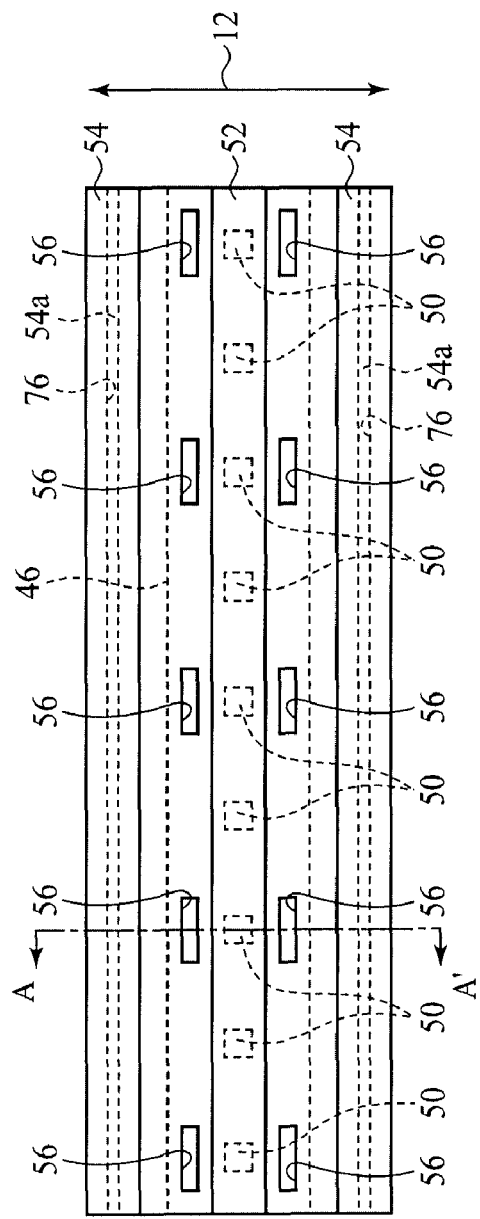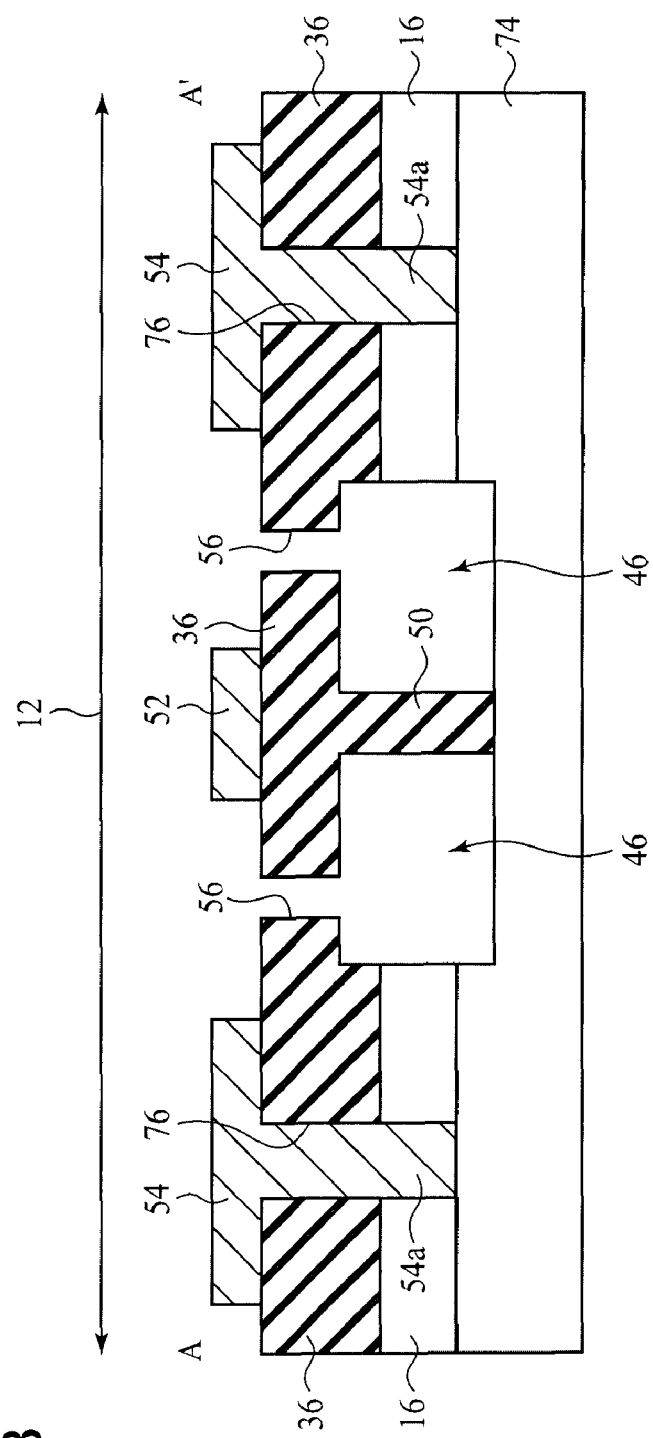
FIG. 15A
FIG. 15B

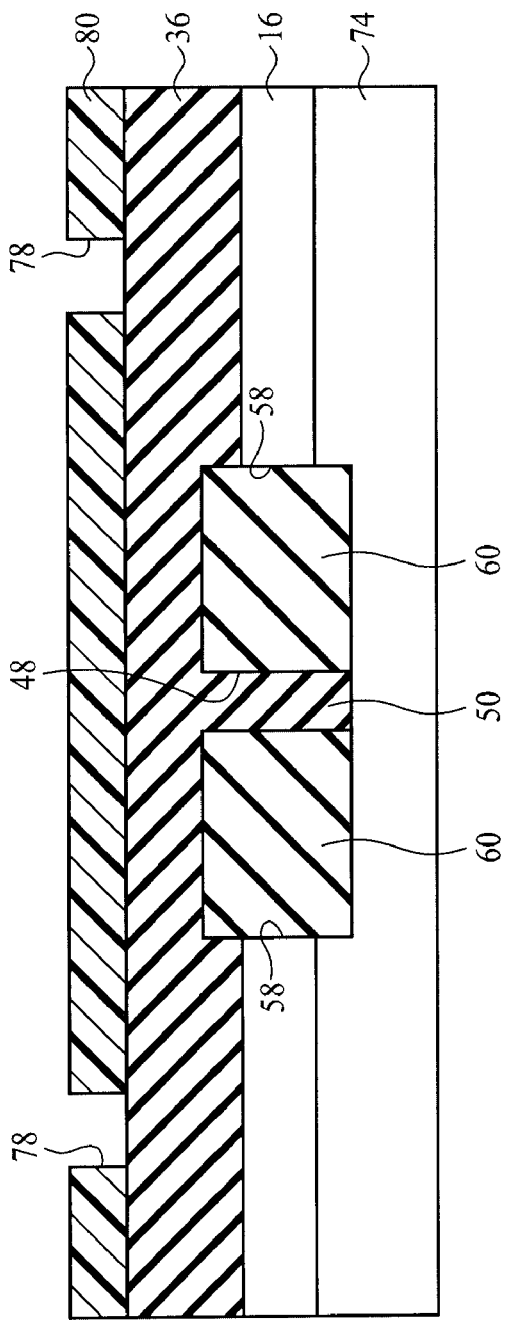
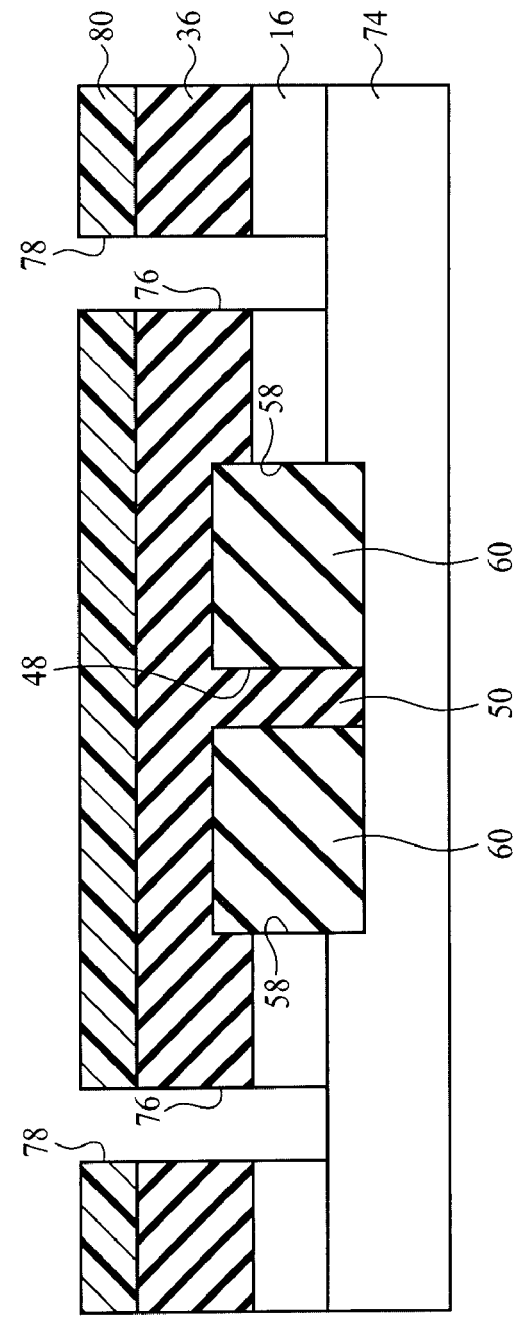
FIG. 19A
FIG. 19B

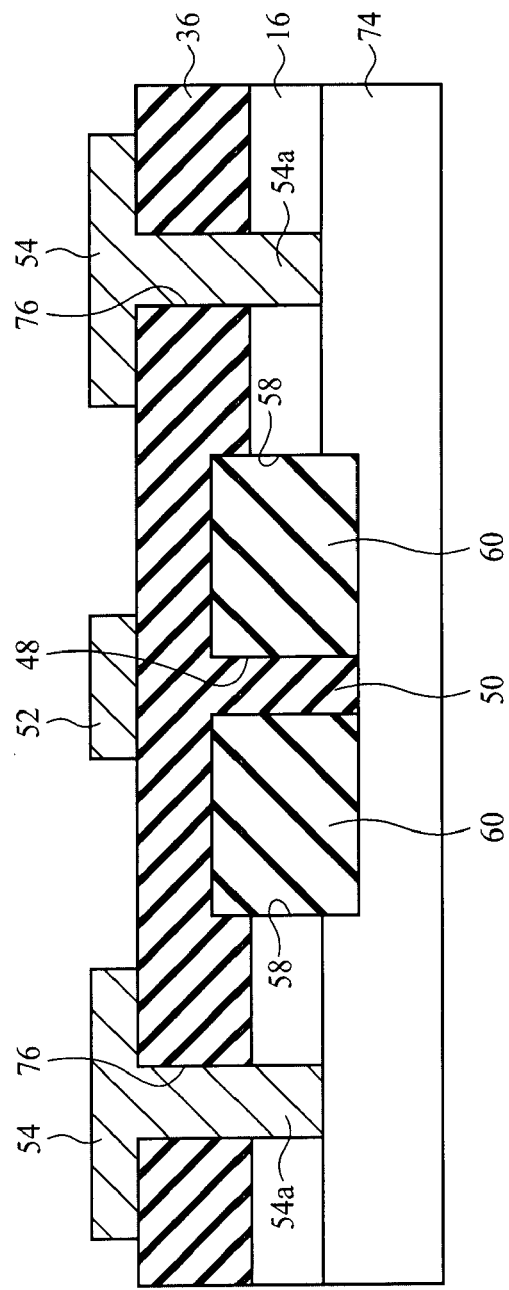
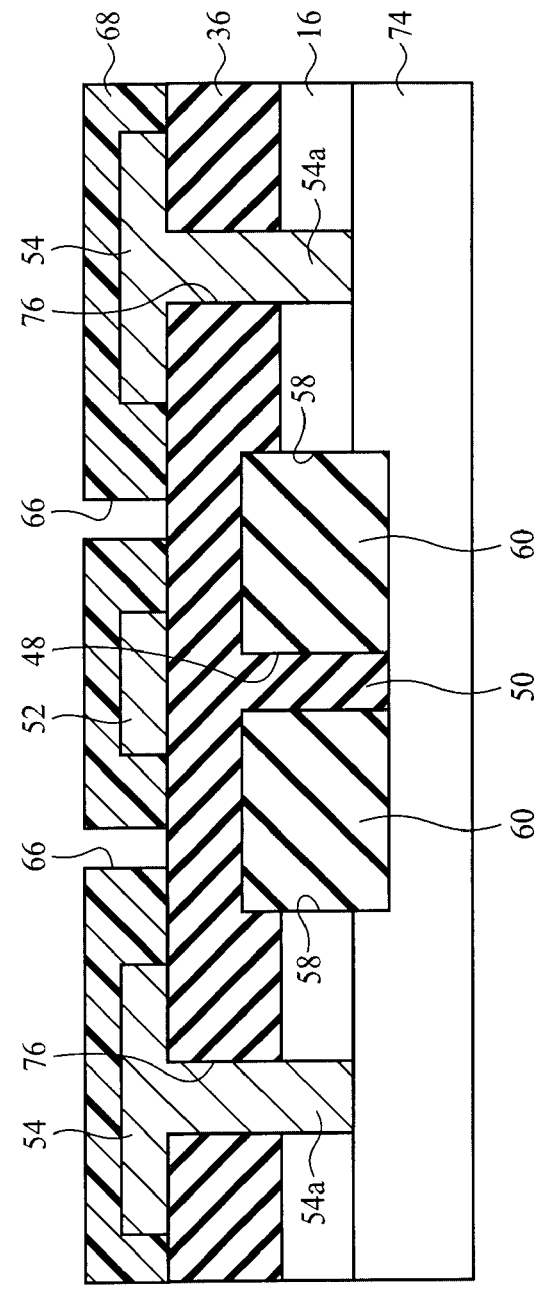
FIG. 20A
FIG. 20B

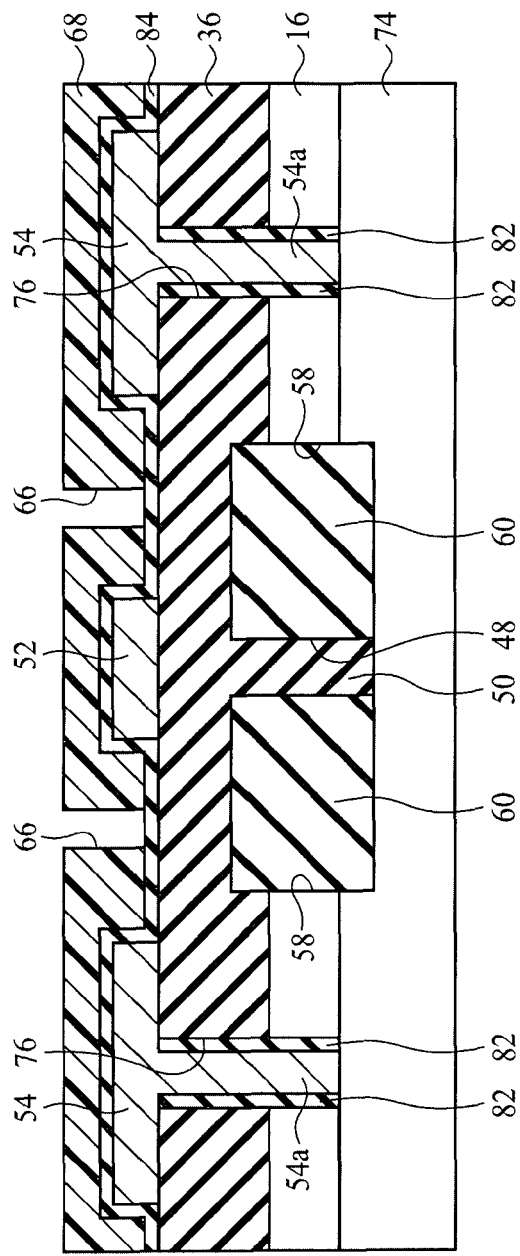
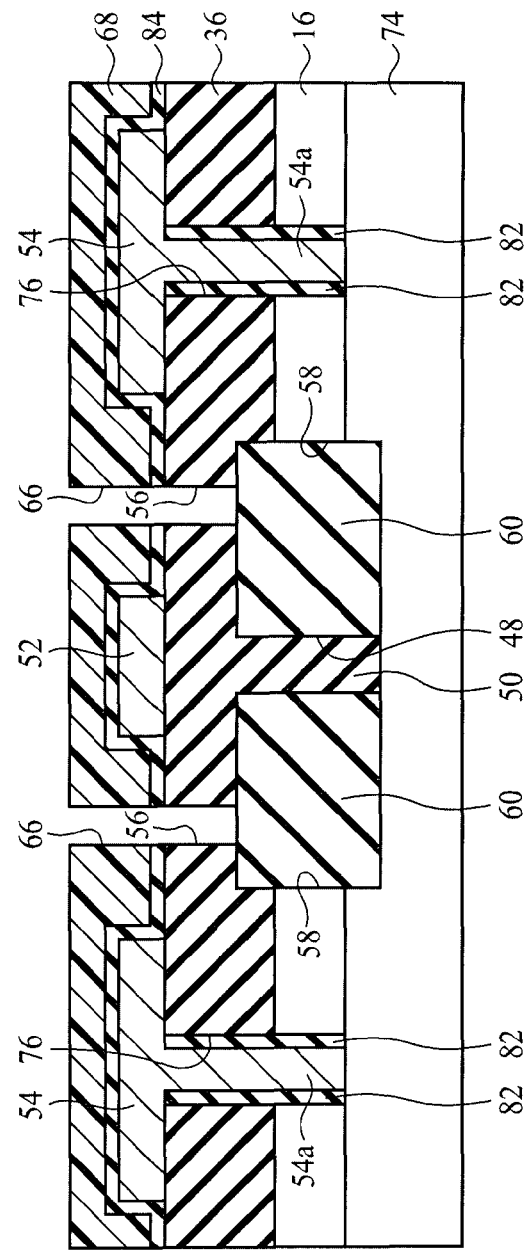
FIG. 25A
FIG. 25B

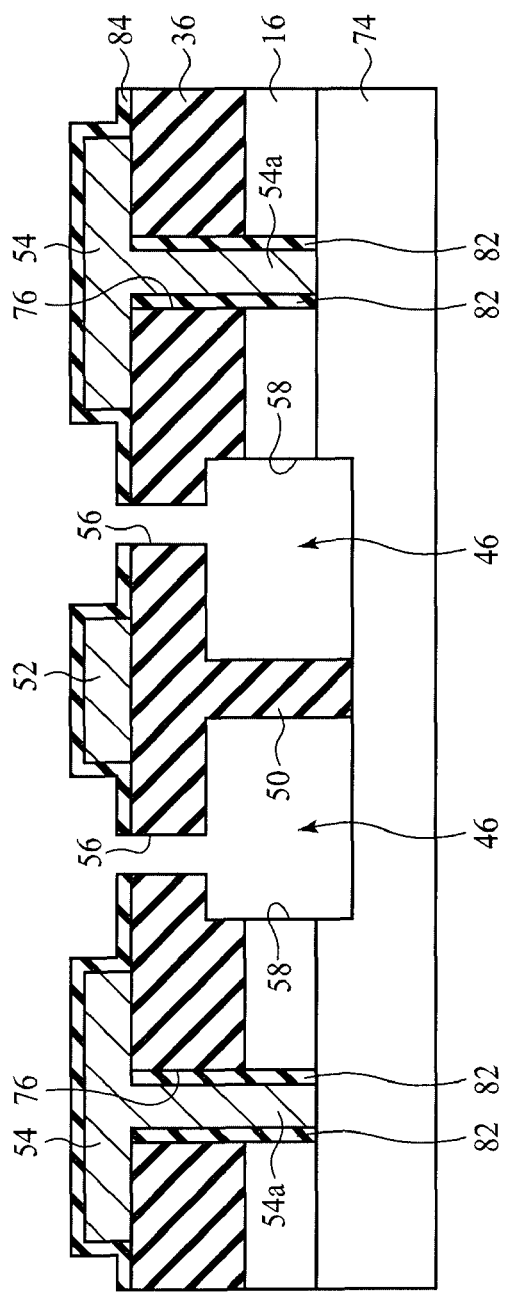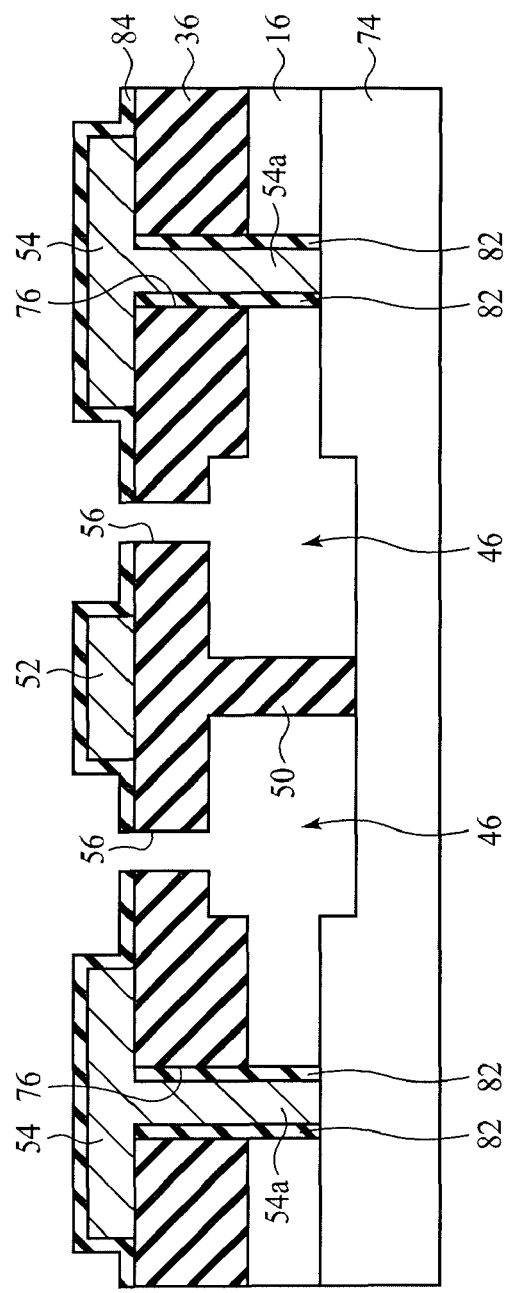

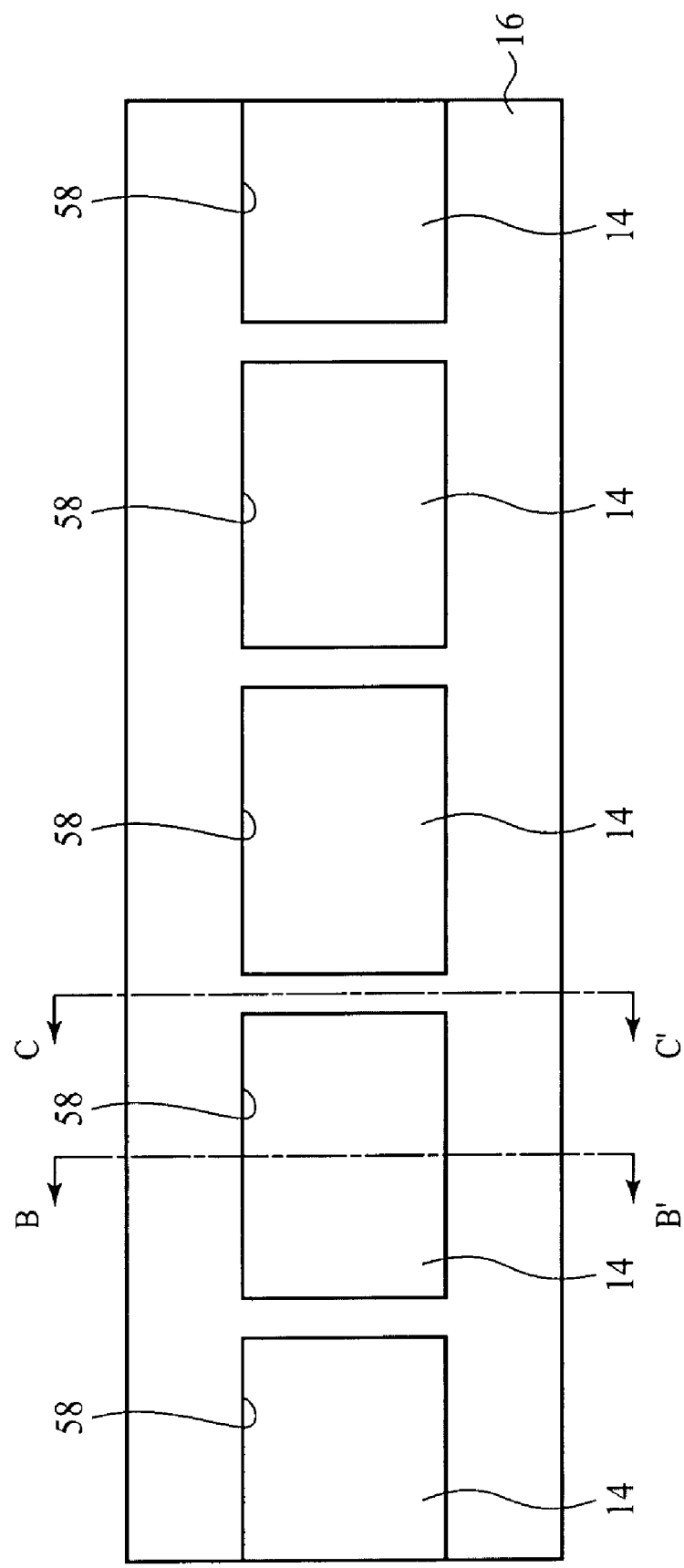

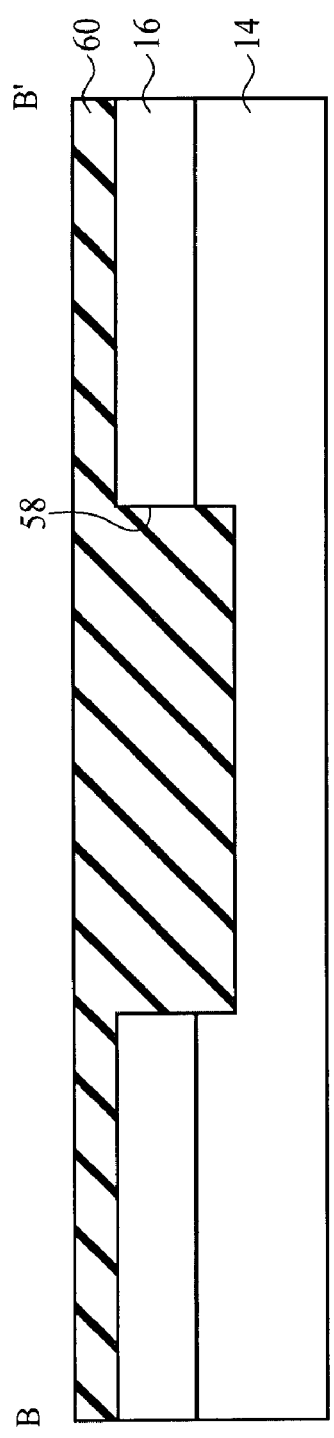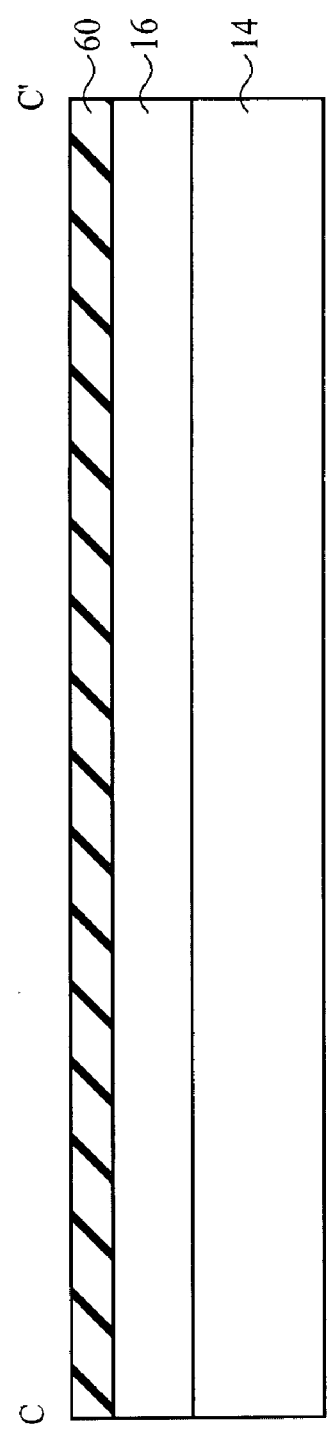
FIG. 35A
FIG. 35B

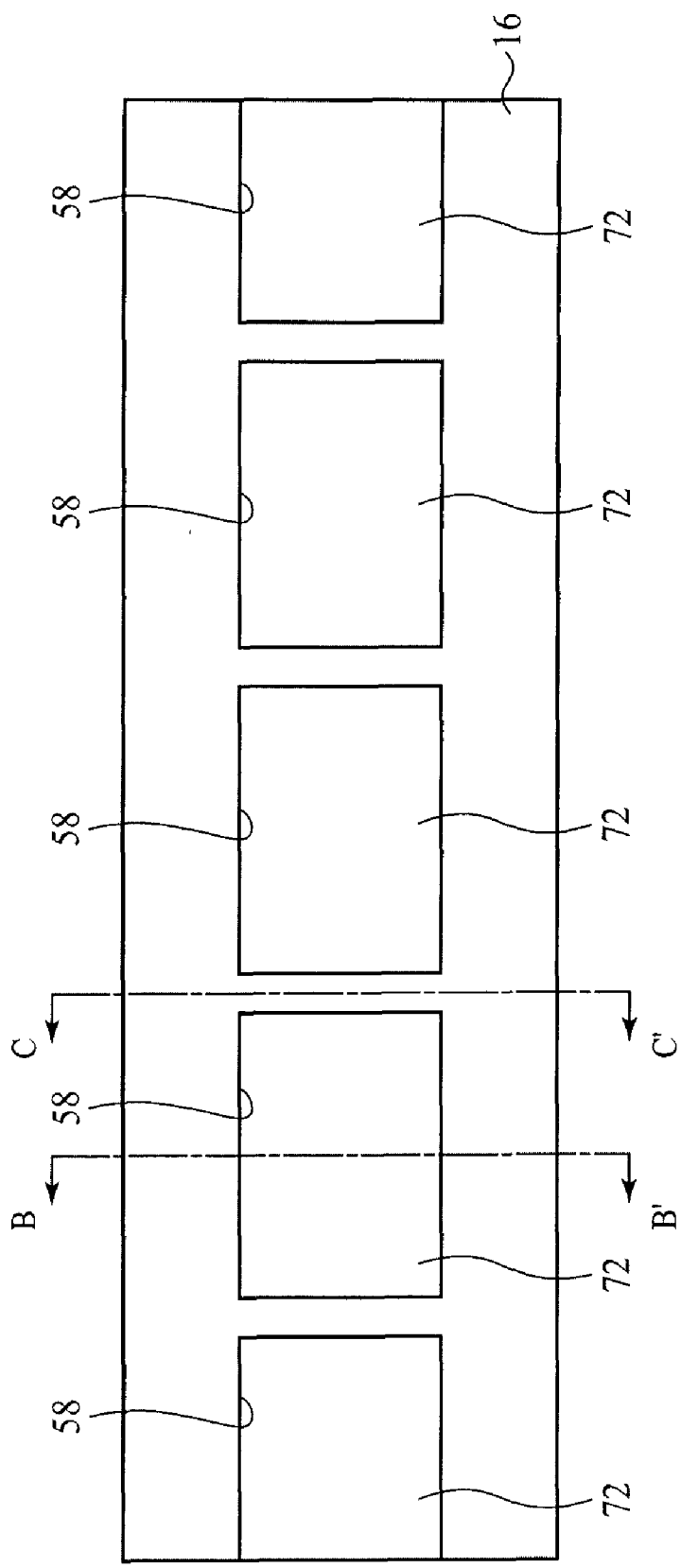

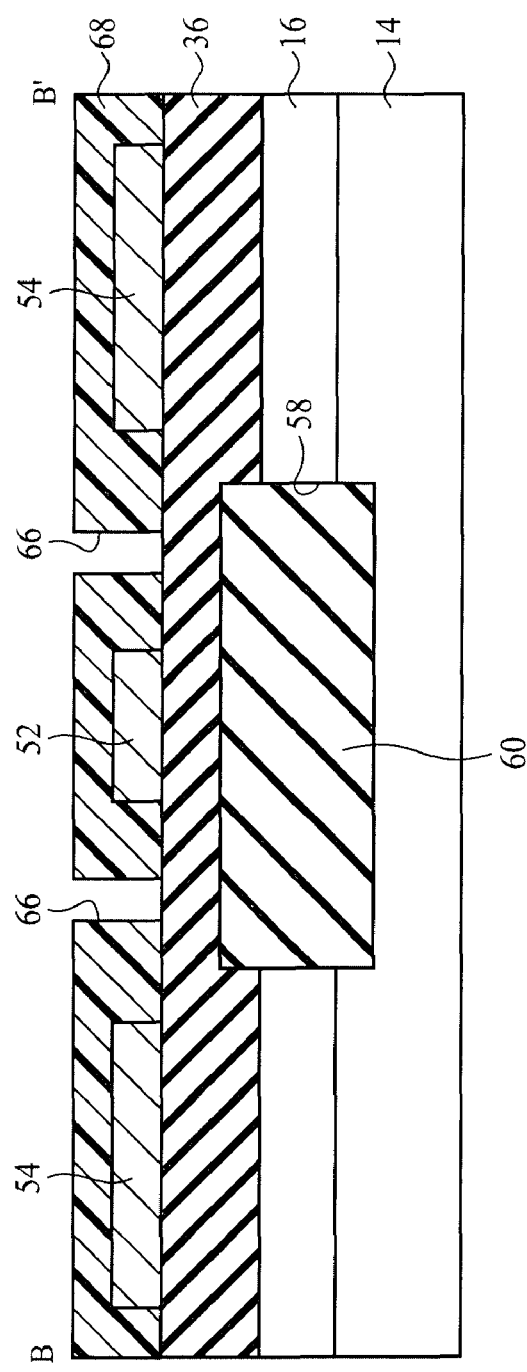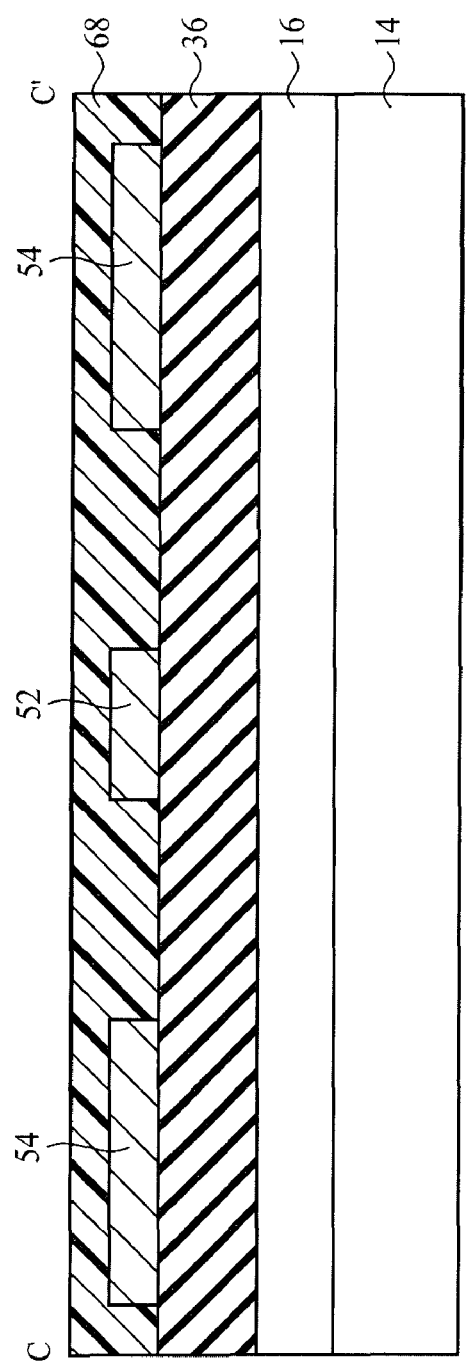
FIG. 43A
FIG. 43B

US 8,125,047 B2

SEMICONDUCTOR DEVICE AND METHOD OF MANUFACTURING THE SAME

CROSS REFERENCE TO RELATED APPLICATIONS

This application is a Continuation of International Application No. PCT/JP2006/300547, with an international filing date of Jan. 17, 2006, which designating the United States of America, the entire contents of which are incorporated herein by reference.

TECHNICAL FIELD

The present invention relates to a semiconductor device using a compound semiconductor, more specifically, a semiconductor device including an interconnection formed over a substrate, and a method of manufacturing the same.

BACKGROUND

As devices using compound semiconductors are known field effect devices and bipolar devices, such as InP-HEMT (High Electron Mobility Transistor), InP-HBT (Heterojunction Bipolar Transistor), etc. Specifically, InP-HEMT is applied to signal processing circuits of the optical communication and high-speed digital circuits of others because of the high-speed characteristic. InP-HEMT is expected to be applied also to amplifiers of the microwave band and the milliwave band because of the low noise characteristic.

The interconnection among such devices using compound semiconductors is generally provided by forming an insulating film over a semi-insulating substrate and forming Au interconnections thereover. In MMIC (Microwave Monolithic Integrated Circuit), etc. requiring operations at higher frequencies, the coplanar interconnection structure is used in more cases so as to match the impedance between interconnections.

In such interconnection, as the operation frequency is higher, the loss due to the interconnection resistance and the transmission loss of the signal due to the dielectric loss are easily generated.

Background arts are disclosed in, e.g., Japanese published unexamined patent application No. 2000-91426, Japanese published unexamined patent application No. 2001-223331, Japanese published unexamined patent application No. Hei 11-145386, Japanese published unexamined patent application No. Hei 9-162285, Japanese published unexamined patent application No. Hei 10-242717, Japanese published unexamined patent application No. Hei 11-017467 and Japanese published unexamined patent application No. 2002-190545.

To generate no dielectric loss, the state that no dielectric is present around the interconnections is ideal. Especially, it will be effective that no semiconductor substrate is present.

In the usual compound semiconductor device, a semi-insulating semiconductor substrate is used as the substrate. However, depending on the use purpose, application, etc. of the device, an n-type conductive semiconductor substrate is often used. In this case, because of the conductivity of the substrate, the signal is attenuated, and the transmission characteristics are undesirably deteriorated.

In Japanese published unexamined patent application No. 2000-91426, etc., cavities are provided on the side of the substrate so as to improve the transmission characteristics, etc. However, the technique disclosed in Japanese published unexamined patent application No. 2000-91426, etc. cannot form cavities which are large enough to decrease the dielectric loss, and if large cavities are formed, there will be a risk that the ceilings of the cavities would collapse.

SUMMARY

According to one aspect of an embodiment, there is provided a semiconductor device comprising: a semiconductor layer formed over a substrate; an insulating film formed over the semiconductor layer; an interconnection formed over the insulating film; a cavity formed in at least the semiconductor layer below the interconnection; and a support formed in the cavity supporting the insulating film.

According to another aspect of an embodiment, there is provided a method of manufacturing a semiconductor device comprising: forming a semiconductor layer over a substrate; forming a first opening in at least the semiconductor layer; forming a resin layer buried in the first opening; forming in the resin layer a second opening down to the substrate; forming over the semiconductor layer and the resin layer an insulating film having a pillar-shaped support buried in the second opening; forming an interconnection over the insulating film; forming in the insulating film a third opening down to the resin layer; and dissolving the resin layer to remove the resin layer from the third opening to thereby form a cavity below the interconnection.

According to further another aspect of an embodiment, there is provided a method of manufacturing a semiconductor device comprising: forming a semiconductor layer over a substrate; forming a plurality of first openings in at least the semiconductor layer; forming a plurality of resin layers buried respectively in said plurality of first openings; forming an insulating film over the semiconductor layer and said plurality of resin layers; forming an interconnection over the insulating film: forming in the insulating film a plurality of second openings respectively down to said plurality of resin layers; and dissolving said plurality of resin layers from said plurality of second openings to remove said plurality of resin layers to thereby form below the interconnection a plurality of cavities divided by wall-shaped supports.

According to the present invention, the semiconductor device comprises a semiconductor layer formed over a substrate, an insulating film formed over the semiconductor layer, and a interconnection formed over the insulating film, a cavity is formed in at least the semiconductor layer below the interconnection, and the device further comprises a support formed in the cavity, for supporting the insulating film, whereby the attenuation of the high frequency signal can be suppressed while the reliability of the mechanical strength is ensured, and the high frequency characteristics of the semiconductor device can be improved.

BRIEF DESCRIPTION OF THE DRAWINGS

FIGS. 2A-2B, 3A-3B, 4A-4B, 5A-5B, 6A-6B and 7A-7B are sectional views showing the method of manufacturing the semiconductor device according to the first embodiment of the present invention;

FIGS. 9A-9B, 10A-10B, 11A-11B and 12A-12B are sectional views showing the method of manufacturing the semiconductor device according to the second embodiment of the present invention;

FIGS. 15A and 15B are diagrammatic views showing the structure of the semiconductor device according to a fifth embodiment of the present invention;

FIGS. 16A-16B, 17A-17B, 18A-18B, 19A-19B, 20A-20B and 21A-21B are sectional views showing the method of manufacturing the semiconductor device according to the fifth embodiment of the present invention;

FIGS. 23A-23B, 24A-24B, 25A-25B and 26A-26B are sectional views showing the method of manufacturing the semiconductor device according to a sixth embodiment of the present invention;

FIGS. 32, 33A-33B, 34, 35A-35B, 36, 37A-37B, 38, 39A-39B, 40, 41A-41B, 42, 43A-43B, 44, 45A-45B, 46 and 47A-47B are views showing the method of manufacturing the semiconductor device according to the ninth embodiment of the present invention.

DETAILED DESCRIPTION OF THE EMBODIMENTS

A First Embodiment

Figure 1A:
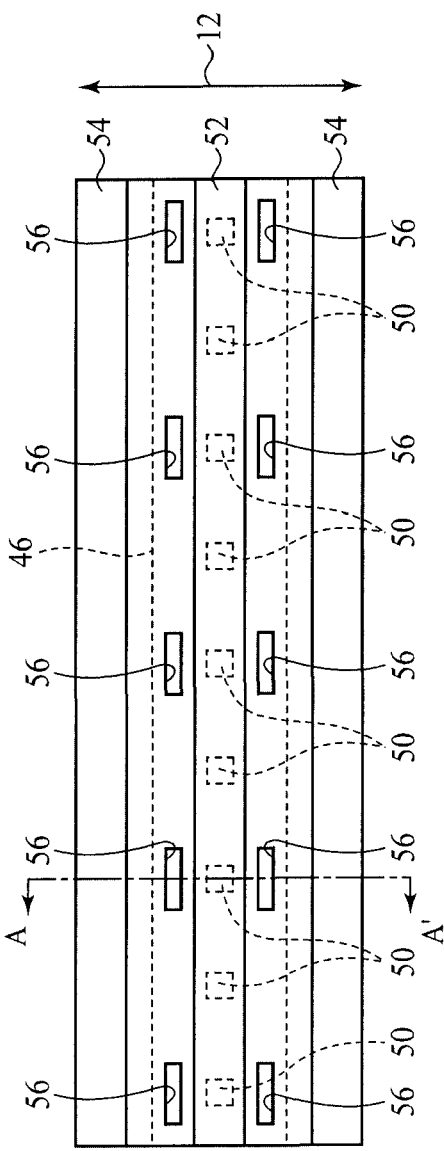
FIGS. 1A and 1B are diagrammatic views showing the structure of the semiconductor device according to a first embodiment of the present invention.
Figure 1B:
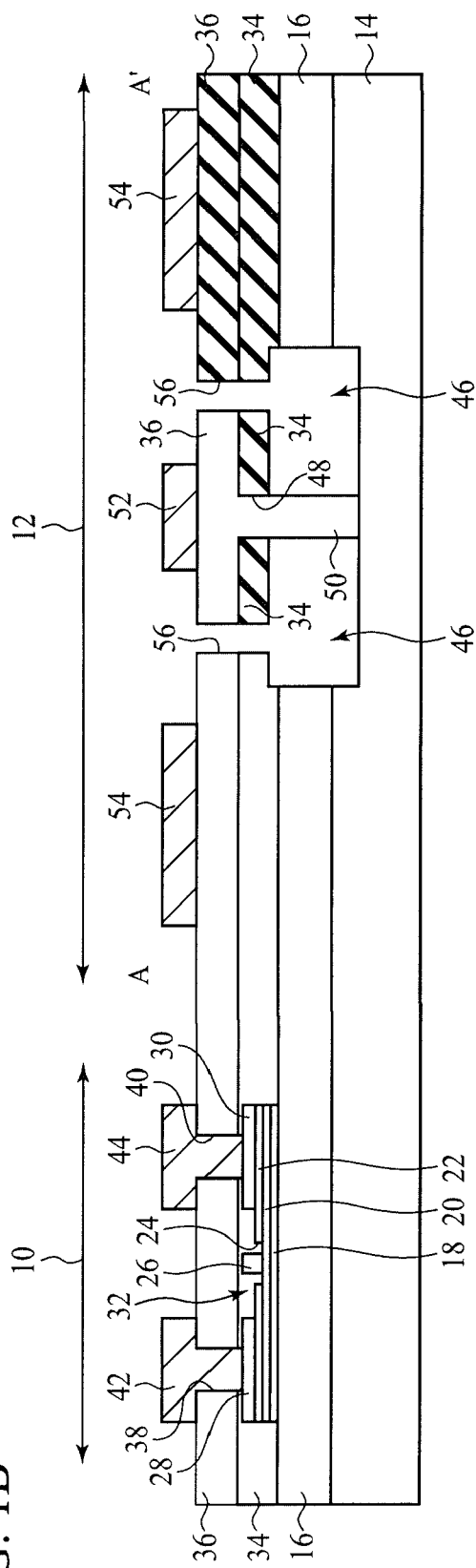

The semiconductor device and the method of manufacturing the same according to a first embodiment of the present invention will be explained with reference to FIGS. 1A to 7B. FIGS. 1A and 1B are diagrammatic views showing the structure of the semiconductor device according to the present embodiment. FIGS. 2A-2B, 3A-3B, 4A-4B, 5A-5B, 6A-6B and 7A-7B are sectional views showing the method of manufacturing the semiconductor device according to the present embodiment.

The semiconductor device according to the present embodiment is an MMIC comprising an InP-HEMT and coplanar interconnections formed therewith.

First, the structure of the semiconductor device according to the present embodiment will be explained with reference to FIGS. 1A and 1B. FIG. 1A is a plan view showing the structure of the semiconductor device according to the present embodiment. FIG. 1B is the sectional view showing the section along the A-A' line in FIG. 1A and the section of the device region.

The semiconductor device according to the present embodiment includes a device region 10 where the InP-HEMT is formed, and an interconnection region 12 where the coplanar interconnection is formed.

As illustrated in FIG. 1B, over a semi-insulating InP substrate (SI-InP substrate) 14, a buffer layer 16 of an i-InAlAs layer is formed.

Here, the structure of the device region 10 will be explained.

In device region 10, a channel layer 18 of an i-InGaAs layer is formed over the buffer layer 16. On a channel layer 18, a carrier supplying layer 20 of an i-InAlAs layer, an n-InAlAs layer and an i-InAlAs layer laid sequentially is formed. On the carrier supplying layer 20, a cap layer 22 of an n-InGaAs layer is formed.

A recess 24 is formed in the cap layer 22, and on the carrier supplying layer 20 at the bottom of the recess 24, a gate electrode 26 is formed. On the cap layer 22 on both sides of the gate electrode 26, a source electrode 28 and a drain electrode 30 are respectively formed.

Thus, in the device region 10, the InP-HEMT 32 is formed.

Over the buffer layer 16 with the InP-HEMT 32 formed over, an insulating film 34 of benzocyclobutene (BCB) is formed. Over the insulating film 34, an insulating film 36 of BCB is formed.

In the insulating films 36, 34, an opening 38 is formed down to the source electrode 28. In the insulating films 36, 34, an opening 40 is formed down to the drain electrode 30.

Over the insulating film 36, an Au interconnection 42 is formed, connected to the source electrode 28 via the opening 38. Over the insulating film 36, an Au interconnection 44 is formed, connected to the drain electrode 30 via the opening 40.

Next, the structure of the interconnection region 12 will be explained.

In the interconnection region 12, the insulating film 34 is formed over the buffer layer 16, as is in the device region 10.

In the SI-InP substrate 14, the buffer layer 16 and the insulating film 34, a cavity 46 is formed from the upper part of the SI-InP substrate 14 to the lower part of the insulating film 34.

Over the insulating film 34, the insulating film 36 is formed, as in the device region 10. The insulating film 36, which is the ceiling of the cavity 46, has pillar-shaped supports 50 which reach the SI-InP substrate 14 at the bottom of the cavity 46 via openings 48 formed in the insulating film 34. The insulating films 34, 36, which are the ceiling of the cavity 46, are supported by the pillar-shaped supports 50 in the cavity 46.

Over the insulating film 36 supported by the pillar-shaped supports 50, a signal line 52 is formed.

Over the insulating film 36 on both sides of the signal line 52, ground lines 54 are symmetrically formed along the signal line 52.

Thus, in the interconnection region 12, the coplanar interconnection including the signal line 52 and the ground lines 54 is formed.

For such coplanar interconnection, the cavity 46 is formed in a width larger than that of the signal line 52 below the signal line 52 sandwiched by the ground lines 54.

In the insulating films 36, 34 between the ground lines 54 and the signal line 52, openings 56 are formed down to the cavity 46.

FIG. 1A is a plan view of the interconnection region 12. As illustrated, the ground lines 54 are formed along the signal line 52 extended horizontally as viewed in the drawing, and symmetrically on both sides of the signal line 52.

The cavity 46 is formed below the signal line 52, extended along the signal line 52 in a width larger than that of the signal line 52.

Below the signal line 52, a plurality of the pillar-shaped supports 50 are arranged in a line at a prescribed interval along the signal line 52.

Between the signal line 52 and the ground lines 54, a plurality of openings 56 are formed down to the cavity 46 at a prescribed interval.

Thus, the semiconductor device according to the present embodiment is constituted.

The semiconductor device according to the present embodiment is characterized mainly in that below the signal line 52, the cavity 46 is formed in the SI-InP substrate 14, the buffer layer 16 and the insulating films 34, 36, and the insulating films 34, 36, which are the ceiling of the cavity 46, are supported by the pillar-shaped supports 50 in the cavity 46.

In the semiconductor device according to the present embodiment, because of the cavity 46 formed below the signal line 52, the dielectric loss generated in transmitted high frequency signal can be decreased, and the attenuation of the high frequency signal can be suppressed. Furthermore, the ceiling of the cavity 46 is supported by the pillar-shaped supports 50 in the cavity 46 to thereby ensure the mechanical strength of the cavity 46, whereby the collapse of the cavity 46 can be prevented. Accordingly, the semiconductor device which is superior in the high frequency characteristics, ensuring the reliability of the mechanical strength can be provided.

Next, the method of manufacturing the semiconductor device according to the present embodiment will be explained with reference to FIGS. 2A to 7B. FIGS. 2A to 7B are sectional views of the interconnection region 12 along the A-A' line in FIG. 1A in the steps of the method of manufacturing the semiconductor device.

First, over the SI-InP substrate 14, the buffer layer 16 of, e.g., a 2 μm-thickness i-InAlAs layer is deposited by, e.g., MOCVD method.

Next, over the buffer layer 16, the channel layer 18 of, e.g., a 25 nm-thickness i-InGaAs layer is deposited by, e.g., MOCVD method.

Next, on the channel layer 18, the i-InAlAs layer of, e.g., a 3 nm-thickness, the n-InAlAs layer of, e.g., a 7 nm-thickness and the i-InAlAs layer of, e.g., an 8 nm-thickness are sequentially deposited by, e.g., MOCVD method. Thus, on the channel layer 18, the carrier supplying layer 20 is formed of the i-InAlAs layer, the n-InAlAs layer and the i-InAlAs layer which are laid sequentially.

Next, on the carrier supplying layer 20, the cap layer 22 of, e.g., a 50 nm-thickness n-InGaAs layer is deposited by, e.g., MOCVD method.

Then, by photolithography and wet etching, the channel layer 18, the carrier supplying layer 20 and the cap layer 22 in the interconnection region 12 are removed, being left in the region of the device regions 10, where the InP-HEMT 32 is to be formed. As the etchant, for example, a mixed liquid of phosphoric acid and hydrogen peroxide liquid can be used.

Figure 2A:
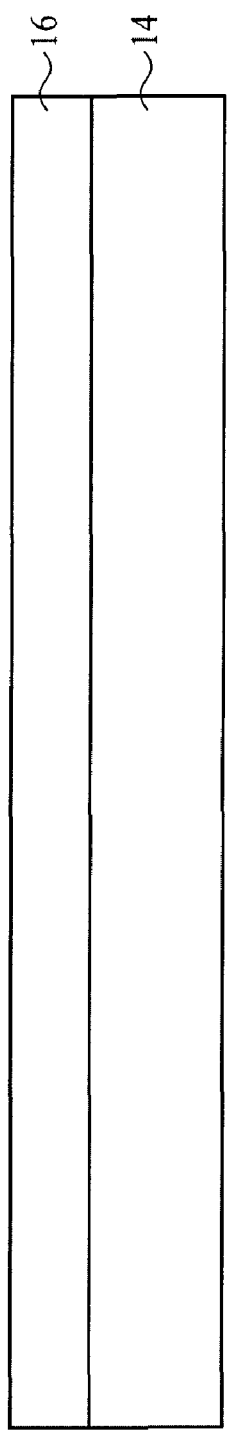
Figure 2B:
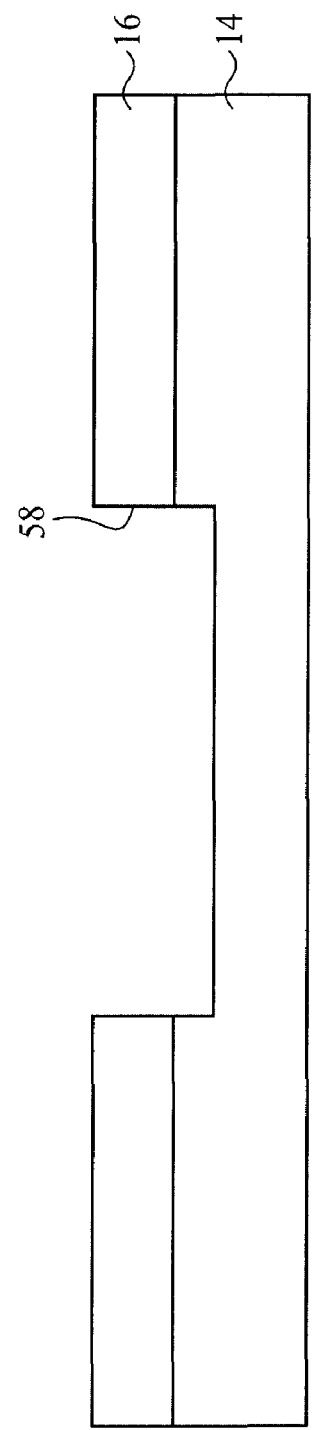
Figures 3A, 3B:
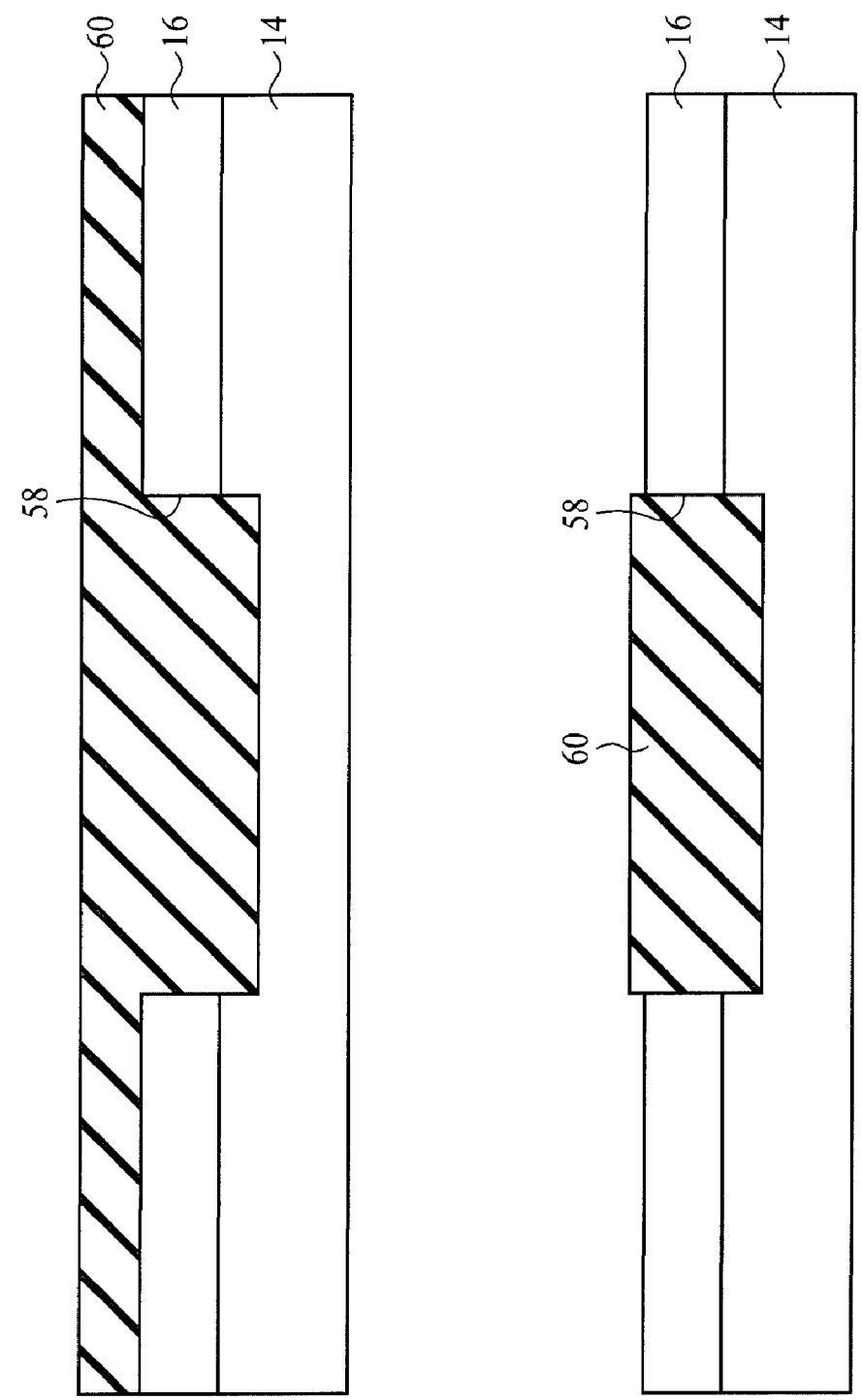

Thus, the buffer layer 16 is exposed in the interconnection region 12 (see FIG. 2A).

Then, hereafter, the steps of forming the InP-HEMT 32 including the step of forming the recess 24, the steps of forming the respective electrodes 26, 28, 30, etc. are performed, but the description of these steps will not be made below. The steps in connection with the interconnection region 12 will be described.

The buffer layer 16 in the interconnection region 12 is exposed, and then by photolithography and wet etching, the buffer layer 16 and the SI-InP substrate 14 in the region for the cavity 46 to be formed in is etched. Thus, an opening 58 is formed in the buffer layer 16 and an upper part of the SI-InP substrate 14 in the region for the cavity 46 to be formed in (see FIG. 2B). For etching the buffer layer 16 of the i-InAlAs layer, as the etchant, a mixed liquid of phosphoric acid and hydrogen peroxide liquid can be used. For etching the SI-InP substrate 14, as the etchant, a mixed liquid of hydrochloric acid and phosphoric acid can be used.

Next, to the entire surface, polymethylglutarimide (PMGI) is applied by, e.g., spin coating. Subsequently, the applied PMGI is hardened by thermal processing of, e.g., 100° C. Thus, in the opening 58 and over the buffer layer 16, a PMGI layer 60 is formed (see FIG. 3A).

Next, by, e.g., dry etching, the PMGI layer 60 over the buffer layer 16 and an upper part of the PMGI layer 60 in the opening 58 is removed. Thus, the PMGI layer 60 is left only in the opening 58 (see FIG. 3B). The surface of the PMGI layer 60 buried in the opening 58 is higher than the surface of the buffer layer 16.

Next, to the buffer layer 16 and the PMGI layer 60, BCB is applied by, e.g., spin coating. Subsequently, the BCB is heated to 250° C. or above with, e.g., an oven to be hardened. Thus, over the buffer layer 16 and the PMGI layer 60, the insulating film 34 of BCB is formed (see FIG. 4A).

Figure 4A:
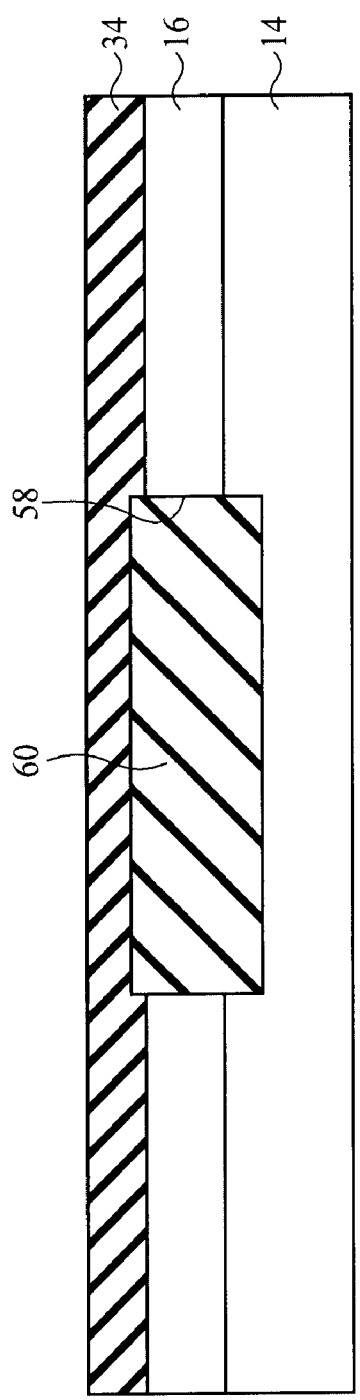
Figure 4B:
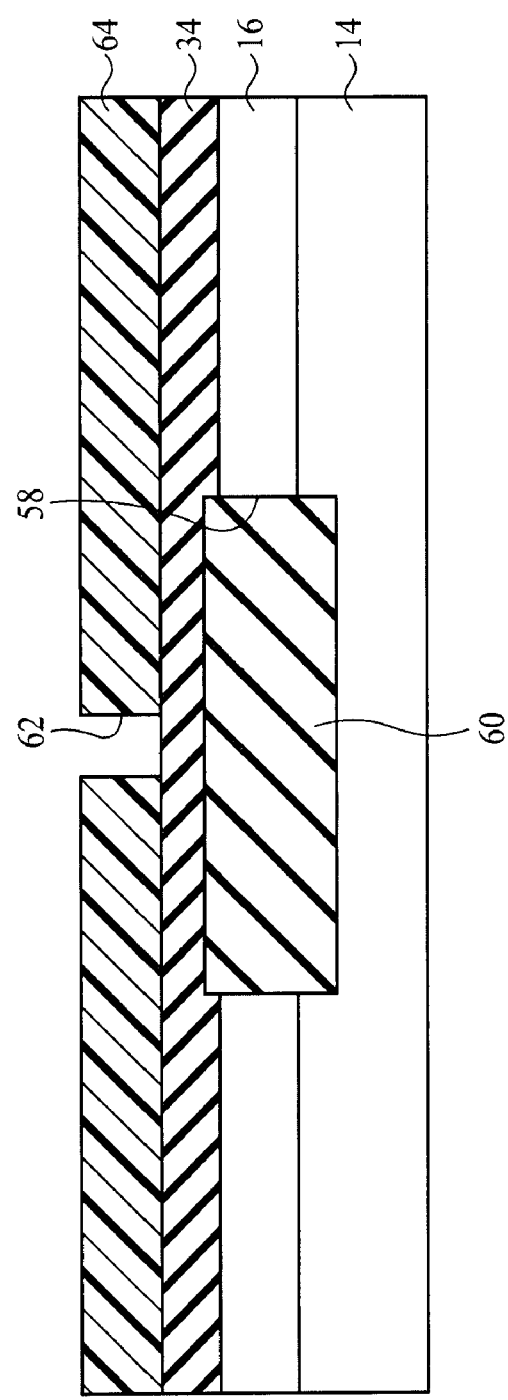

Then, over the insulating film 34, a photoresist film 64 having openings 62 for exposing the regions for the pillar-shaped supports 50 to be formed in is formed by photolithography (see FIG. 4B).

Next, with the photoresist film 64 as the mask, the insulating film 34 and the PMGI layer 60 exposed in the openings 62 are etched by, e.g., dry etching. As the etching gas, an oxygen-based gas, for example, can be used. Thus, in the insulating film 34 and the PMGI layer 60, the openings 48 are formed down to the SI-InP substrate 14 (see FIG. 5A). The openings 48 are the mold for the pillar-shaped supports 50.

After the openings 48 have been formed, the photoresist film 64 used as the mask is removed.

Next, BCB is applied to the entire surface by, e.g., spin coating. In the openings 48, BCB is buried. Subsequently, the applied BCB is heated with, e.g., an oven to be hardened. Thus, over the insulating film 34, the insulating film 36 of the BCB having the pillar-shaped supports 50 buried in the openings 48 is formed (see FIG. 5B).

Figure 6A:
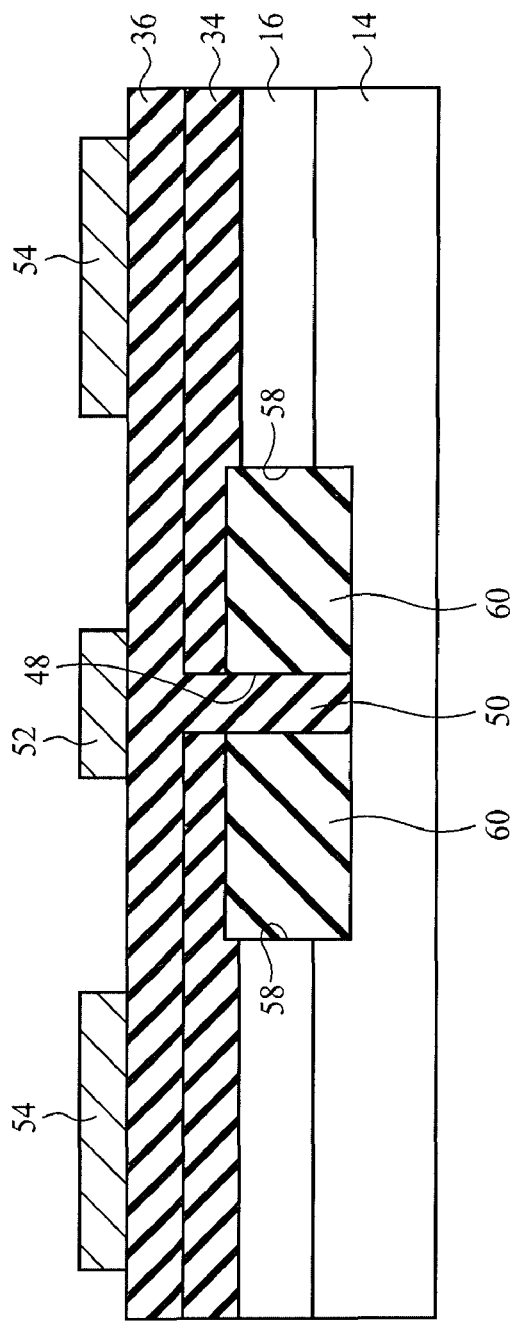

Next, by, e.g., plating, the signal line 52 of Au is formed over the insulating film 36 in the region where the PMGI layer 60 has been formed while forming the ground lines 54 of Au over the insulating film 36 on both sides of the signal line 52 (see FIG. 6A).

Figure 6B:
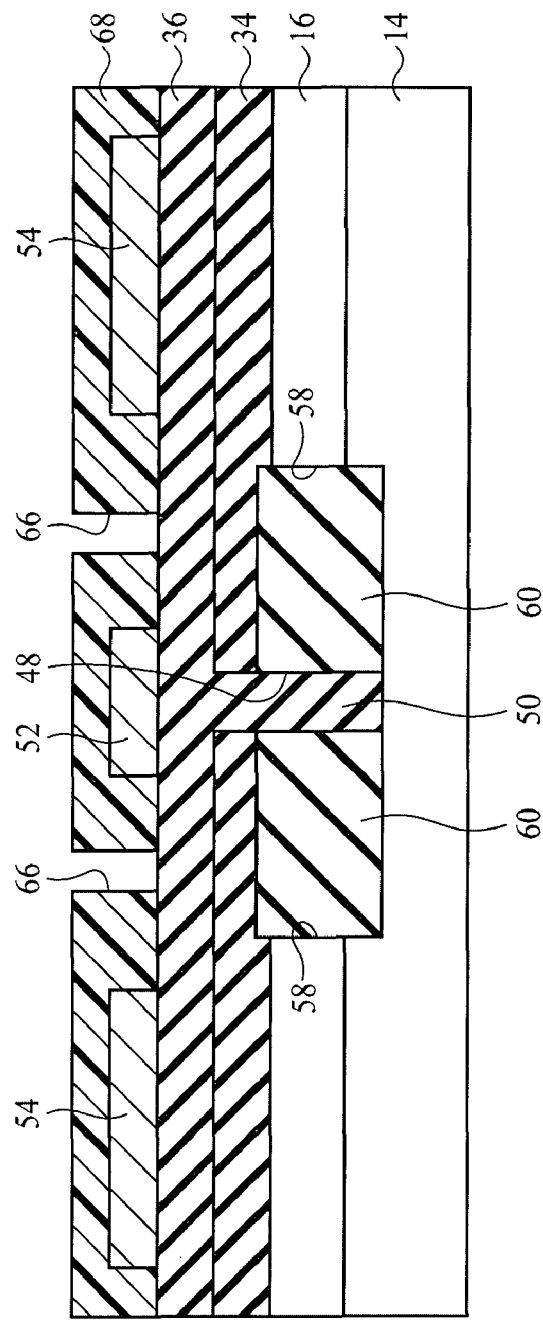

Next, over the insulating film 36 with the signal line 52 and the ground lines 54 formed over, by photolithography, a photoresist film 68 having openings 66 for exposing the regions for the openings 56 to be formed in down to the PMGI layer 60 is formed (see FIG. 6B).

Next, with the photoresist film 68 as the mask, by, e.g., dry etching, the insulating films 36, 34 exposed in the openings 66 are etched. Thus, in the insulating films 36, 34, the openings 56 are formed down to the PMGI layer 60 (see FIG. 7A).

After the openings 56 have been formed, the photoresist film 68 used as the mask is removed.

Next, the substrate is immersed in N-methyl-2-pyrrolidone (NMP) to dissolve the PMGI layer 60 with the NMP intruding through the openings 56 to remove the PMGI layer 60. Thus, the cavity 46 is formed in the SI-InP substrate 14, the buffer layer 16 and the insulating film 34 below the signal line 52 (see FIG. 7B). The insulating films 34, 36, which are the ceiling of the cavity 46, are supported by the pillar-shaped supports 50.

Thus, the semiconductor device according to the present embodiment is manufactured.

As described above, according to the present embodiment, below the signal line 52, the cavity 46 having the ceiling of the insulating films 34, 36 supported by the pillar-shaped supports 50 is formed, whereby the collapse of the ceiling of the cavity 46 is prevented while the dielectric loss generated in transmitted high frequency signal is decreased, and the attenuation of the high frequency signal can be suppressed. Thus, the semiconductor device can improve the high frequency characteristics while ensuring the reliability of the mechanical strength.

A Second Embodiment

Figure 8:
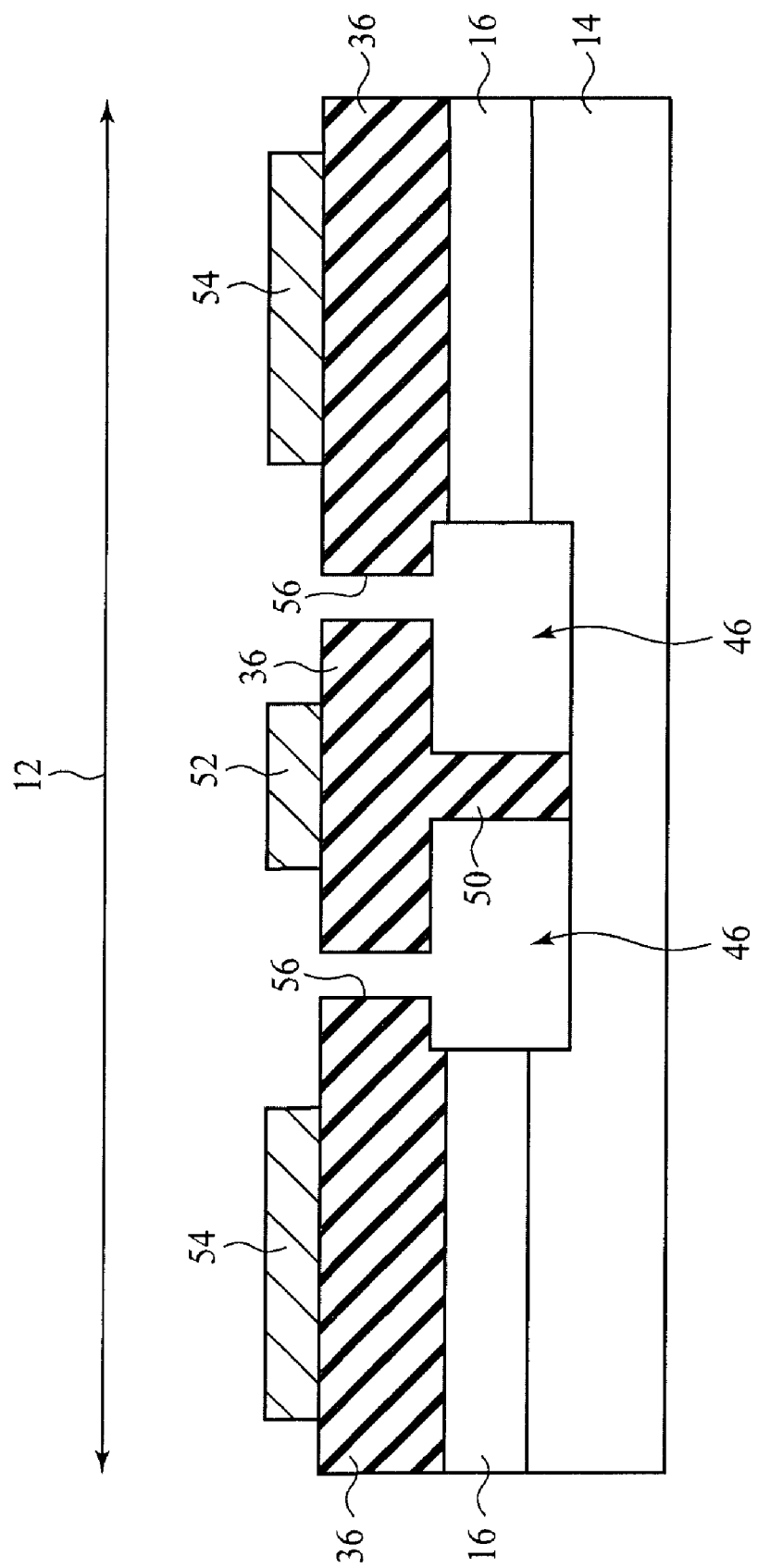
FIG. 8 is a sectional view showing the structure of the semiconductor device according to a second embodiment of the present invention.

The semiconductor device and the method of manufacturing the same according to a second embodiment of the present invention will be explained with reference to FIGS. 8 to 12B. FIG. 8 is a sectional view showing the structure of the semiconductor device according to the present embodiment. FIGS. 9A to 12B are sectional views showing the method of manufacturing the semiconductor device according to the present embodiment. The same members of the present embodiment as those of the semiconductor device and the method of manufacturing the same according to the first embodiment are represented by the same reference numbers not to repeat or to simplify their explanation.

First, the structure of the semiconductor device according to the present embodiment will be explained with reference to FIG. 8.

The basic structure of the semiconductor device according to the present embodiment is substantially the same as that of the semiconductor device according to the first embodiment. The semiconductor device according to the present embodiment is different from the semiconductor device according to the first embodiment including two layers of the insulating films 34, 36 in that over the buffer layer 16, the insulating film 34 is not formed, but one layer of the insulating film 36 is formed.

As illustrated, over an SI-InP substrate 14, a buffer layer 16 of an i-InAlAs layer is formed.

Over the buffer layer 16, an insulating film 36 of BCB is formed.

In the SI-InP substrate 14, the buffer layer 16 and the insulating film 36, a cavity 46 is formed from the upper part of the SI-InP substrate 14 to the lower part of the insulating film 36.

The insulating film 36, which is the ceiling of the cavity 46, has pillar-shaped supports 50 extended downward to the SI-InP substrate 14 at the bottom of the cavity 46. The insulating film 36, which is the ceiling of the cavity 46, is supported by the pillar-shaped supports 50 in the cavity 46.

Over the insulating film 36 supported by the pillar-shaped supports 50, a signal line 52 is formed.

Over the insulating film 36 on both sides of the signal line 52, ground lines 54 are formed symmetrically, extended along the signal line 52.

Thus, in the interconnection region 12, the coplanar interconnection including the signal line 52 and the ground lines 54 is formed.

For such coplanar interconnection, the cavity 46 is formed below the signal line 52 sandwiched by the ground lines 54 in a width larger than that of the signal line 52.

In the insulating film 36 between the ground lines 54 and the signal line 52, openings 56 are formed down to the cavity 46.

The semiconductor device according to the present embodiment is characterized mainly in that the cavity 46 is formed in the SI-InP substrate 14, the buffer layer 16 and the insulating film 36 below the signal line 52, and the insulating film 36, which is the ceiling of the cavity 46, is supported by the pillar-shaped supports 50 in the cavity 46.

In the semiconductor device according to the present embodiment as well as in the semiconductor device according to the first embodiment, because of the cavity 46 formed below the signal line 52, the dielectric loss generated in the transmitted high frequency signal is decreased, and the attenuation of the high frequency signal can be suppressed. Furthermore, the cavity 46 has the ceiling supported by the pillar-shaped supports 50 in the cavity 46, whereby the mechanical strength of the cavity 46 is ensured, and the collapse of the cavity 46 can be prevented. Accordingly, the high frequency characteristics of the semiconductor device can be improved while the reliability of the mechanical strength is ensured.

Next, the method of manufacturing the semiconductor device according to the present embodiment will be explained with reference to FIGS. 9A to 12B.

Figure 9A:
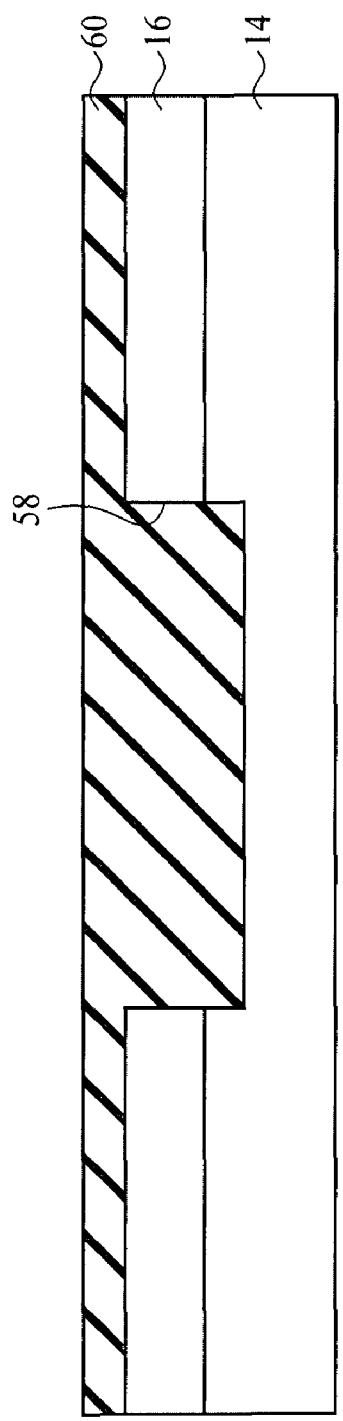

In the same way as in the method of manufacturing the semiconductor device according to the first embodiment illustrated in FIGS. 2A to 3A, an opening 58 is formed in the buffer layer 16 and the SI-InP substrate 14, and then, a PMGI layer 60 is formed in the opening 58 and over the buffer layer 16 (see FIG. 9A).

Figure 9B:
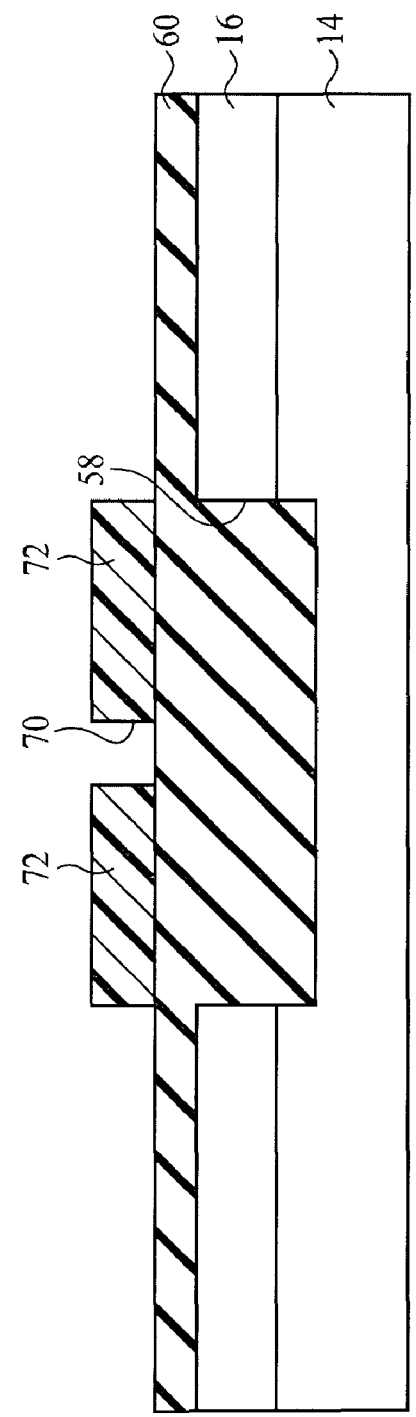
Figure 10A:
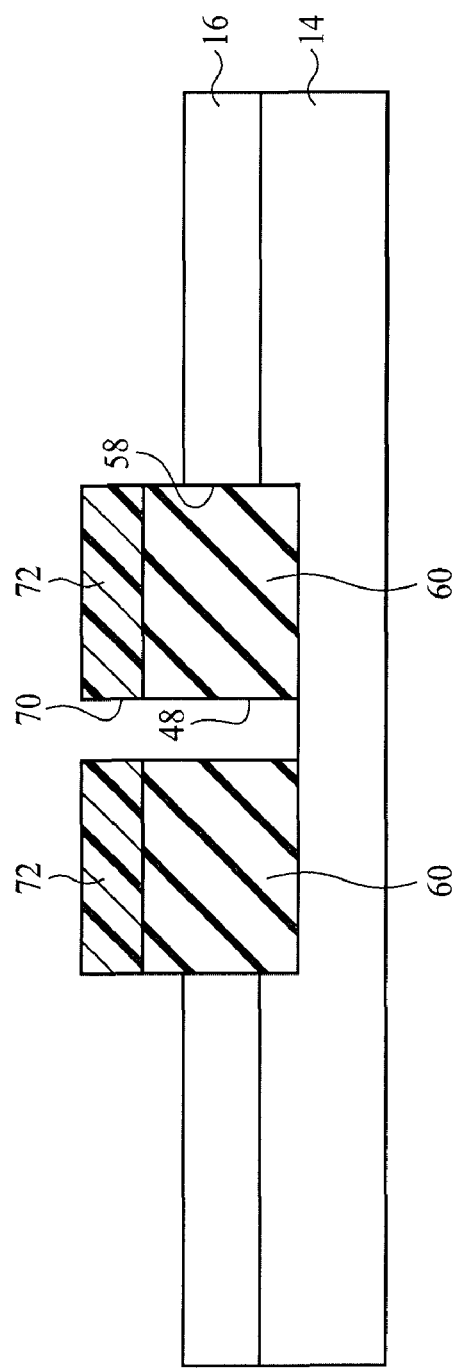
Figure 10B:
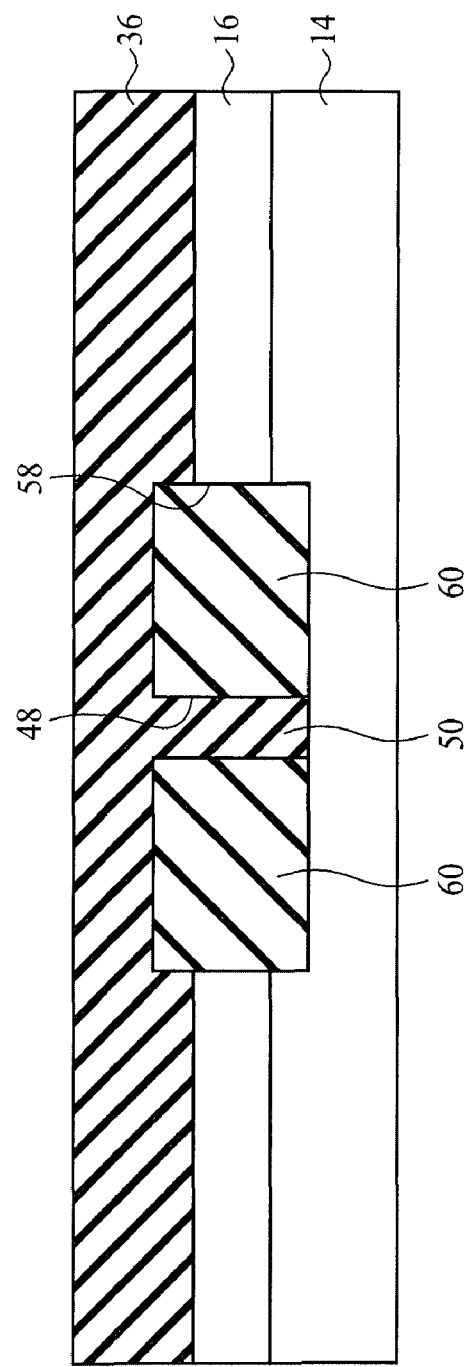

Next, by photolithography, a photoresist film 72 having openings 70 for exposing the regions for the pillar-shaped supports 50 to be formed in are formed over the PMGI layer 60 in the opening 58 (see FIG. 9B).

Next, with the photoresist film 72 as the mask, by, e.g., dry etching, the PMGI layer 60 exposed in the openings 70 is etched while the PMGI layer 60 over the buffer layer 16 is etched. As the etching gas, an oxygen-based gas, for example, can be used. Thus, the openings 48 are formed in the PMGI layer 60 down to the SI-InP substrate 14 while the PMGI layer 60 over the buffer layer 16 is removed (see FIG. 10A). The openings 48 are the molds for the pillar-shaped supports 50.

After the openings 48 have been formed, the photoresist film 72 used as the mask is removed.

Next, BCB is applied to the entire surface by, e.g., spin coating. The openings 48 are filled with the BCB. Subsequently, the BCB is hardened by heating with, e.g., an oven. Thus, over the buffer layer 16 and the PMGI layer 60, the insulating film 36 of BCB having the pillar-shaped supports 50 buried in the openings 48 are formed (see FIG. 10B).

Next, over the insulating film 36 in the regions where the PMGI layer 60 is formed, the signal line 52 of Au is formed by, e.g., plating while over the insulating film 36 on the both sides of the signal line 52, the ground lines 54 of Au are formed (see FIG. 11A).

Next, over the insulating film 36 with the signal line 52 and the ground lines 54 formed over, a photoresist film 68 having openings 66 for exposing the regions where the openings 56 are to be formed down to the PMGI layer 60 is formed by photolithography (see FIG. 11B).

Next, with the photoresist film 68 as the mask, by, e.g., dry etching, the insulating film 36 exposed in the openings 66 is etched. Thus, the openings 56 are formed in the insulating film 36 down to the PMGI layer 60 (see FIG. 12A).

After the openings 56 have been formed, the photoresist film 68 used as the mask is removed.

Then, the substrate is immersed in NMP to dissolve the PMGI layer 60 with the NMP intruding through the openings 56 and remove the PMGI layer 60. Thus, the cavity 46 is formed in the SI-InP substrate 14, the buffer layer 16 and the insulating film 36 below the signal line 52 (see FIG. 12B). The insulating film 36, which is the ceiling of the cavity 46, is supported by the pillar-shaped supports 50.

Thus, the semiconductor device according to the present embodiment will be manufactured.

As described above, according to the present embodiment, the cavity 46 having the ceiling of the insulating film 36 supported by the pillar-shaped supports 50, is formed, whereby the collapse of the ceiling of the cavity 46 is prevented while the dielectric loss generated in the transmitted high frequency signal is decreased, and the attenuation of the high frequency signal can be suppressed. Thus, the semiconductor device can improve the high frequency characteristics while ensuring the reliability of the mechanical strength.

A Third Embodiment

Figure 13:
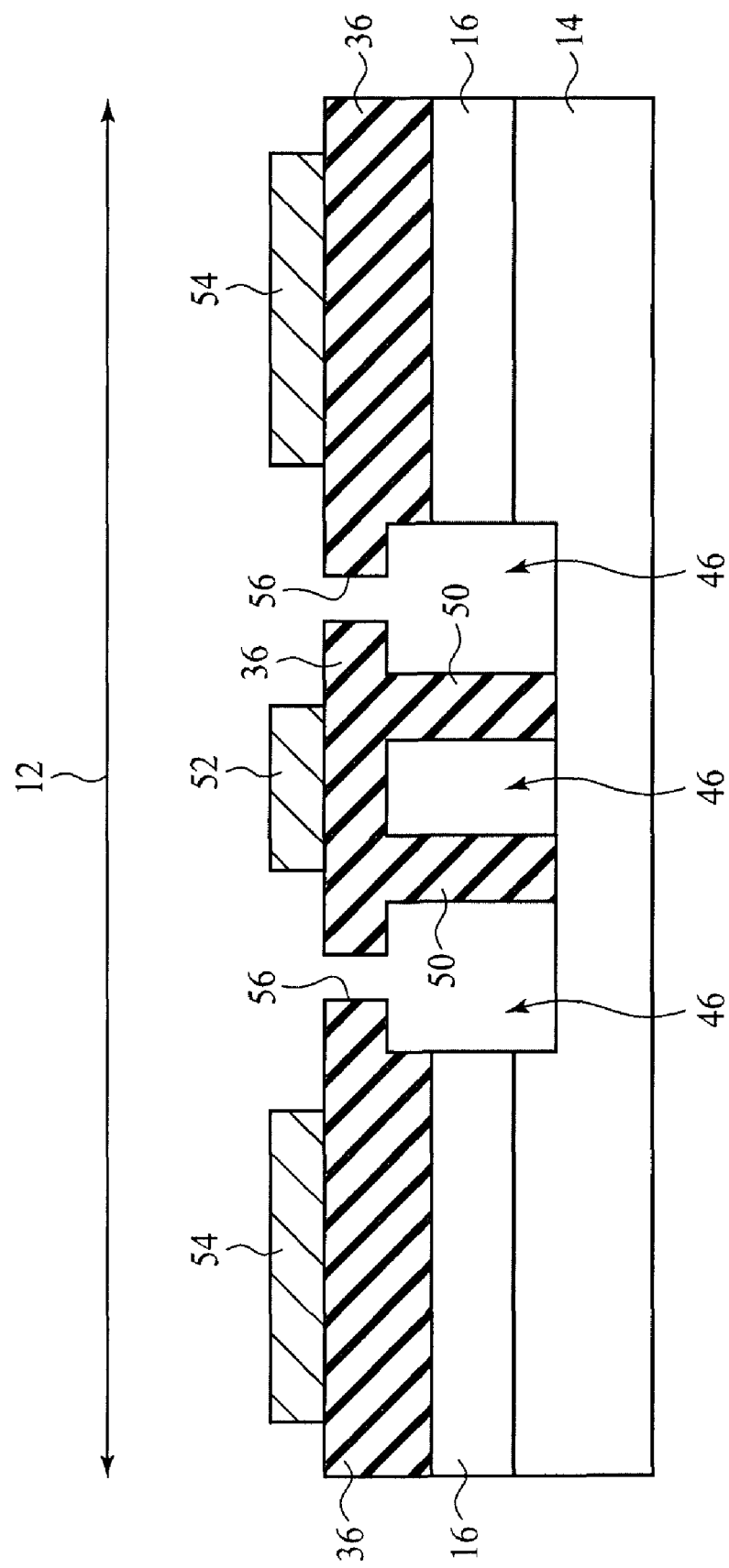
FIG. 13 is a sectional view showing the structure of the semiconductor device according to a third embodiment of the present invention.

The semiconductor device according to a third embodiment of the present invention will be explained with reference to FIG. 13. FIG. 13 is a sectional view showing the structure of the semiconductor device according to the present embodiment. The same members of the present embodiment as those of the semiconductor device and the method of manufacturing the same will be represented by the same reference numbers not to repeat or to simplify their explanation.

The basic structure of the semiconductor device according to the present embodiment is substantially the same as that of the semiconductor device according to the second embodiment. The semiconductor device according to the present embodiment is different from the semiconductor device according to the second embodiment in that below a signal line 52, a plurality of the pillar-shaped supports 50 are formed at a prescribed interval, arranged in plural lines along the signal line 52.

As shown in FIG. 13, below the signal line 52, a plurality of the pillar-shaped supports 50 are formed at a prescribed interval, arranged in, e.g., two lines along the signal line.

As described above, a plurality of pillar-shaped supports 50 may be formed below the signal line 52, arranged in two or more lines along the signal line 52.

In the above, a plurality of the pillar-shaped supports 50 are formed, arranged in plural lines in the semiconductor device according to the second embodiment, but in the semiconductor device according to the first embodiment, the pillar-shaped supports 50 can be formed as in the semiconductor device according to the present embodiment.

A Fourth Embodiment

Figure 14:
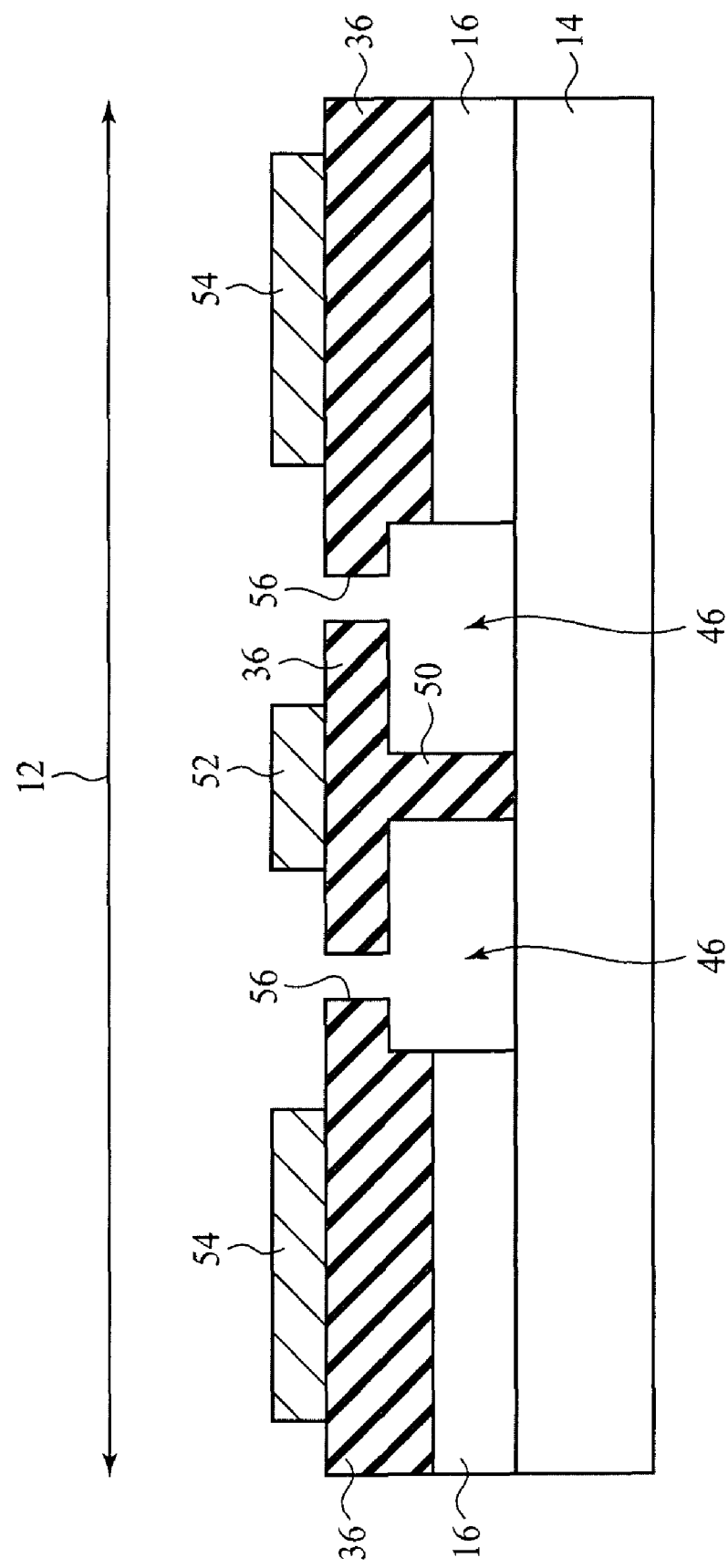
FIG. 14 is a sectional view showing the structure of the semiconductor device according to a fourth embodiment of the present invention.

The semiconductor device according to a fourth embodiment of the present invention will be explained with reference to FIG. 14. FIG. 14 is a sectional view showing the structure of the semiconductor device according to the present embodiment. The same members of the present embodiment as those of the semiconductor device and the method of manufacturing the same according to the second embodiment are represented by the same reference numbers not to repeat or to simplify their explanation.

The basic structure of the semiconductor device according to the present embodiment is substantially the same as that of the semiconductor device according to the second embodiment. The semiconductor device according to the present embodiment is different from the semiconductor device according to the second embodiment in that the cavity 46 is formed in the buffer layer 16 and the insulating film 36 but not down to the upper part of the SI-InP substrate 14.

As shown in FIG. 14, the cavity 46 is formed in the buffer layer 16 and the insulating film 36. The cavity 46 is formed from the bottom surface of the buffer layer 16 to the lower part of the insulating film 36 but not down to the upper part of the SI-InP substrate 14.

As described above, the cavity 46 may not be formed in the upper part of the SI-InP substrate 14 but may be formed in the buffer layer 16 and the insulating film 36.

In the method of manufacturing the semiconductor device according to the present embodiment, when the opening 58 for forming the cavity 46 are formed, selective etching is made. That is, in forming the opening 58, the buffer layer 16 of an i-InAlAs layer whose etching characteristics are different from those of the SI-InP substrate 14 is selectively etched. Thus, the opening 58 for forming the cavity 46 is not formed in the SI-InP substrate 14 but is formed in the buffer layer 16 alone. The steps following the formation of such opening 58 are the same as those of the method of manufacturing the semiconductor device according to the second embodiment.

In the above, in the semiconductor device according to the second embodiment, the cavity 46 is not formed in the upper part of the SI-InP substrate 14 but is formed in the buffer layer 16 and the insulating film 36, but in the semiconductor device according to the first and the third embodiments, the cavity 46 can be formed as in the semiconductor device according to the present embodiment.

A Fifth Embodiment

The semiconductor device and the method of manufacturing the same according to a fifth embodiment of the present invention will be explained with reference to FIGS. 15A to 21B. FIG. 15 is diagrammatic views showing the structure of the semiconductor device according to the present embodiment. FIGS. 16A to 21B are sectional views showing the method of manufacturing the semiconductor device according to the present embodiment. The same members of the present embodiment as those of the semiconductor device and the method of manufacturing the same according to the second embodiment are represented by the same reference numbers not to repeat or to simplify their explanation.

First, the structure of the semiconductor device according to the present embodiment will be explained with reference to FIG. 15. FIG. 15A is a plan view showing the structure of the semiconductor device according to the present embodiment. FIG. 15B is the sectional view along the A-A' line in FIG. 15A.

The basic structure of the semiconductor device according to the present embodiment is substantially the same as that of the semiconductor device according to the second embodiment. The semiconductor device according to the present embodiment is different from the semiconductor device according to the second embodiment in that a conductive n-InP substrate 74 is used in place of the SI-InP substrate 14, and the ground lines 54 included in the coplanar interconnection are connected to the n-InP substrate 74.

As shown in FIG. 15B, over the conductive n-InP substrate 74, a buffer layer 16 of an i-InAlAs layer is formed.

Over the buffer layer 16, an insulating film 36 of BCB is formed.

In the n-InP substrate 74, the buffer layer 16 and the insulating film 36, a cavity 46 is formed from the upper part of the n-InP substrate 74 to the lower part of the insulating film 36.

The insulating film 36, which is the ceiling of the cavity 46, has pillar-shaped supports 50 extended downward to the n-InP substrate 74 at the bottom of the cavity 46. The insulating film 36, which is the ceiling of the cavity 46, is supported by the pillar-shaped supports 50 in the cavity 46.

Over the insulating film 36 supported by the pillar-shaped supports 50, a signal line 52 is formed.

In the buffer layer 16 and the insulating film 36 on both sides of the signal line 52, openings 76 are formed down to the n-InP substrate 74. As shown in FIG. 15A, the openings 76 are formed in trenches extended along the signal line 52.

Over the insulating film 36 with the openings 76 formed on both sides of the signal line 52, the ground lines 54 are formed symmetrically, extended along the signal line 52. The ground lines 54 have connections 54a buried in the openings 76 and connected to the n-InP substrate 74. The connections 54a are extended along the signal line 52. The ground lines 54 are electrically connected to the n-InP substrate 74 by the connections 54a.

Thus, in the interconnection region 12, the coplanar interconnection including the signal line 52 and the ground lines 54 is formed.

In such coplanar interconnection, the cavity 46 is formed below the signal line 52 sandwiched by the ground lines 54 in a width larger than that of the signal line 52.

In the insulating film 36 between the ground lines 54 and the signal line 52, openings 56 are formed down to the cavity 46.

The semiconductor device according to the present embodiment is characterized mainly in that the cavity 46 is formed in the n-InP substrate 74, the buffer layer 16 and the insulating film 36, and the insulating film 36 below the signal line 52, which is the ceiling of the cavity 46, is supported by the pillar-shaped supports 50 in the cavity 46.

In the semiconductor device according to the present embodiment, because of the cavity 46 formed below the signal line 52, the dielectric loss generated in the transmitted high frequency signal can be decreased. The cavity 46 is formed down to the upper part of the n-InP substrate 74 below the signal line 52, whereby the loss of the high frequency signal due to the conductive n-InP substrate 74 can be decreased. Thus, the attenuation of the high frequency signal can be suppressed. Furthermore, the cavity 46 has the ceiling supported by the pillar-shaped supports 50 in the cavity 46, and the mechanical strength of the cavity 46 is ensured, whereby the collapse of the cavity 46 can be prevented. Thus, the high frequency characteristics of the semiconductor device can be improved while the reliability of the mechanical strength is ensured.

Then, the method of manufacturing the semiconductor device according to the present embodiment will be explained with reference to FIGS. 16A to 21B. FIG. 16A to 21B are sectional views of the interconnection region 12 along the A-A' line in FIG. 15A in the steps of the method of manufacturing the semiconductor device.

First, over the n-InP substrate 74, the buffer layer 16 of the i-InAlAs layer of, e.g., a 2 μm-thickness is deposited by, e.g., MOCVD method.

Figure 16A:
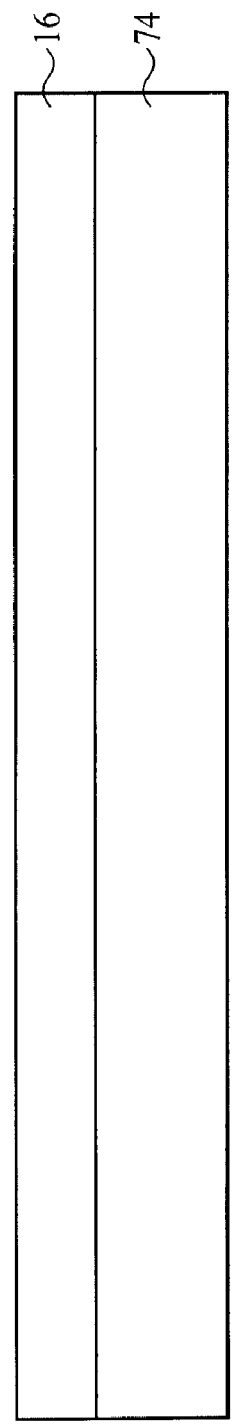
Figure 16B:

Then, prescribed device forming steps are performed, and then the buffer layer 16 in the interconnection region 12 is exposed (see FIG. 16A).

Next, by photolithography and wet etching, the buffer layer 16 and the n-InP substrate 74 in the region for the cavity 46 to be formed in are etched. Thus, an opening 58 is formed in the buffer layer 16 and the upper part of the n-InP substrate 74 in the region for the cavity 46 to be formed in (see FIG. 16B).

Next, PMGI is applied to the entire surface by, e.g., spin coating. Subsequently, the applied PMGI is hardened by, e.g., thermal processing of 100° C. Thus, in the opening 58 and over the buffer layer 16, a PMGI layer 60 is formed (see FIG. 17A).

Figure 17A:
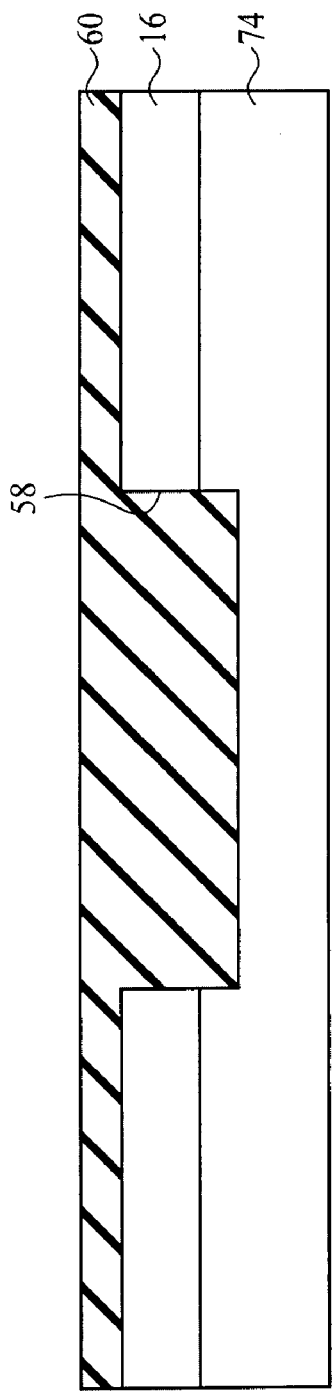
Figure 17B:
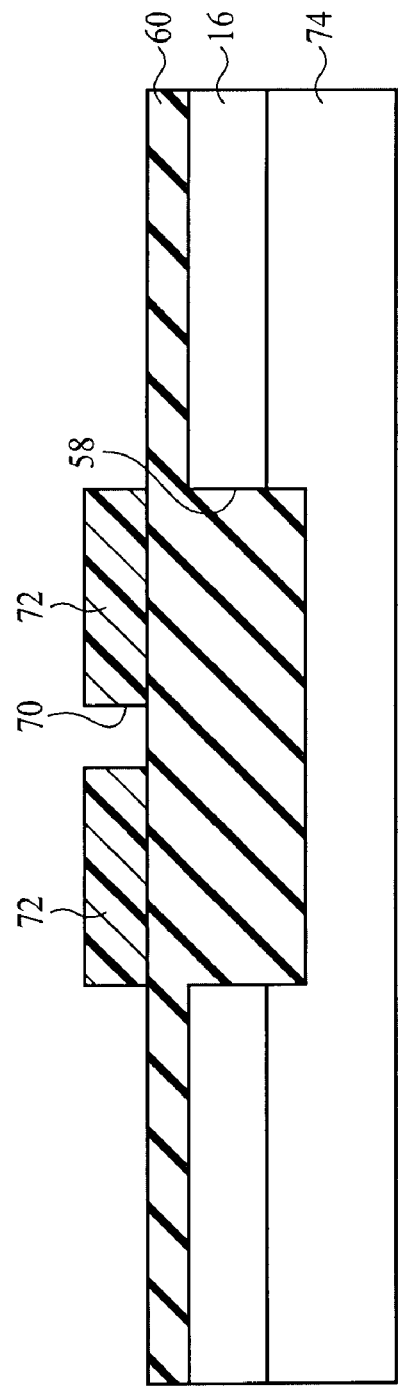
Figure 18A:
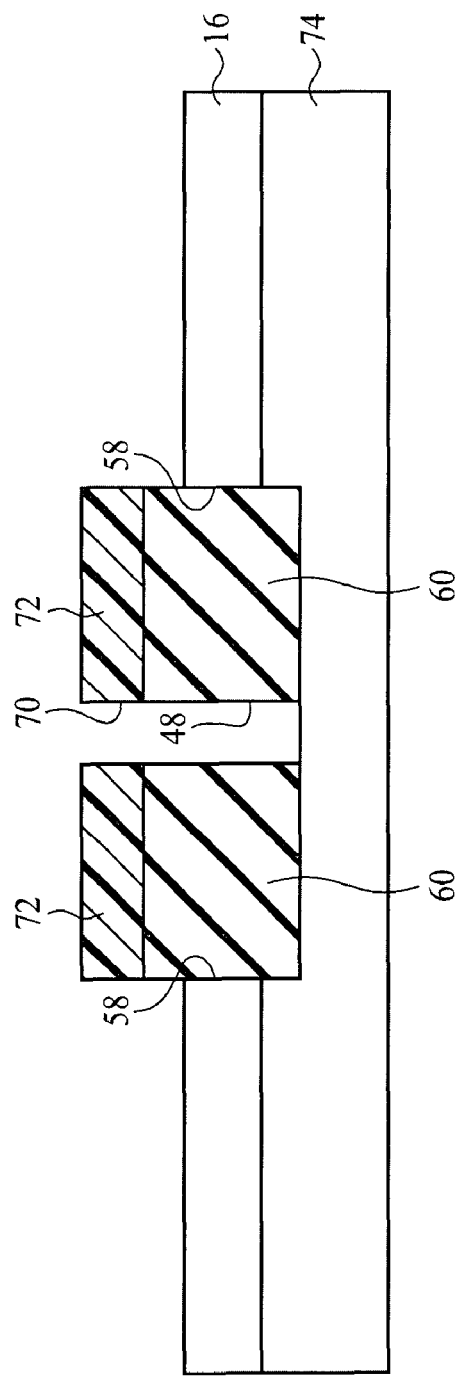
Figure 18B:
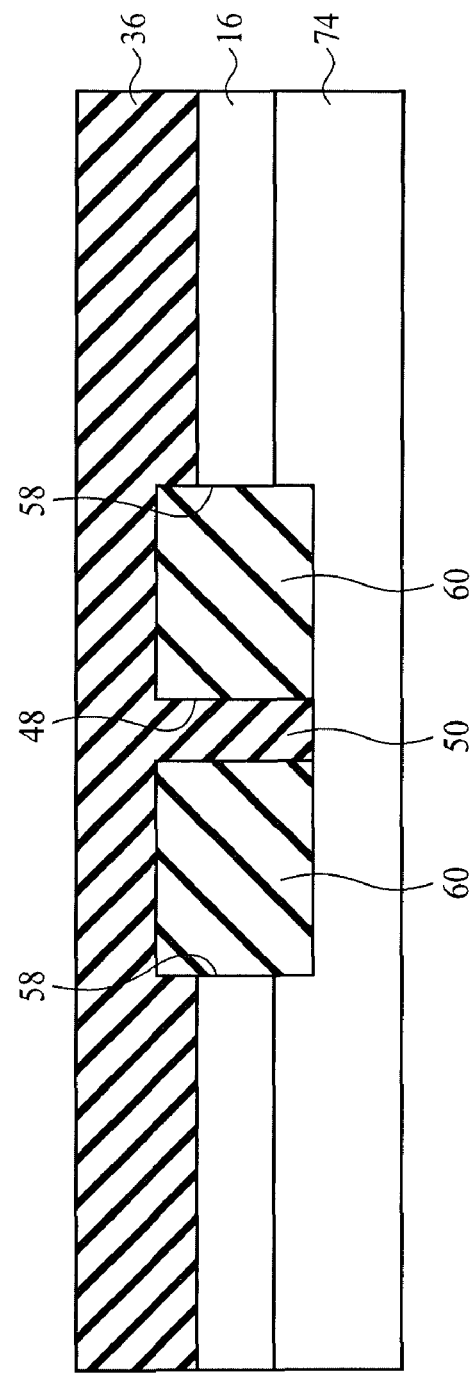
Figure 21A:
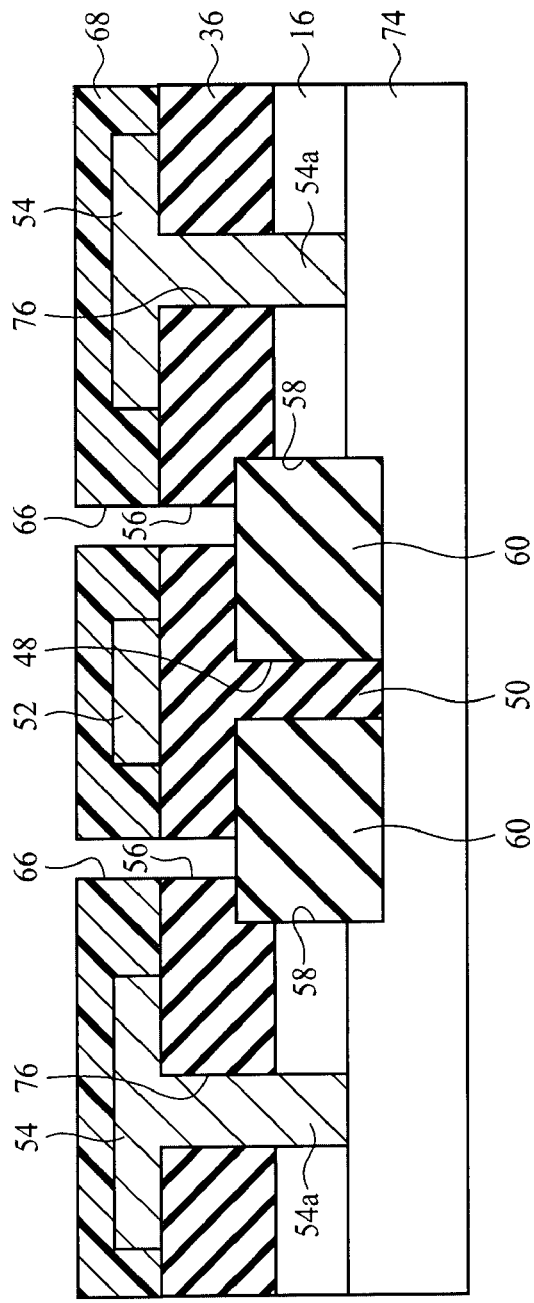
Figure 21B:
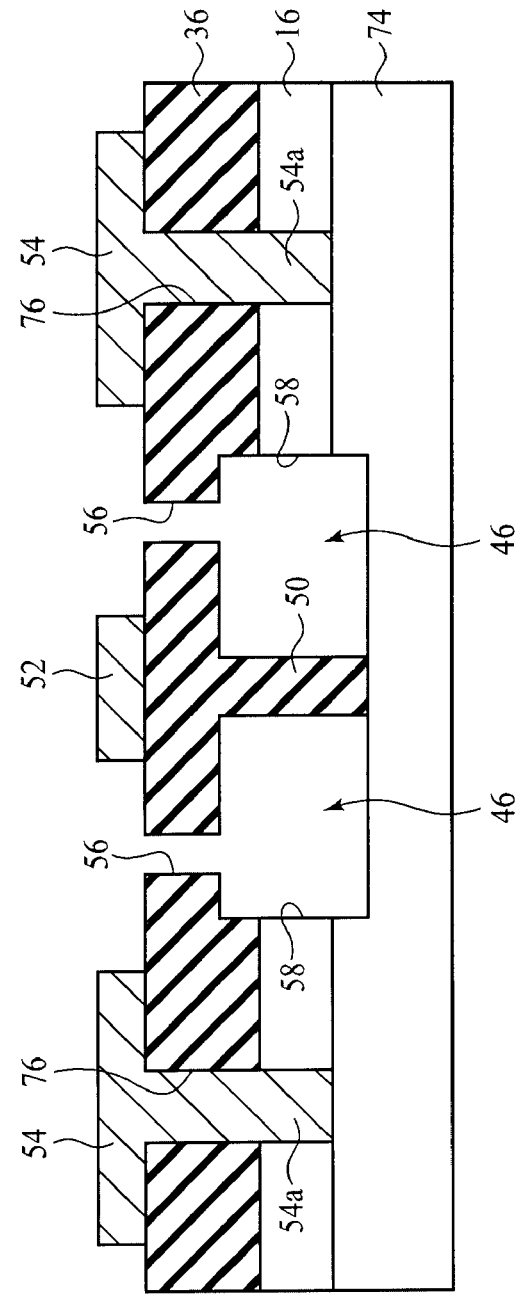

Next, by photolithography, a photoresist film 72 having openings 70 for exposing the regions for the pillar-shaped supports 50 to be formed in is formed over the PMGI layer 60 in the opening 58 (see FIG. 17B).

Then, with the photoresist film 72 as the mask, the PMGI layer 60 exposed in the openings 70 is etched by, e.g., dry etching while the PMGI layer 60 over the buffer layer 16 is etched. As the etching gas, an oxygen-based gas, for example, can be used. Thus, the openings 48 are formed in the PMGI layer 60 down to the n-InP substrate 74 while the PMGI layer 60 over the buffer layer 16 is removed (see FIG. 18A).

After the openings 48 have been formed, the photoresist film 72 used as the mask is removed.

Next, BCB is applied to the entire surface by, e.g., spin coating. BCB is buried in the openings 48. Subsequently, the applied BCB is hardened by heating with, e.g., an oven. Thus, over the buffer layer 16 and the PMGI layer 60, the insulating film 36 of the BCB having the pillar-shaped supports 50 buried in the openings 48 is formed (see FIG. 18B).

Next, by photolithography, a photoresist film 80 having openings 78 for exposing the regions for the connections 54a of the ground lines 54 to be formed in is formed over the insulating film 36 (see FIG. 19A).

Next, with the photoresist film 80 as the mask, by, e.g., dry etching, the insulating film 36 and the buffer layer 16 exposed in the openings 78 are etched. Thus, in the insulating film 36 and the buffer layer 16, the openings 76 are formed down to the n-InP substrate 74 (see FIG. 19B).

After the openings 76 have been formed, the photoresist film 80 used as the mask is removed.

Next, by, e.g., plating, the signal line 52 of Au is formed over the insulating film 36 in the regions where the PMGI layer 60 has been formed while the ground lines 54 of Au are formed over the insulating film 36 with the openings 76 formed in on both sides of the signal line 52. Here, the ground lines 54 are formed, having the connections 54a buried in the openings 76 and connected to the n-InP substrate 74 (see FIG. 20A).

Then, over the insulating film 36 with the signal line 52 and the ground lines 54 formed over, a photoresist film 68 having openings 66 for exposing the regions for the openings 56 to be formed in down to the PMGI layer 60 is formed by photolithography (see FIG. 20B).

Next, with the photoresist film 68 as the mask, by, e.g., dry etching, the insulating film 36 exposed in the openings 66 is etched. Thus, in the insulating film 36, the openings 56 are formed down to the PMGI layer 60 (see FIG. 21A).

After the openings 56 have been formed, the photoresist film 68 used as the mask is removed.

Then, the substrate is immersed in NMP to dissolve the PMGI layer 60 with the NMP intruding through the openings 56 and remove the PMGI layer 60. Thus, the cavity 46 is formed in the n-InP substrate 74, the buffer layer 16 and the insulating film 36 below the signal line 52 (see FIG. 21B). The insulating film 36, which is the ceiling the cavity 46, is supported by the pillar-shaped supports 50.

Thus, the semiconductor device according to the present embodiment is manufactured.

As described above, according to the present embodiment, below the signal line 52, the cavity 46 having the ceiling of the insulating film 36 supported by the pillar-shaped supports 50 is formed, whereby the collapse of the ceiling of the cavity 46 is prevented while the dielectric loss and the loss due to the conductive n-InP substrate 74 generated in the transmitted high frequency signal are decreased, and the attenuation of the high frequency signal can be suppressed. Accordingly, the high frequency characteristics of the semiconductor device can be improved while the reliability of the mechanical strength is ensured.

In the above, in the semiconductor device according to the second embodiment, the conductive n-InP substrate 74 is used in place of the SI-InP substrate 14. In the semiconductor device according to the first, the third and the fourth embodiments, the conductive n-InP substrate 74 is used, and the ground lines 54 can be connected to the n-InP substrate 74 as in the semiconductor device according to the present embodiment.

A Sixth Embodiment

Figure 22:
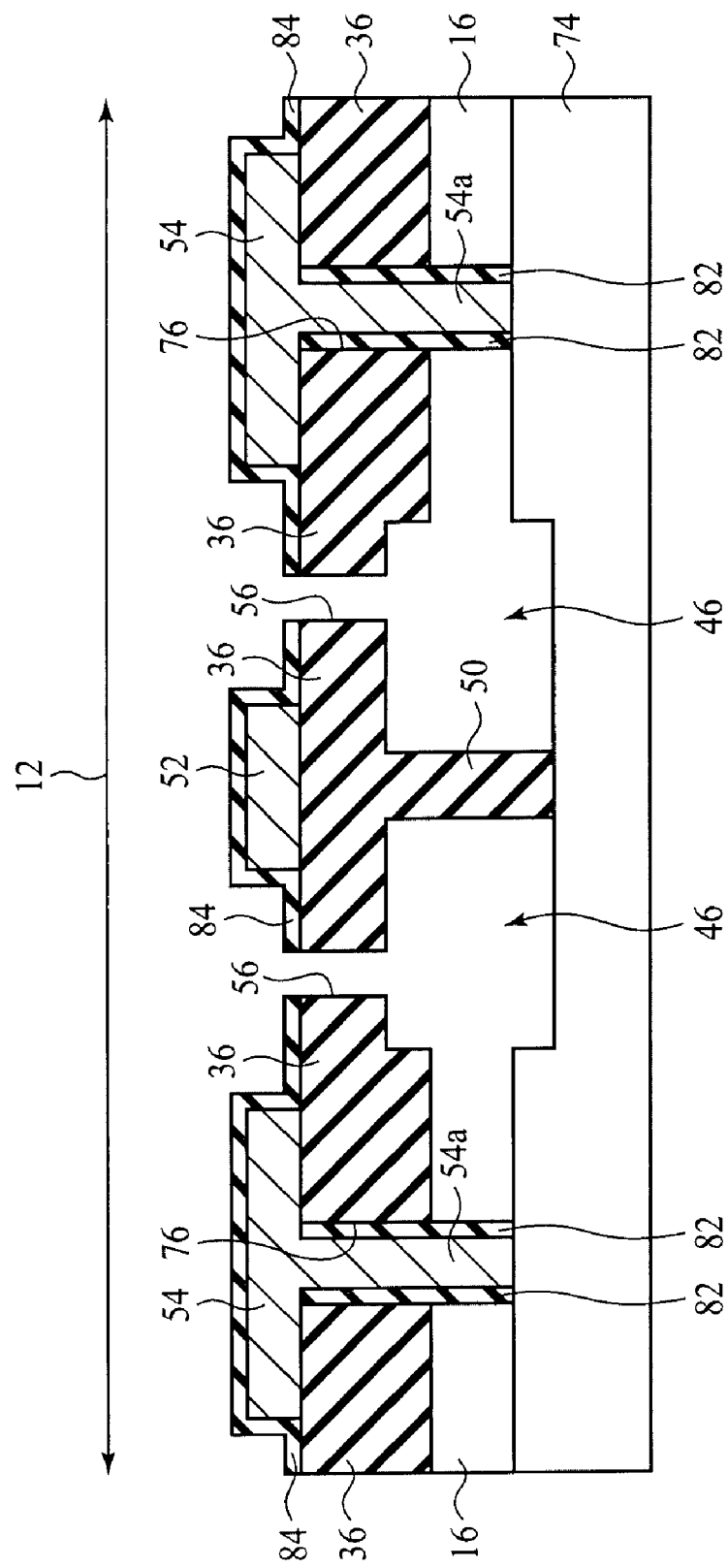
FIG. 22 is a sectional view showing the structure of the semiconductor device according to a sixth embodiment of the present invention.

The semiconductor device and the method of manufacturing the same according to a sixth embodiment of the present invention will be explained with reference to FIGS. 22 to 26B. FIG. 22 is a sectional view showing the structure of the semiconductor device according to the present embodiment. FIGS. 23A to 26B are sectional views showing the method of manufacturing the semiconductor device according to the present embodiment. The same members of the present embodiment as those of the semiconductor device and the method of manufacturing the same according to the fifth embodiment are represented by the same reference numbers not to repeat or to simplify their explanation.

First, the structure of the semiconductor device according to the present embodiment will be explained with reference to FIG. 22.

The basic structure of the semiconductor device according to the present embodiment is substantially the same as that of the semiconductor device according to the fifth embodiment. The semiconductor device according to the present embodiment is different from the semiconductor device according to the fifth embodiment in that the cavity 46 is formed below the signal line 52 and extended further to below parts of the ground lines 54, which are on the side of the signal line 52 with respect to the connections 54a, and other points.

As shown, in the semiconductor device according to the present embodiment, the connections 54a of the ground lines 54 are buried in openings 76 having a silicon nitride film 82 formed on the inside walls. In other words, the sidewall layer 82 of the silicon nitride film is formed on the side wall of the connection 54a.

The cavity 46 is formed extended up to the parts between the n-InP substrate 74 and the insulating film 36 on the side of the signal line 52 with respect to the connections 54a of the ground lines 54. In the cavity 54, the sidewalls 82, which are formed on the side walls of the connections 54a on the side of the signal line 52 are partially exposed.

Thus, in the semiconductor device according to the present embodiment, the cavity 46 is formed below the signal line 52 and extended to below the parts of the ground lines 52 on the side of signal line 52 with respect to the connections 54a.

In the semiconductor device according to the present embodiment, over the insulating film 36 with the signal line 52 and the ground lines 54 formed over, a protective film 84 of a silicon nitride film is formed, covering the signal line 52 and the ground lines 54.

The semiconductor device according to the present embodiment is characterized mainly in that the cavity 46 is formed below the signal line 52 and extended to below parts of the ground lines 54, which are on the side of the signal line 52 with respect to the connections 54a.

Because of the cavity 46 formed to below parts of the ground lines 54, which are on the side of the signal line 52, the dielectric loss generated in the transmitted high frequency signal can be further decreased, and the attenuation of the high frequency signal can be further suppressed.

Next, the method of manufacturing the semiconductor device according to the present embodiment will be explained with reference to FIGS. 23 to 26.

First, in the same way as in the method of manufacturing the semiconductor device according to the fifth embodiment shown in FIGS. 16A to 19B, the structure up to the openings 76 is formed.

After the openings 76 have been formed, the photoresist film 80 used as the mask is removed.

Figure 23A:
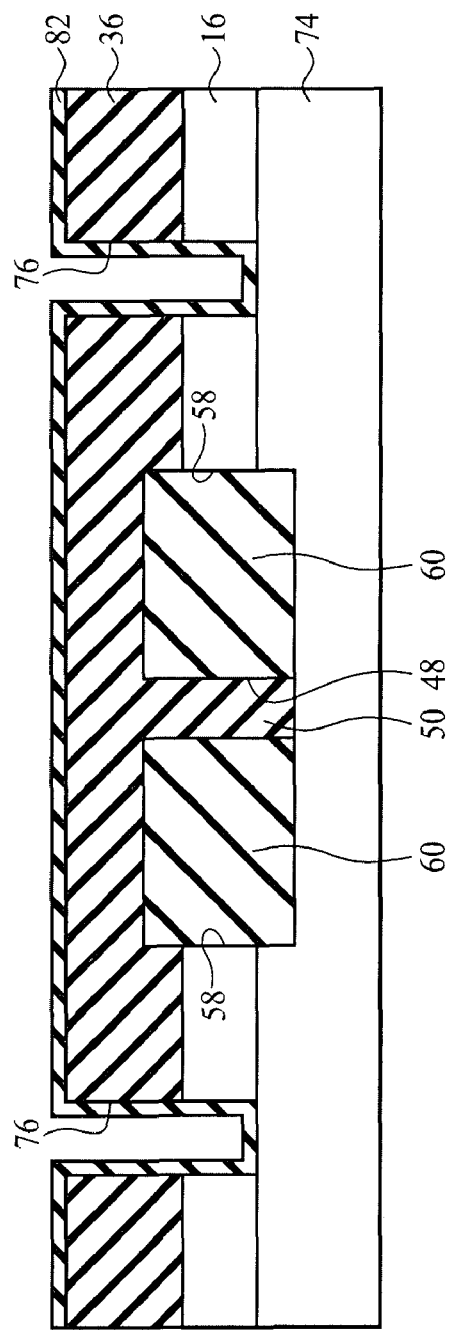
Figure 23B:
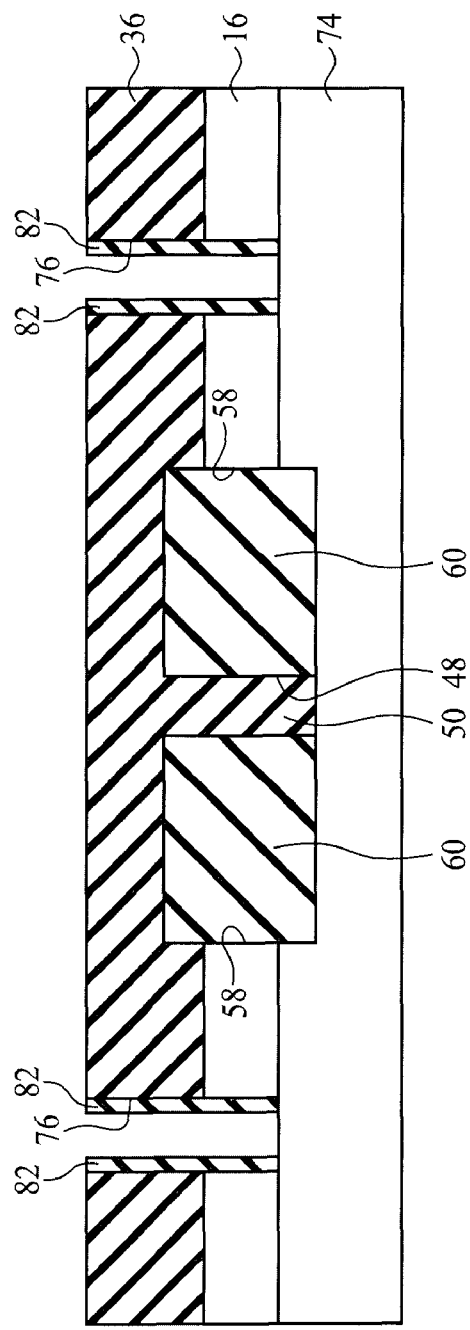

Next, over the entire surface, the silicon nitride film 82 is deposited by, e.g., plasma CVD method (see FIG. 23A).

Next, by dry etching, the silicon nitride film 82 is anisotropically etched to remove the silicon nitride film 82 on the bottom surfaces of the openings 76 and over the insulating film 36. Thus, the sidewalls 82 of the silicon nitride film are formed on the inside walls of the openings 76 (see FIG. 23B).

Next, by, e.g., plating, the signal line 52 of Au is formed over the insulating film 36 in the region with the PMGI layer 60 formed in while the ground lines 54 of Au are formed over the insulating film 36 with the openings 76 formed in on both sides of the signal line 52. Here, the ground lines 54 are formed, having the connections 54a buried in the openings 76 with the sidewalls 82 formed on and connected to the n-InP substrate 74 (see FIG. 24A).

Figure 24A:
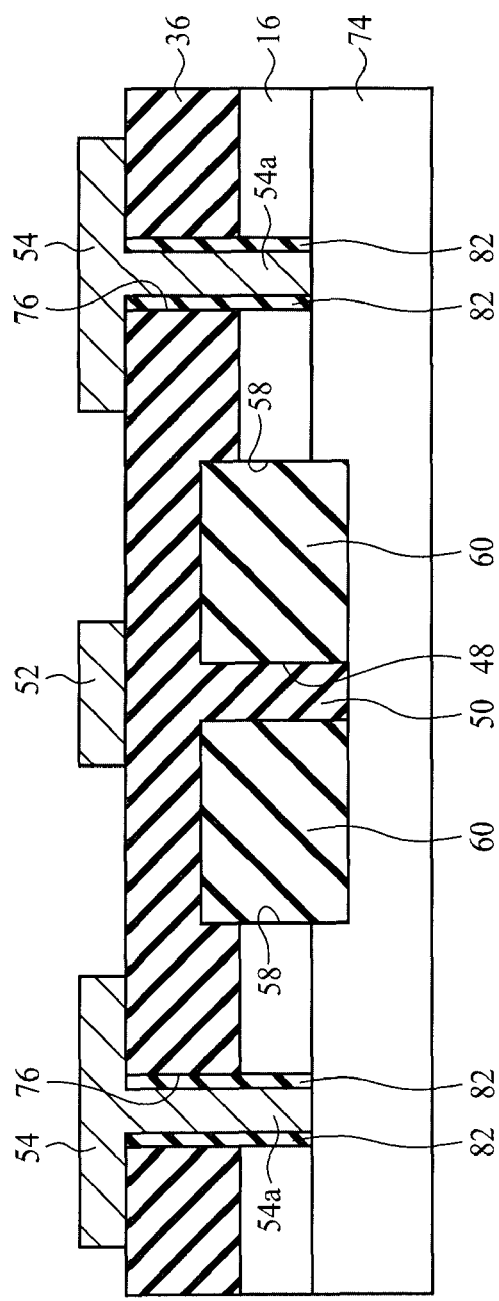
Figure 24B:
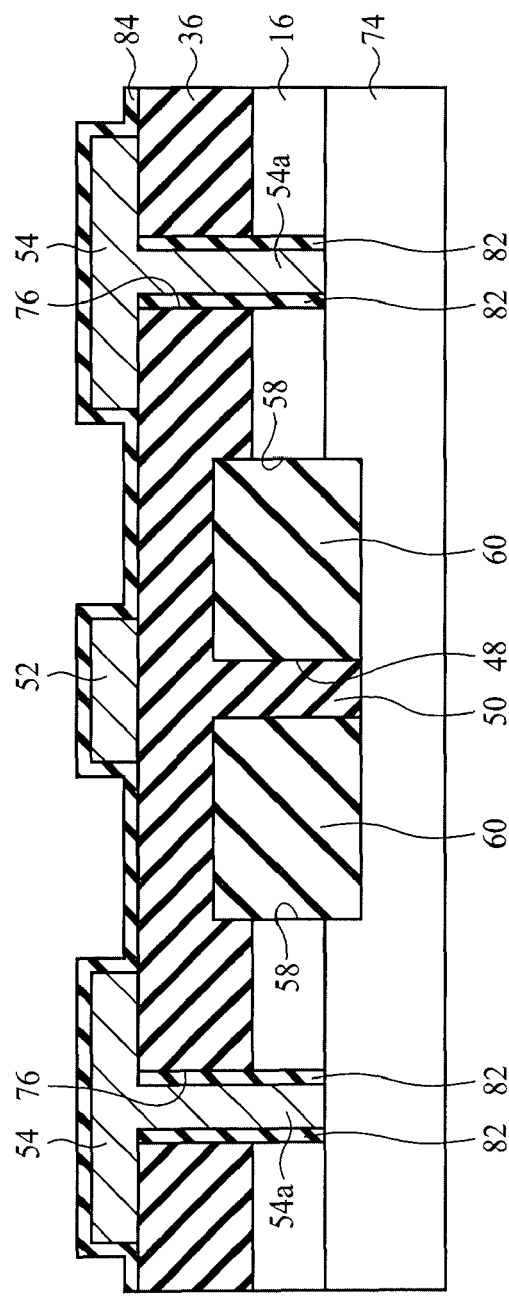

Next, on the insulating film 36 with the signal line 52 and the ground lines 54 formed on, the protective film 84 of silicon nitride film is deposited by, e.g., plasma CVD (see FIG. 24B).

Then, over the protective film 84, a photoresist film 68 having openings 66 for exposing the regions where the openings 56 to be formed down to the PMGI layer 60 is formed by photolithography (see FIG. 25A).

Then, with the photoresist film 68 as the mask, by, e.g., dry etching, the protective film 84 and the insulating film 36 exposed in the openings 66 are etched. Thus, in the protective film 84 and the insulating film 36, the openings 56 are formed down to the PMGI layer 60 (see FIG. 25B).

After the openings 56 have been formed, the photoresist film 68 used as the mask is removed.

Then, the substrate is immersed in NMP to dissolve the PMGI layer 60 with the NMP intruding through the openings 56 and remove the PMGI layer 60. Thus, in the n-InP substrate 74, the buffer layer 16 and the insulating film 36 below the signal line 52, the cavity 46 is formed (see FIG. 26A). The insulating film 36, which is the ceiling of the cavity 46, is supported by the pillar-shaped supports 50.

Then, the buffer layer 16 exposed on the inside wall of the cavity 46 is selectively etched by, e.g., wet etching. The etchant can be a mixed liquid of phosphoric acid and hydrogen peroxide liquid. This selective etching for the buffer layer 16 stops at the sidewalls 82 formed on the side walls of the connections 54a on the side of the signal line 52.

The buffer layer 16 between the n-InP substrate 74 and the insulating film 36 on the side of the signal line 52 with respect to the connections 54a of the ground lines 54 is removed, whereby the cavity 46 is formed below the signal line 52, extended to below the parts of the ground lines 54 on the side of the signal line 52 with respect to the connections 54a (see FIG. 26B).

Thus, the semiconductor device according to the present embodiment is manufactured.

As described above, according to the present embodiment, the cavity 46 is formed below the signal line 52, extended to below the parts of the ground lines 54 on the side of the signal line 52 with respect to the connections 54a, whereby the dielectric loss generated in the transmitted high frequency signal can be further decreased, and the attenuation of the high frequency signal can be further suppressed.

A Seventh Embodiment

Figure 27:
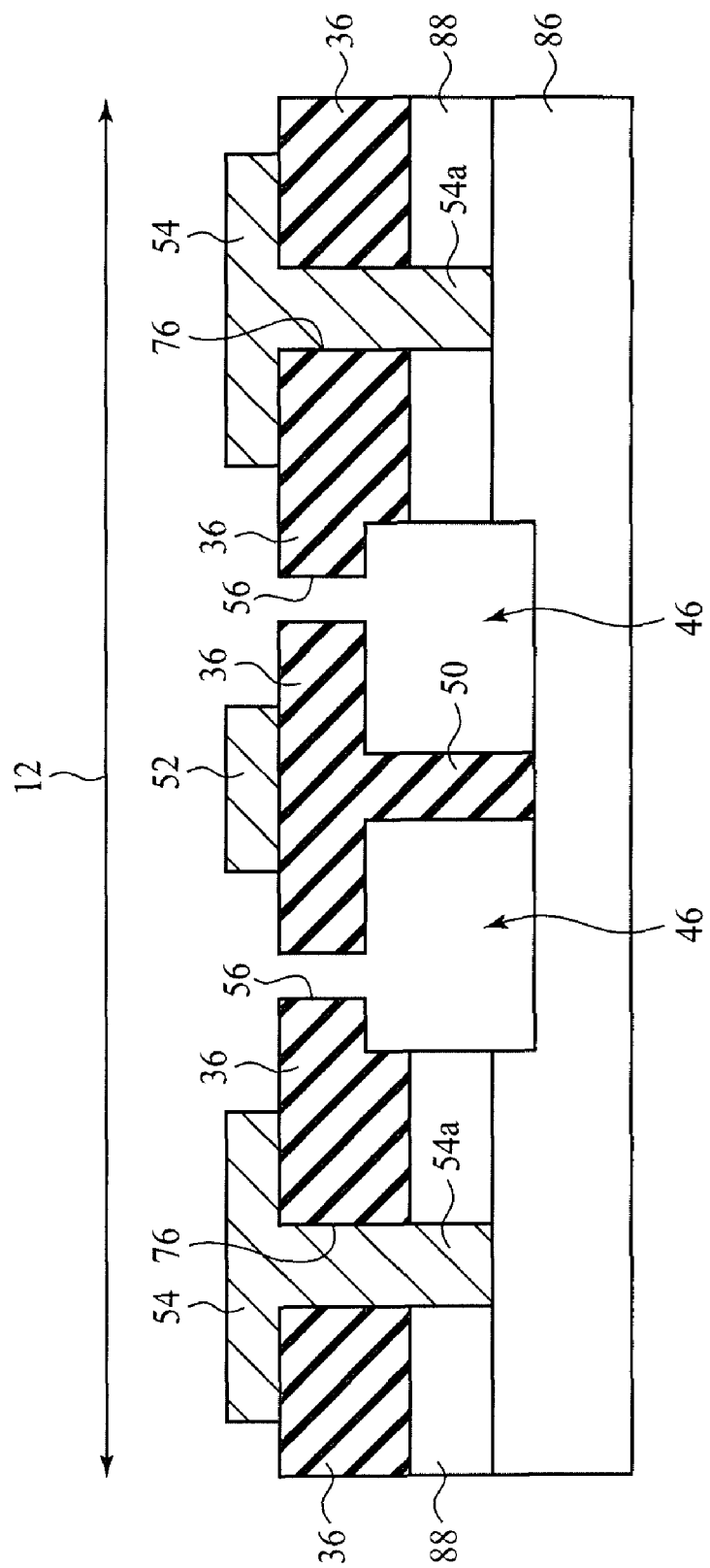
FIG. 27 is a sectional view showing the structure of the semiconductor device according to a seventh embodiment of the present invention.

The semiconductor device according to a seventh embodiment of the present invention will be explained with reference to FIG. 27. FIG. 27 is a sectional view showing the structure of the semiconductor device according to the present embodiment. The same members of the present embodiment as those of the semiconductor device and the method of manufacturing the same according to the fifth embodiment are represented by the same reference numbers not to repeat or to simplify their explanation.

The basic structure of the semiconductor device according to the present embodiment is substantially the same as that of the semiconductor device according to the fifth embodiment. The semiconductor device according to the present embodiment is different from the semiconductor device according to the fifth embodiment in the material groups of the conductive substrate and the buffer layer.

As shown in FIG. 27, in place of the n-InP substrate 74 of the fifth embodiment, a conductive n-SiC substrate 86 is used.

In place of the buffer layer 16 of the i-InAlAs layer of the fifth embodiment, a buffer layer 88 of an i-AlN layer or an i-AlGaN layer is used.

As described above, the conductive substrate may be the n-SiC substrate 86, and the buffer layer formed over the conductive substrate may be the buffer layer 88 of the i-AlN layer or the i-AlGaN layer.

In the above, the semiconductor device according to the fifth embodiment has the material groups of the conductive substrate and the buffer layer changed.

However, the semiconductor device according to the sixth embodiment may have the material groups of the conductive substrate and the buffer layer changed as in the semiconductor device according to the present embodiment.

An Eighth Embodiment

Figure 28:
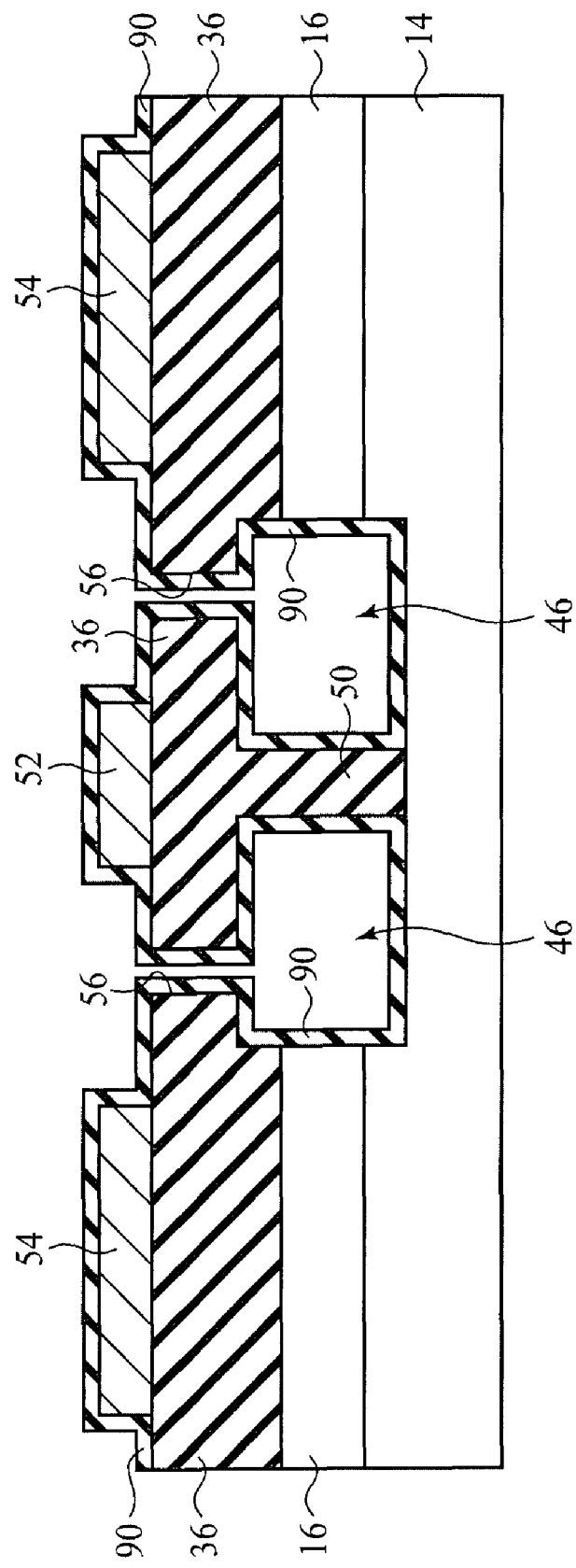
FIG. 28 is a sectional view showing the structure of the semiconductor device according to an eighth embodiment of the present invention.
Figure 29A:
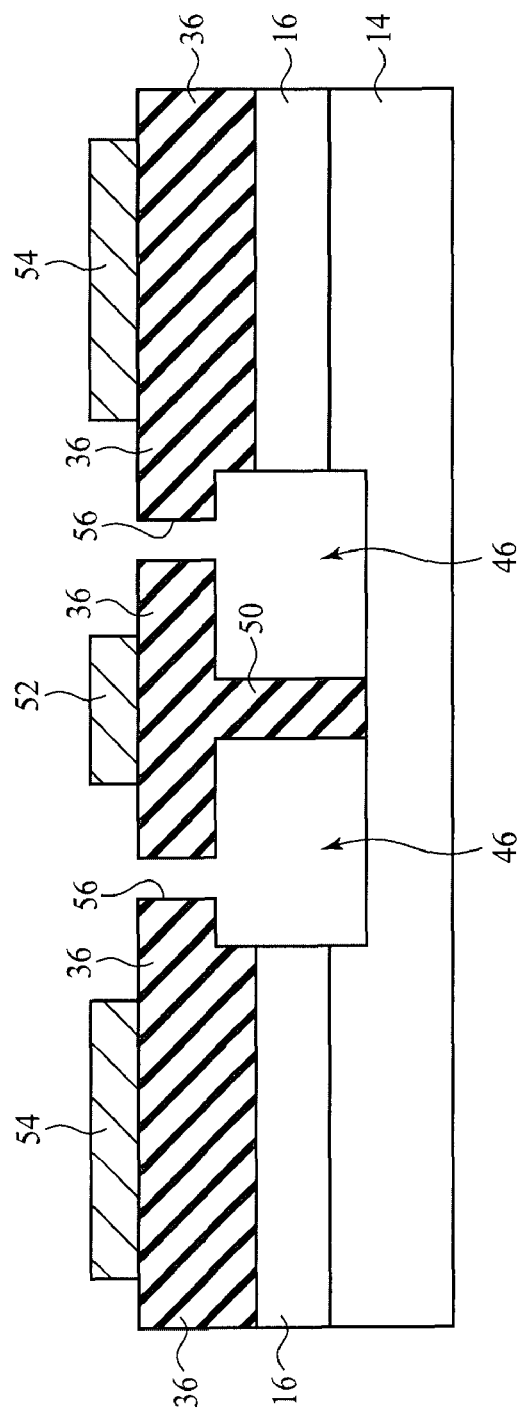
FIGS. 29A and 29B are sectional views showing the method of manufacturing the semiconductor device according to the eighth embodiment of the present invention.
Figure 29B:
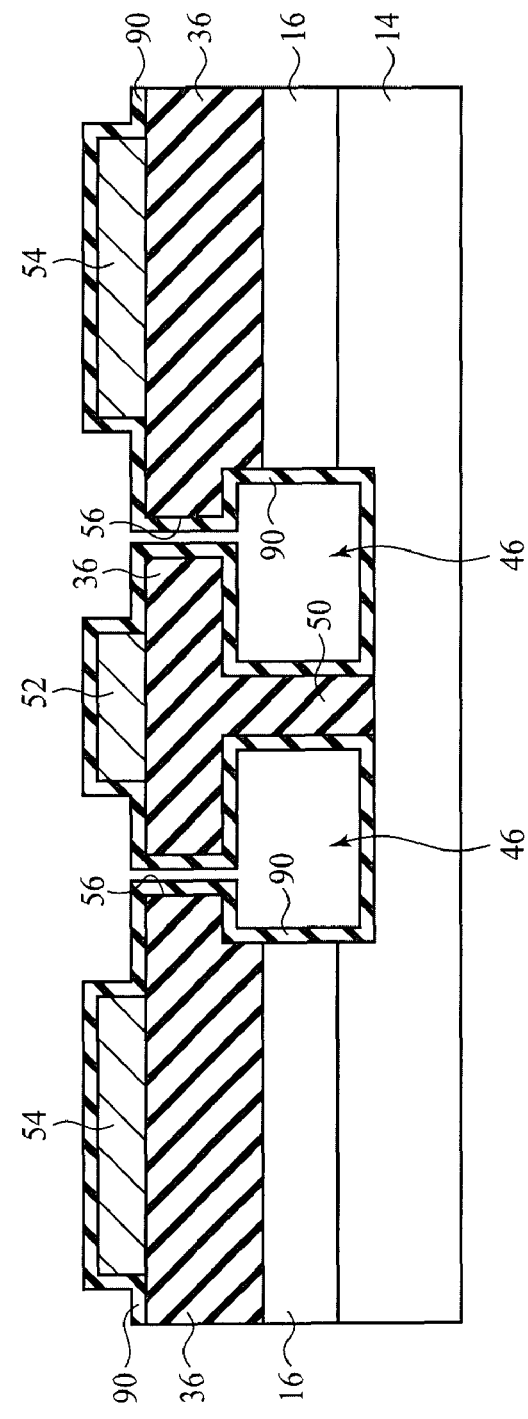

The semiconductor device and the method of manufacturing the same according to an eighth embodiment of the present invention will be explained with reference to FIGS. 28 to 29B. FIG. 28 is a sectional view shoeing the structure of the semiconductor device according to the present embodiment. FIGS. 29A and 29B are sectional views showing the method of manufacturing the semiconductor device according to the present embodiment. The same members of the preset embodiment as those of the semiconductor device and the method of manufacturing the same according to the second embodiment are represented by the same reference numbers not to repeat or to simplify their explanation.

First, the structure of the semiconductor device according to the present embodiment will be explained with reference to FIG. 28.

The basic structure of the semiconductor device according to the present embodiment is the same as that of the semiconductor device according to the second embodiment. The semiconductor device according to the present embodiment is different from the semiconductor device according to the second embodiment in that a protective film 90 is formed on the surfaces of an SI-InP substrate 14, a buffer layer 16 and an insulating film 36 exposed in a cavity 46, and on others.

As illustrated, on the surfaces of the SI-InP substrate 14, the buffer layer 16 and the insulating film 36 exposed in the cavity 46, and the surfaces of pillar-shaped supports 50, the protective film 90 of a silicon nitride film is formed.

The protective film 90 is formed further on the inside wall of openings 56 and over the insulating film 36 with the coplanar interconnection (the signal line 52 and the ground lines 54) formed over. The signal line 52 and the ground lines 54 are covered by the protective film 90.

Such protective film 90 is formed, whereby the reliability of the semiconductor device can be improved.

Next, the method of manufacturing the semiconductor device according to the present embodiment will be explained with reference to FIGS. 29A and 29B.

First, the structure up to the cavity 46 are formed in the same way as in the method of manufacturing the semiconductor device according to the second embodiment shown in FIGS. 9A to 12B.

Then, on the surfaces of the SI-InP substrate 14, the buffer layer 16 and the insulating film 36 exposed in the cavity 46, on the surfaces of the pillar-shaped supports 50, on the inside walls of the openings 56 and over the insulating film 36 with the coplanar interconnection (the signal line 52 and the ground lines 54) formed over, the protective film 90 of a silicon nitride film is deposited by, e.g., plasma CVD method (see FIG. 29B).

Thus, the semiconductor device according to the present embodiment is manufactured.

In the above, the semiconductor device according to the second embodiment includes the protective film 90 formed on the SI-InP substrate 14, etc. exposed in the cavity 46. However, in the semiconductor device according to the first and the third to the seventh embodiments, the protective film 90 can be formed as in the semiconductor device according to the present embodiment.

In the above, a silicon nitride film is formed as the protective film 90, but as the protective film 90, various insulating films other than the silicon nitride film may be formed.

A Ninth Embodiment

Figure 30:
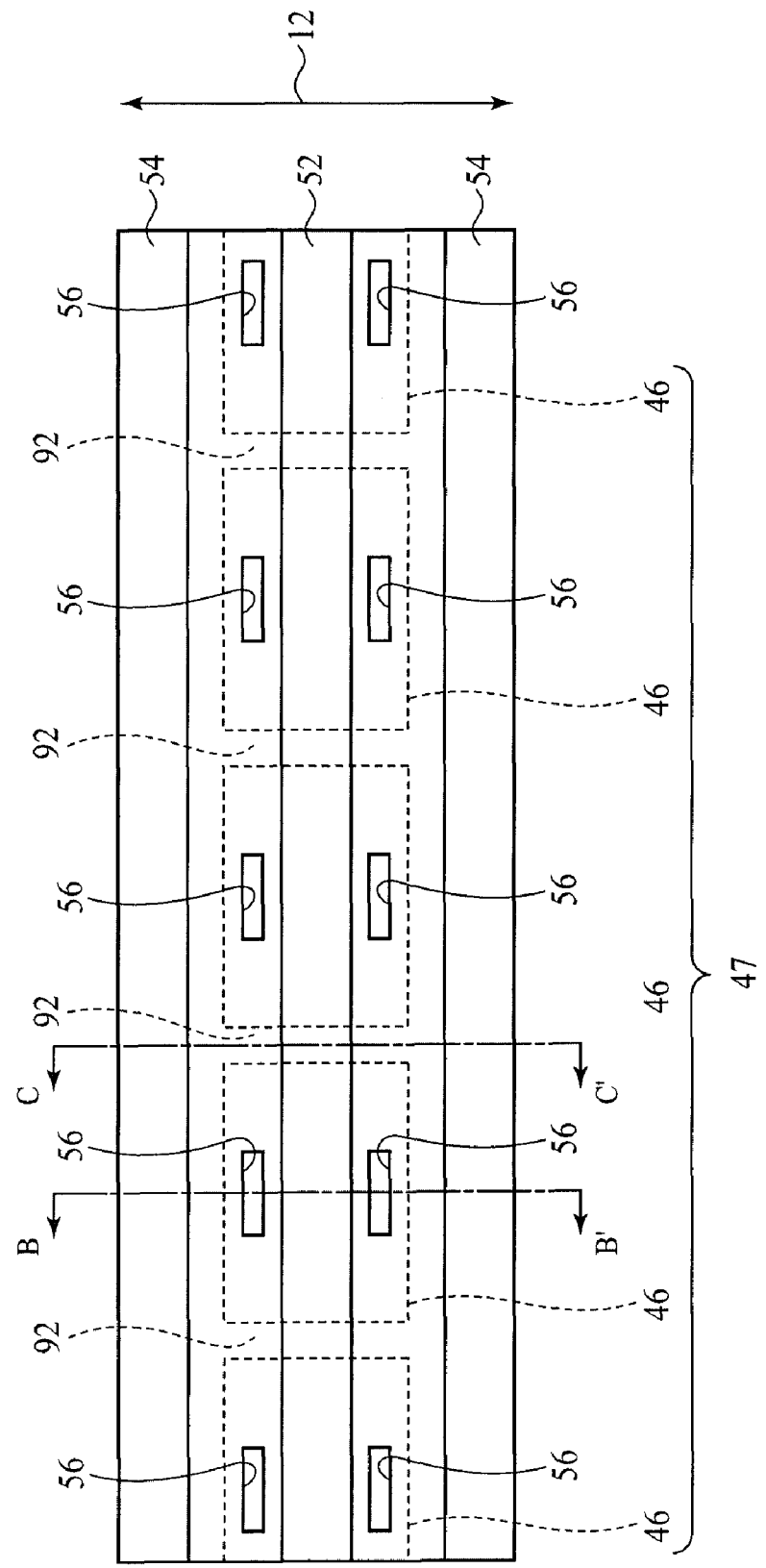
FIG. 30 is a plan view showing the structure of the semiconductor device according to a ninth embodiment of the present invention.
Figure 31A:
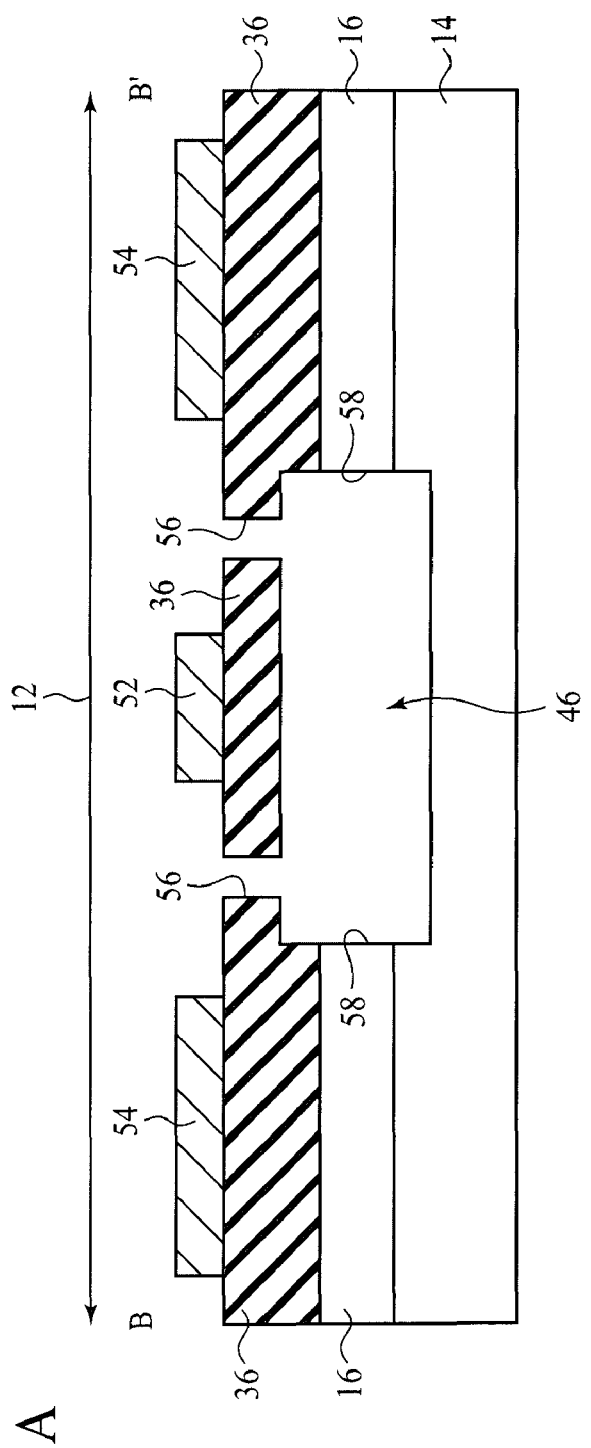
FIGS. 31A and 31B are sectional views showing the structure of the semiconductor device according to the ninth embodiment of the present invention.
Figure 31B:
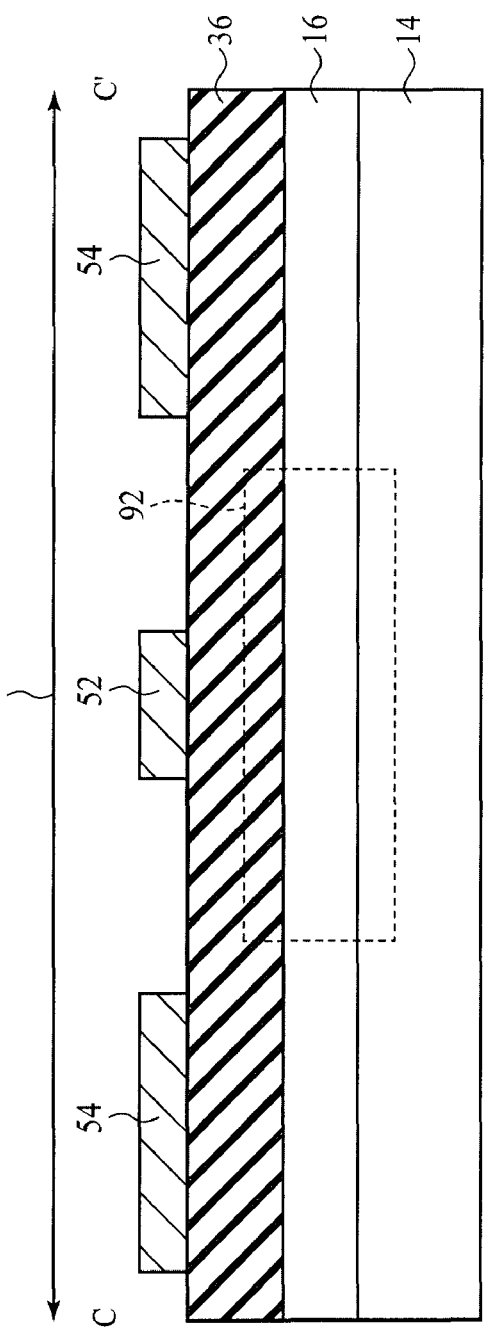
Figure 33A:
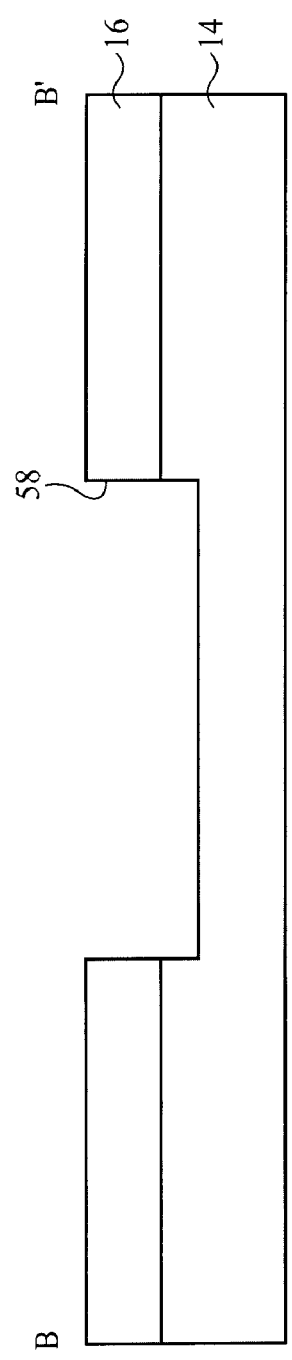
Figure 33B:
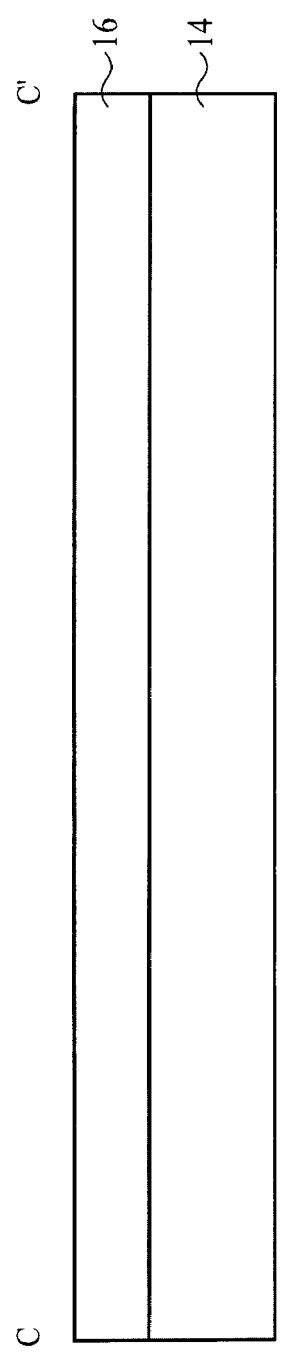
Figure 34:
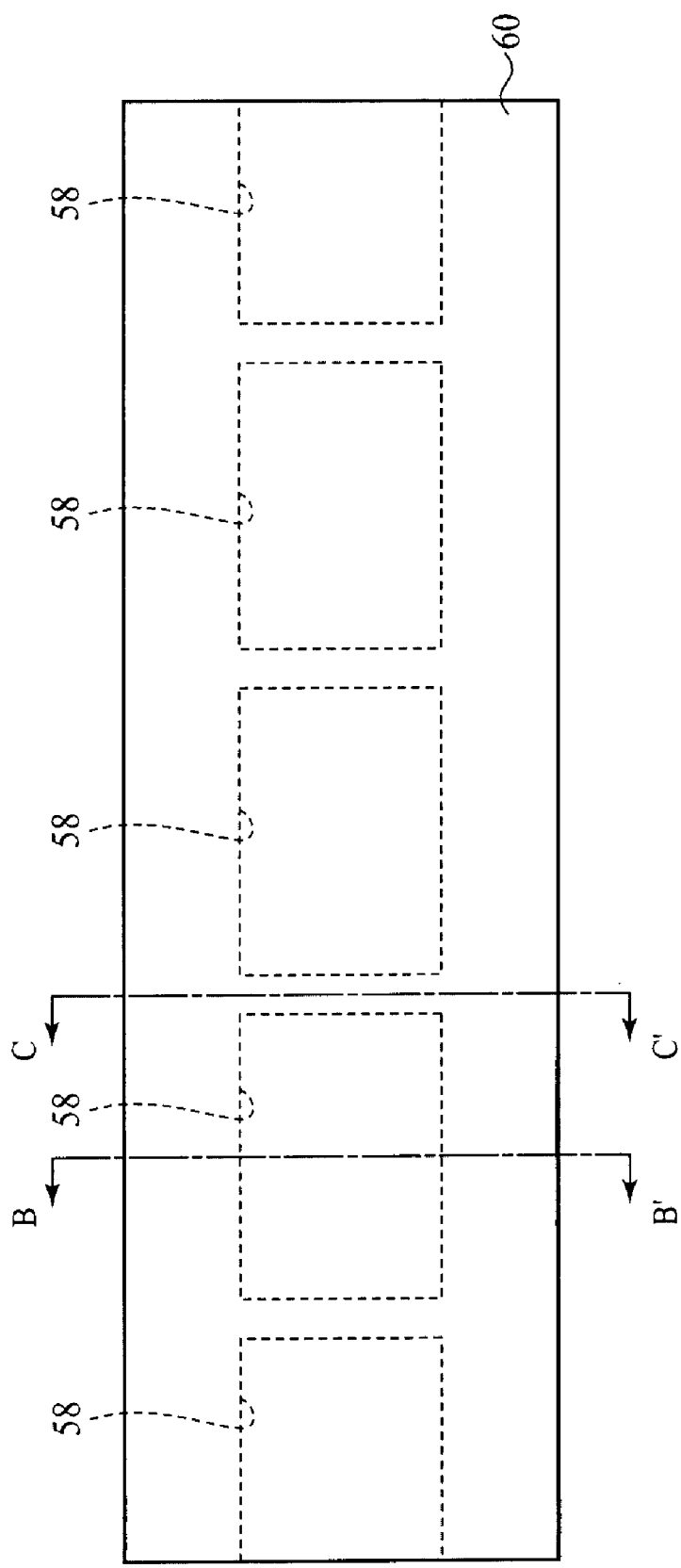
Figure 37A:
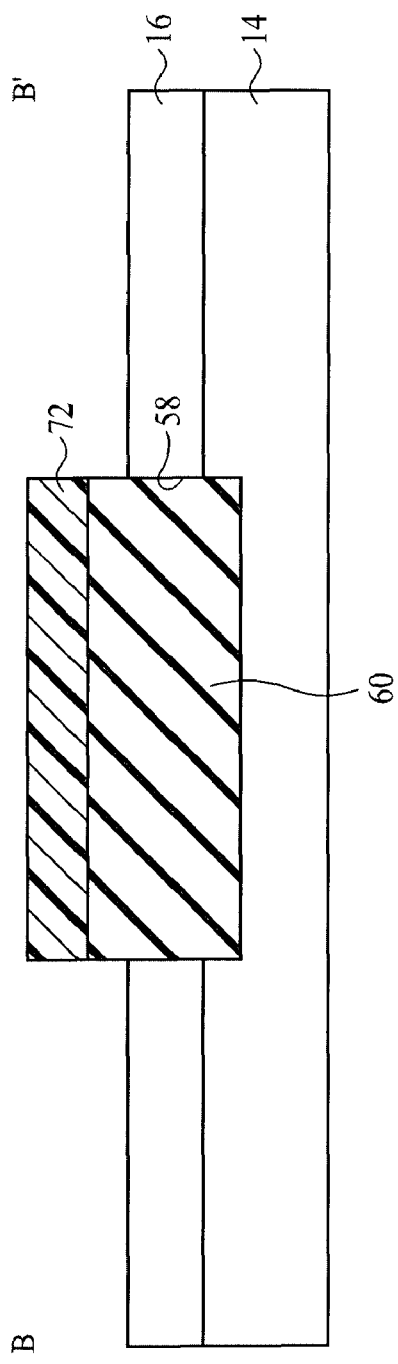
Figure 37B:
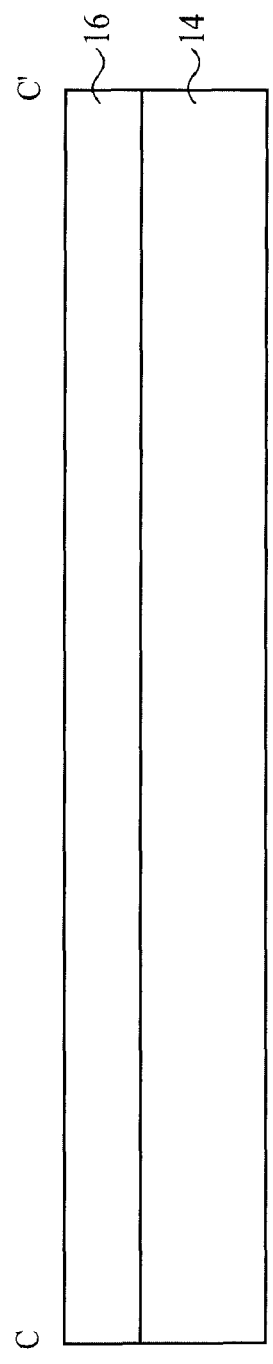
Figure 38:
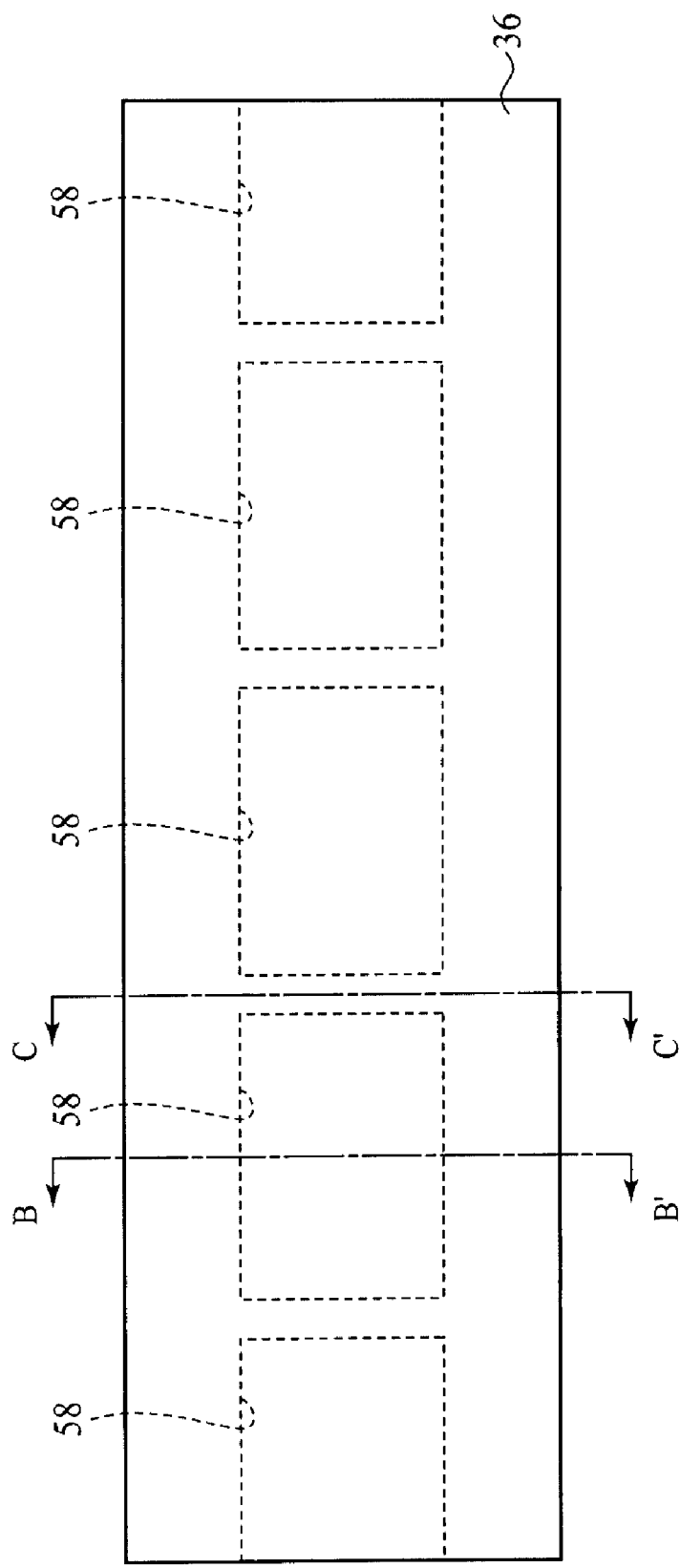
Figure 39A:
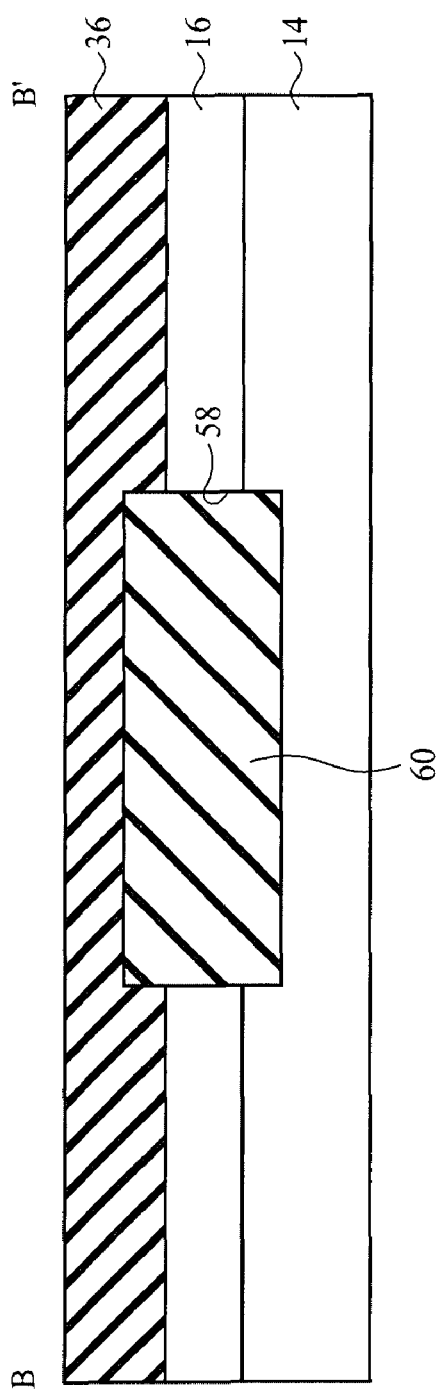
Figure 39B:
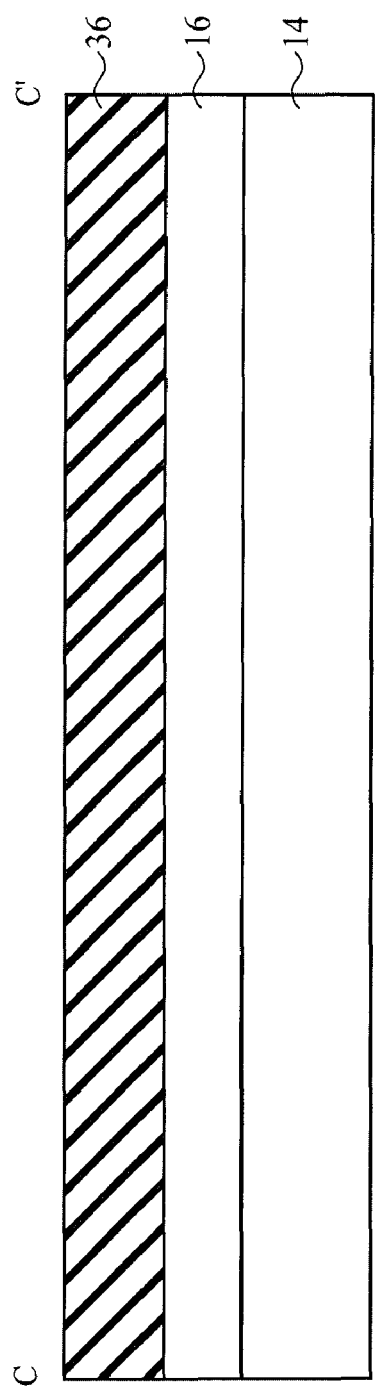

The semiconductor device and the method of manufacturing the same according to a ninth embodiment of the present invention will be explained with reference to FIGS. 30 to 47B. FIG. 30 is a plan view showing the structure of the semiconductor device according to the present embodiment. FIGS. 31A and 31B are sectional views showing the structure of the semiconductor device according to the present embodiment. FIGS. 32 to 47B are views showing the method of manufacturing the semiconductor device according to the present embodiment. The same members of the present embodiment as those of the semiconductor device and the method of manufacturing the same according to the second embodiment are represented by the same reference numbers not to repeat or to simplify their explanation.

First, the structure of the semiconductor device according to the present embodiment will be explained with reference to FIGS. 30, 31A and 31B. FIG. 31A is the sectional view along the B-B' line in FIG. 30, and FIG. 31B is the sectional view along the C-C' line in FIG. 30.

The basic structure of the semiconductor device according to the present embodiment is substantially the same as that of the semiconductor device according to the second embodiment. The semiconductor device according to the present embodiment is different from the semiconductor device according to the second embodiment in that cavities 46 have the ceilings supported not by the pillar-shaped supports 50 but by wall-shaped supports 92.

As shown in FIG. 30, below the signal line 52 sandwiched by the ground lines 54, a plurality of the cavities 46 are arranged along the signal line 52.

As shown in FIGS. 31A and 31B, a buffer layer 16 of an i-InAlAs layer is formed on an SI-InP substrate 14.

Over the buffer layer 16, an insulating film 36 of BCB is formed.

As shown in FIG. 31A, the cavities 46 are formed in the SI-InP substrate 14, the buffer layer 16 and the insulating film 36 from the upper part of the SI-InP substrate 14 to the lower part of the insulating film 36.

As shown in FIG. 31B, between each cavity 46 and its adjacent cavity 46, the wall-shaped support 92 is formed, which comprises the upper part of the SI-InP substrate 14, the buffer layer 16 and the insulating film 36 formed in a wall shape. In other words, as shown in FIG. 30, a cavity 47 formed below the signal line 52 along the signal line 52 is divided in a plurality of the cavities 46 by the wall-shaped supports 92 in the cavity 47. The insulating film 36, which is the ceiling of the cavity 47, i.e., the plural cavities 46, is supported by the wall-shaped supports 92.

As shown in FIGS. 31A and 31B, over the insulating film 36 supported by the wall-shaped supports 92, the signal line 52 is formed.

Over the insulating film 36 on both sides of the signal line 52, ground lines 54 are formed symmetrically, extended along the signal line 52.

Thus, in the interconnection region 12, the coplanar interconnection including the signal line 52 and the ground lines 54 is formed.

In such coplanar interconnection, as shown in FIGS. 30 and 31A, the cavities 46 are formed below the signal line 52 sandwiched by the ground lines 54 in a width larger than that of the signal line 52.

In the insulating film 36 between the ground lines 54 and the signal line 52, openings 56 are formed down to the cavities 46.

The semiconductor device according to the present embodiment is characterized mainly in that a plurality of the cavities 46 are formed below the signal line 52 in the SI-InP substrate 14, the buffer layer 16 and the insulating film 36, and the insulating film 36, which is the ceiling of the cavities 46, is supported by the wall-shaped supports 92 between the adjacent cavities 46.

In the semiconductor device according to the present embodiment, because of a plurality of the cavities 46 formed below the signal line 52, the dielectric loss generated in the transmitted high frequency signal can be decreased, and the attenuation of the high frequency signal can be suppressed. Furthermore, the ceilings of the cavities 46 are supported by the wall-shaped supports 92, and the mechanical strength of the cavities 46 is ensured, whereby the collapse of the cavity 46 can be prevented. Thus, the high frequency characteristics of the semiconductor device can be improved while the reliability of the mechanical strength is ensured.

Next, the method of manufacturing the semiconductor device according to the present embodiment will be explained with reference to FIGS. 32 to 47B. FIGS. 32, 34, 36, 38, 40, 42, 44 and 46 are plan views. FIGS. 33A, 35A, 37A, 39A, 41A, 43A, 45A and 47A are the sectional views respectively along the B-B' line in FIGS. 32, 34, 36, 38, 40, 42, 44 and 46. FIGS. 33B, 35B, 37B, 39B, 41B, 43B, 45B and 47B are the sectional views respectively along the C-C' line in FIGS. 32, 34, 36, 38, 40, 42, 44 and 46.

First, over the SI-InP substrate 14, the buffer layer 16 of, e.g., a 2 µm-thickness i-InAlAs layer is deposited by, e.g., MOCVD method.

Next, after prescribed device forming steps have been performed, the buffer layer 16 in the interconnection region 12 is exposed.

Next, by photolithography and wet etching, the buffer layer 16 and the SI-InP substrate 14 in the regions where a plurality of the cavities 46 are to be formed are etched. Thus, in the plural regions for a plurality of the cavities 46 to be formed in, openings 58 are respectively formed in the buffer layer 16 and the upper part of the SI-InP substrate 14 (see FIGS. 32, 33A and 33B). For etching the buffer layer 16 of the i-InAlAs layer, a mixed liquid of phosphoric acid and hydrogen peroxide liquid, for example, can be used as the etchant. For etching the SI-InP substrate 14, a mixed liquid of hydrochloric acid and phosphoric acid, for example, can be used.

Next, to the entire surface, PMGI is applied by, e.g., spin coating. Subsequently, the applied PMGI is hardened by, e.g., 100° C. thermal processing. Thus, a PMGI layer 60 is formed in the plural openings 58 and over the buffer layer 16 (see FIGS. 34, 35A and 35B).

Next, by photolithography, a photoresist film 72 for covering the regions for the plurality cavities 46 to be formed in and exposing the rest region is formed.

Then, with the photoresist film 72 as the mask, the PMGI layer 60 over the buffer layer 16 is etched by, e.g., dry etching. As the etching gas, an oxygen-based gas, for example, can be used. Thus, the PMGI layer 60 over the buffer layer 16 is removed (see FIGS. 36, 37A and 37B).

After the PMGI layer 60 over the buffer layer 16 has been removed, the photoresist film 72 used as the mask is removed.

Then, to the entire surface, BCB is applied by, e.g., spin coating. Subsequently, the applied BCB is hardened by heating with, an oven. Thus, over the buffer layer 16 and the PMGI layer 60, the insulating film 36 of BCB is formed (see FIGS. 38, 39A and 39B).

Figure 40:
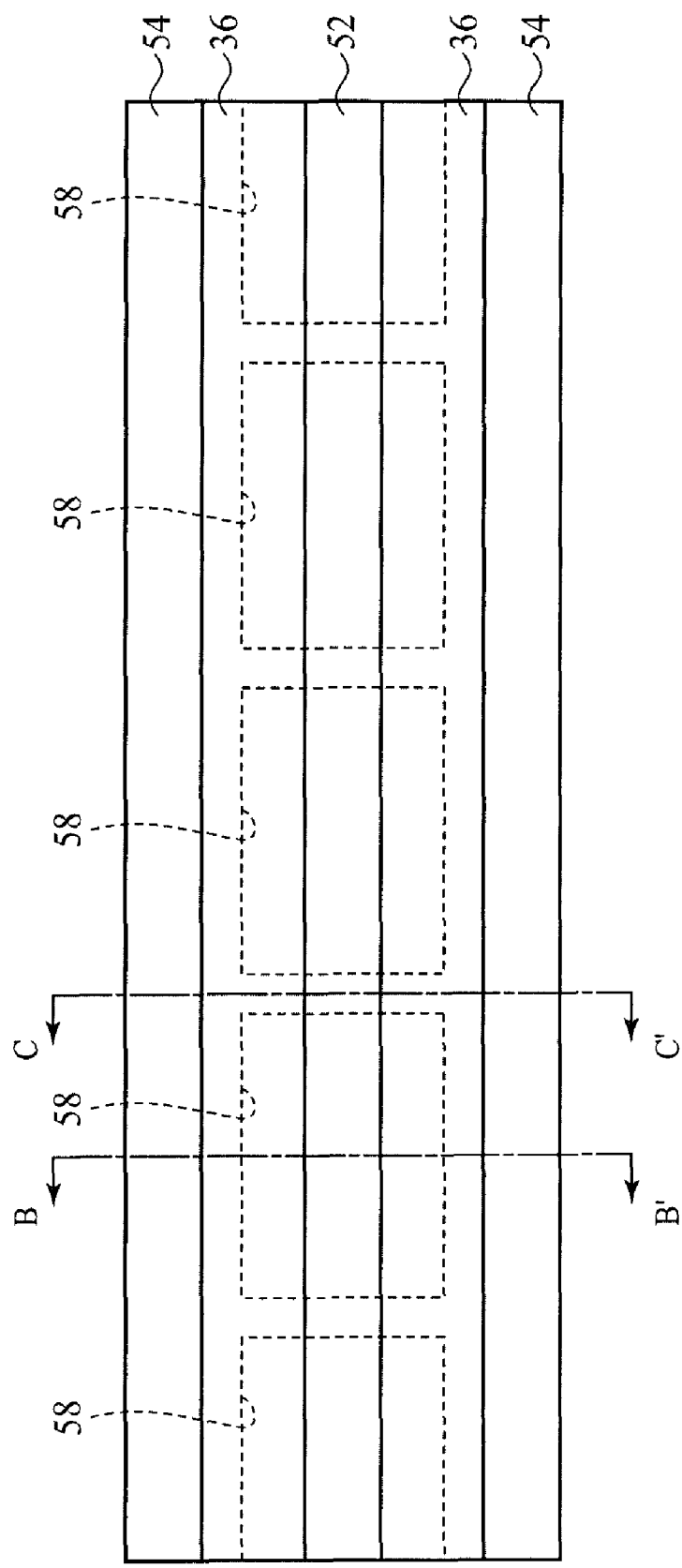
Figure 41A:
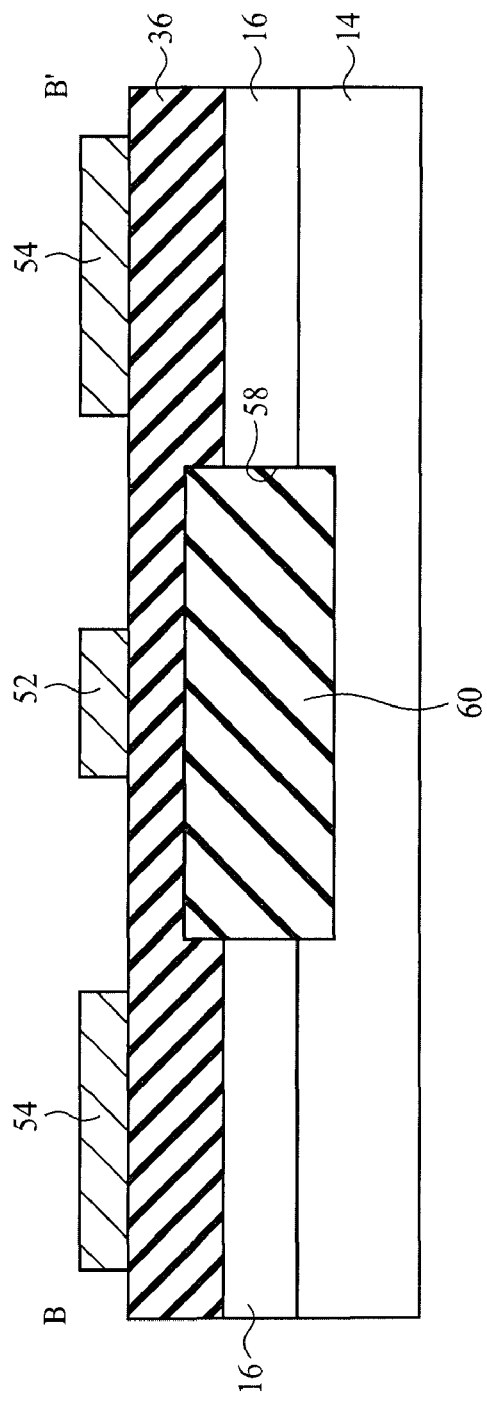
Figure 41B:
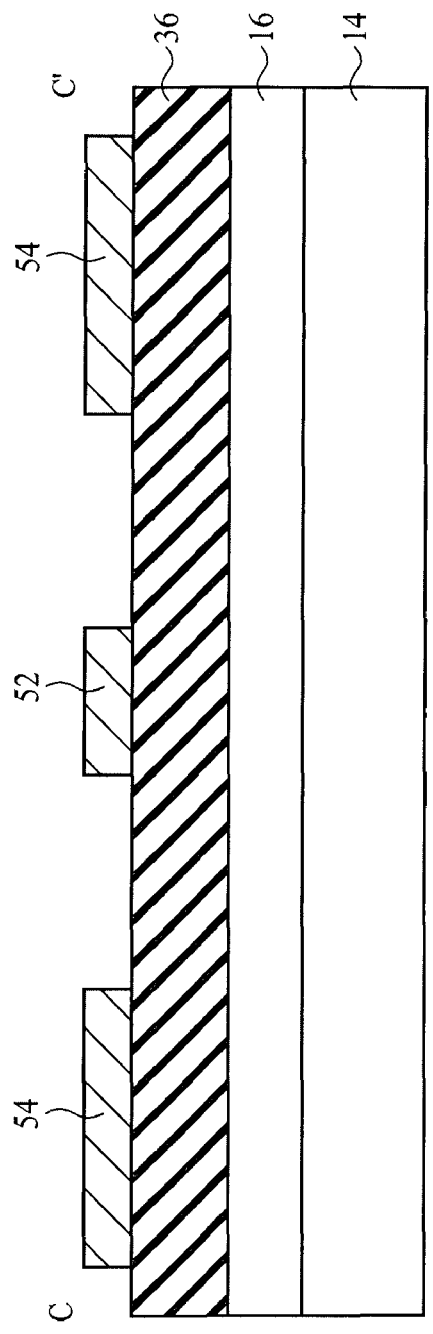

Then, over the insulating film 36 in the regions where the PMGI layer 60 is formed, the signal line 52 of Au is formed by, e.g., plating while the ground lines 54 of Au are formed over the insulating film 36 on both sides of the signal line 52 (see FIGS. 40, 41A and 41B).

Figure 42:
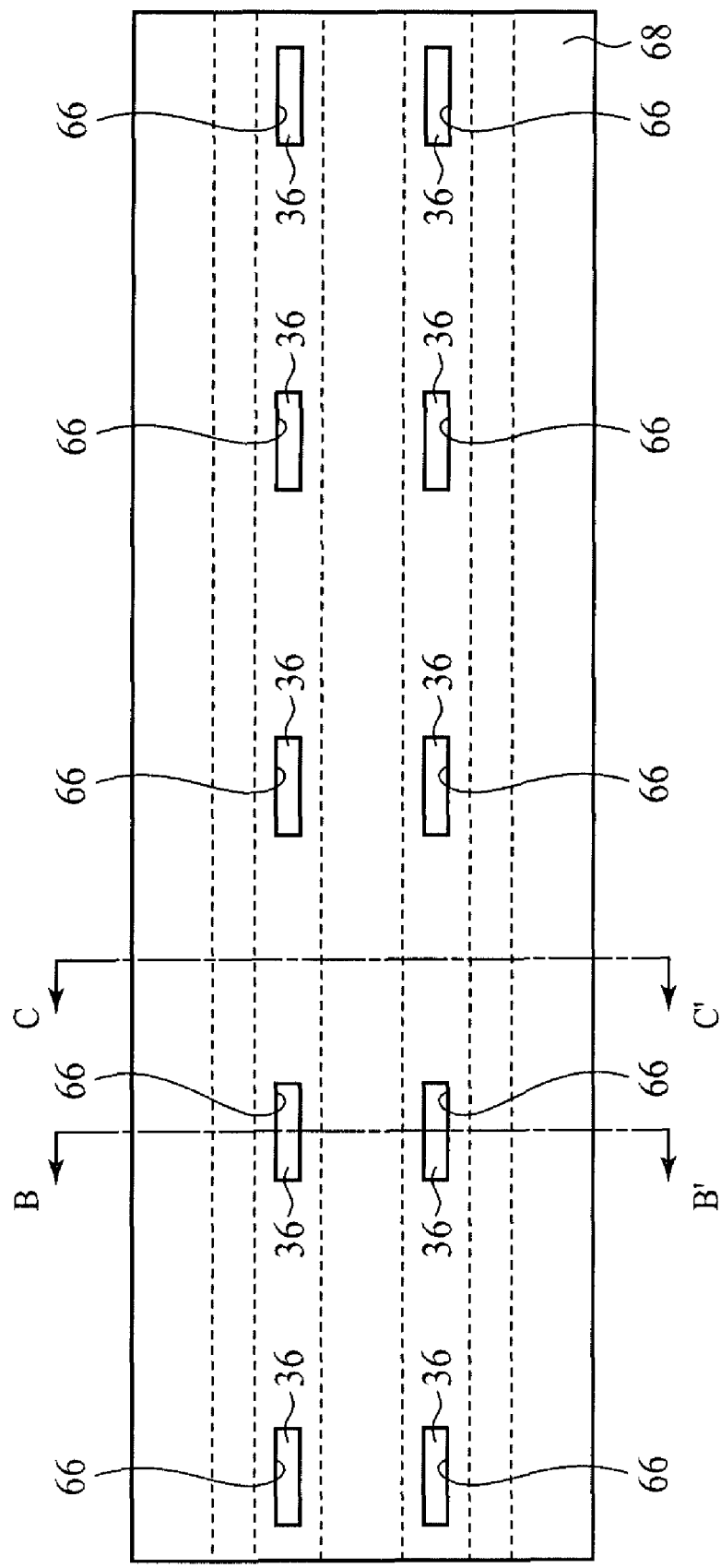
Figure 44:
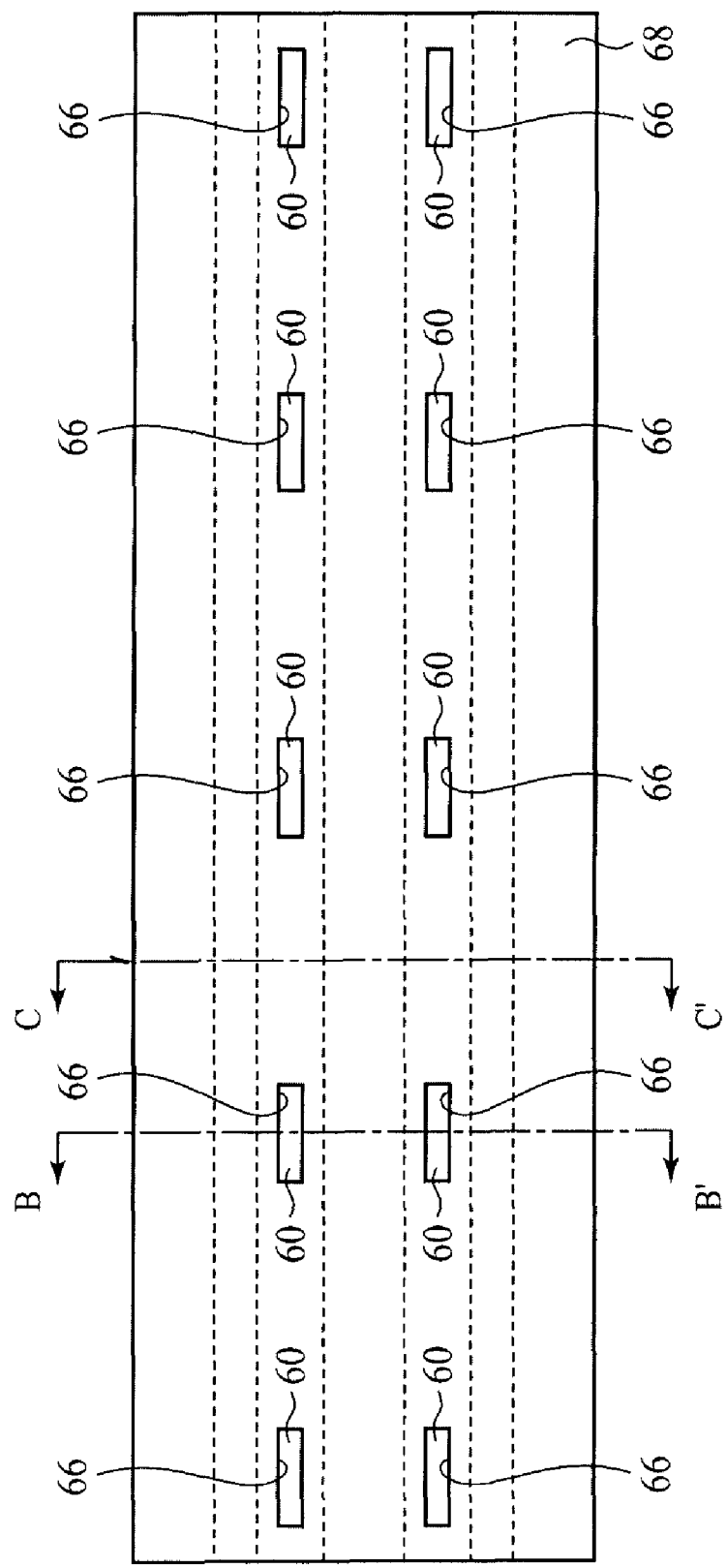
Figure 45A:
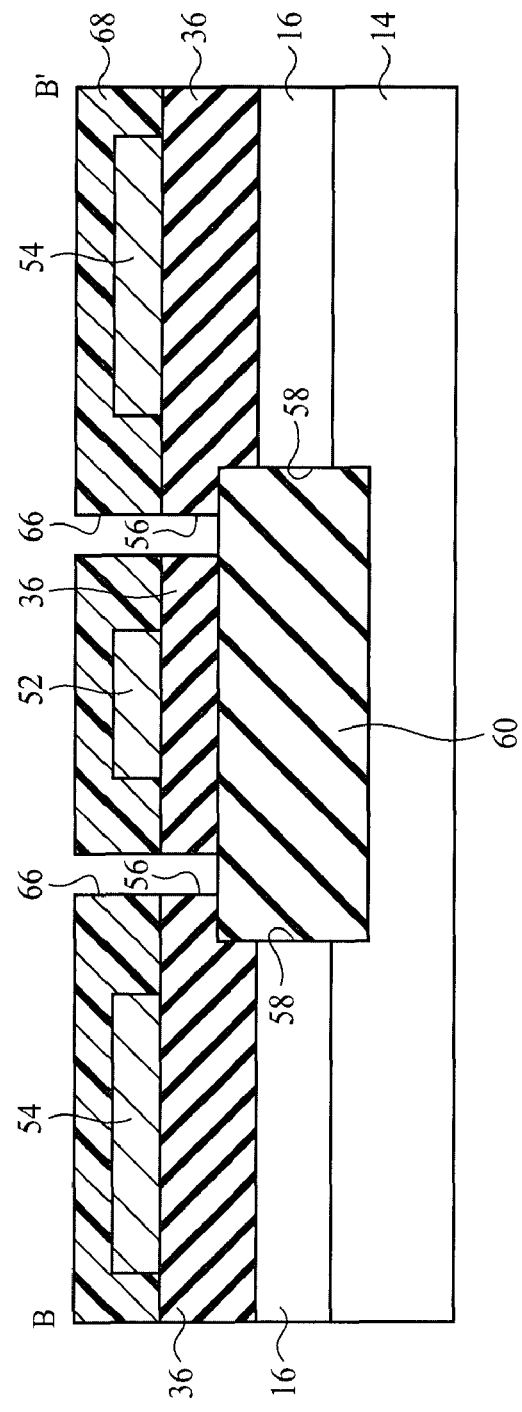
Figure 45B:
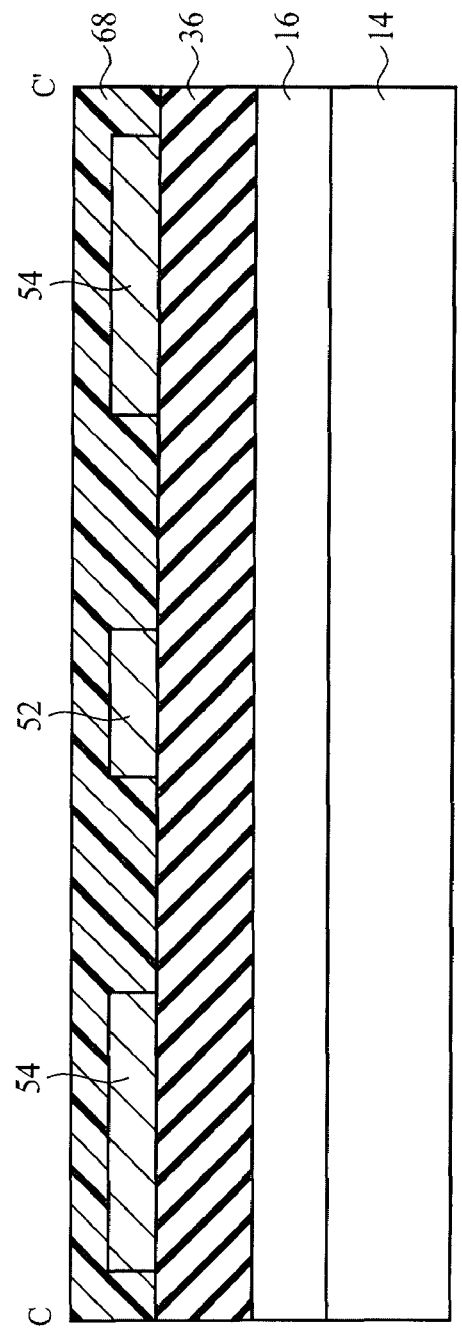
Figure 46:
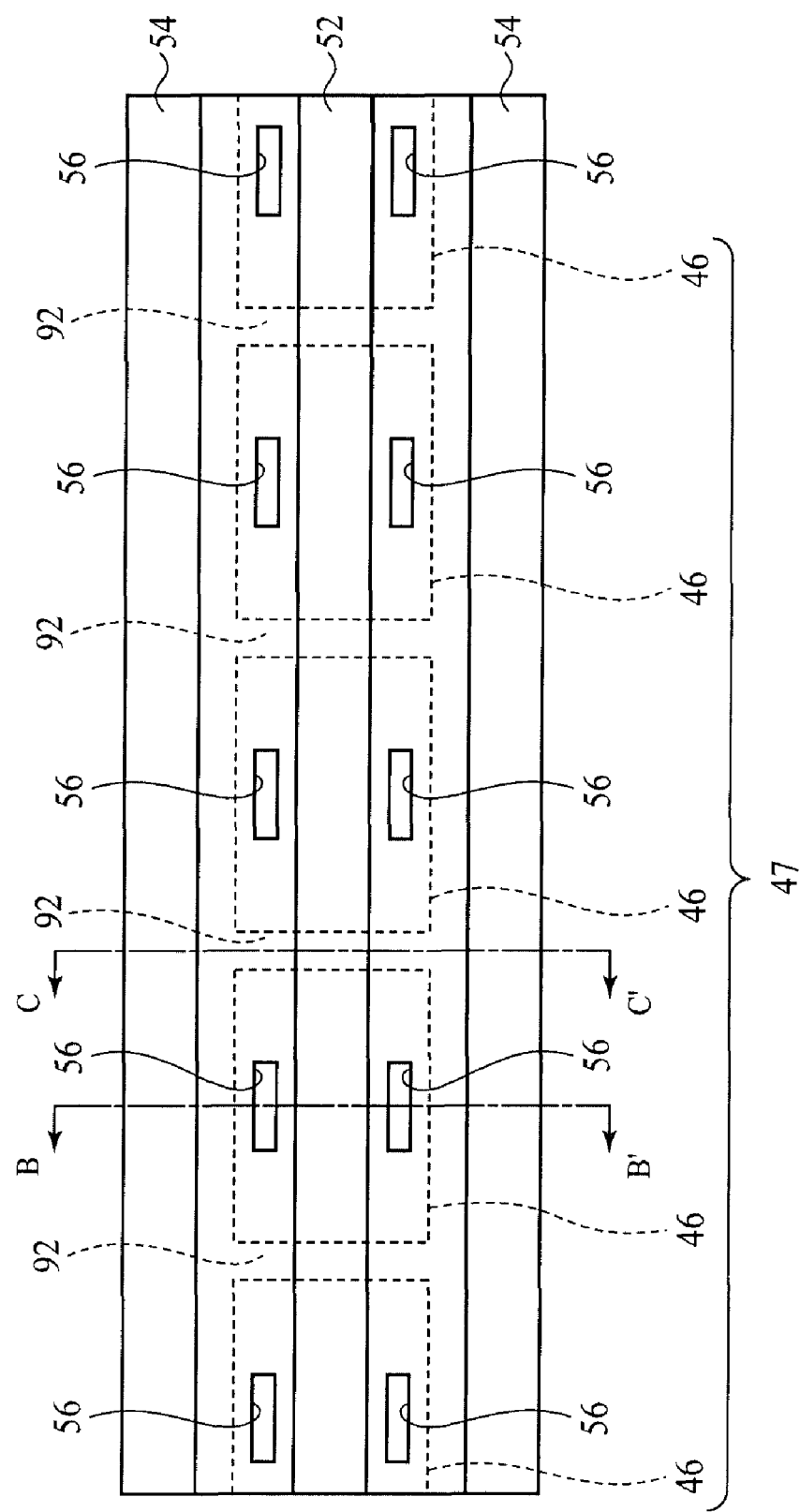
Figure 47A:
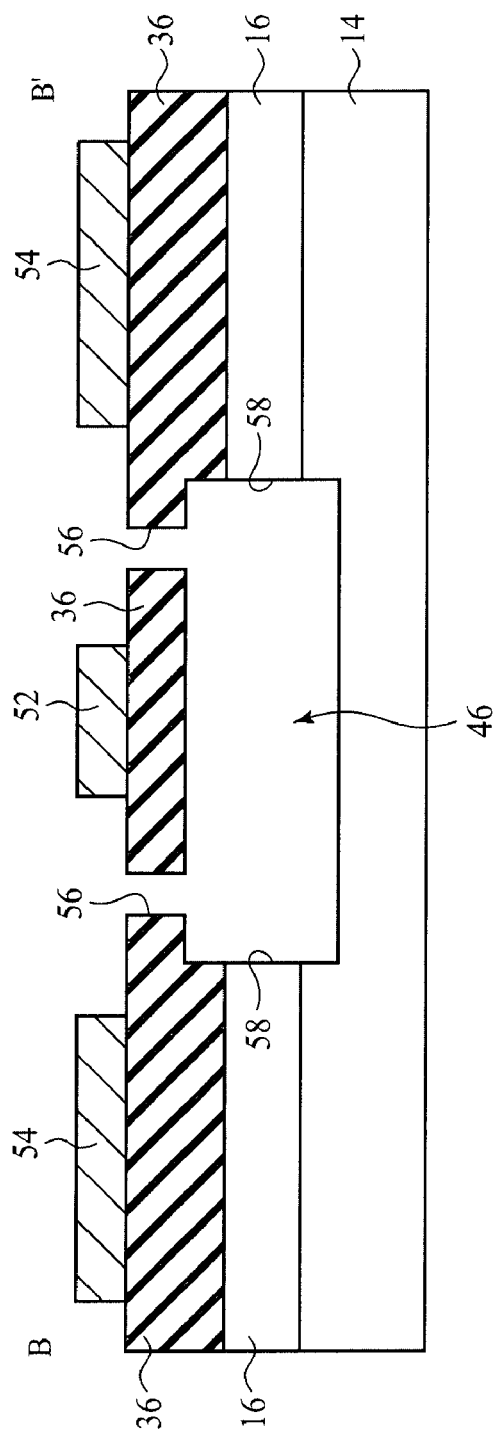
Figure 47B:
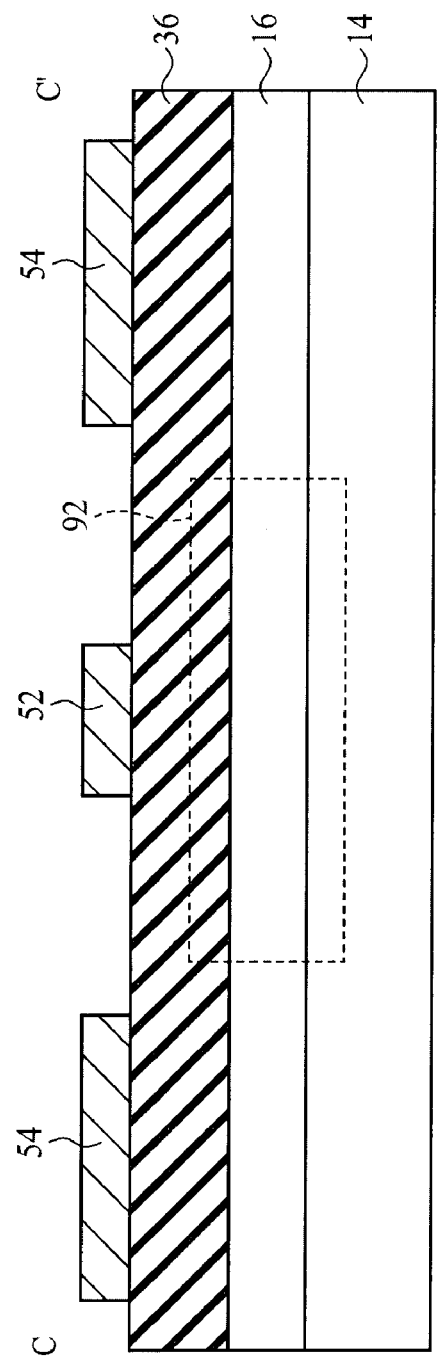

Next, over the insulating film 36 with the signal line 52 and the ground lines 54 formed over, a photoresist film 68 having openings 66 for exposing the regions for the openings 56 to be formed down to the PMGI layer 60 is formed by photolithography (see FIGS. 42, 43A and 43B).

Next, with the photoresist film 68 as the mask, the insulating film 36 exposed in the openings 66 is etched by, e.g., dry etching. Thus, in the insulating film 36, the openings 56 are formed down to the PMGI layer 60 (see FIGS. 44, 45A and 45B).

After the openings 56 have been formed, the photoresist film 68 used as the mask is removed.

Next, the substrate is immersed in NMP to dissolve the PMGI layer 60 with the NMP intruding through the openings 56 and remove the PMGI layer 60. Thus, the plurality of cavities 46 are formed in the SI-InP substrate 14, the buffer layer 16 and the insulating film 36 below the signal line 52. Between each of the cavities 46 and its adjacent one, the wall-shaped supports 92 are formed of the SI-InP substrate 14, the buffer layer 16 and the insulating film 36 (see FIGS. 46, 47A and 47B). The insulating film 36, which is the ceiling of the cavities 46, is supported by the wall-shaped support 92.

Thus, the semiconductor device according to the present embodiment is manufactured.

As described above, according to the present embodiment, below the signal line 52, a plurality of cavities 46 having the ceilings of the insulating film 36 supported by the wall-shaped supports 92 are formed, whereby the collapse of the ceilings of the cavities 46 is prevented, the dielectric loss generated in the transmitted high frequency signal is decreased, and the attenuation of the high frequency signal can be suppressed. Accordingly, the semiconductor device can improve the high frequency characteristics while ensuring the reliability of the mechanical strength.

In the above, in the semiconductor device according to the second embodiment, the wall-shaped supports 92 in place of the pillar-shaped supports 50 is used, but in the semiconductor device according to the first, and the third to the eighth embodiments, the wall-shaped supports 92 in place of the pillar shaped supports 50 can be used as in the semiconductor device according to the present embodiment.

In the above, as the supports for supporting the ceiling of the cavities 46, the wall-shaped supports 92 alone are formed, but in addition to the wall-shaped supports 92, the pillar-shaped supports 50 may be formed.

Modified Embodiments

The present invention is not limited to the above-described embodiments and covers other various modifications.

For example, in the above-described embodiments, the coplanar interconnection is formed over the substrate, but the structure of the interconnection to be formed over the substrate is not limited to this. As the interconnection to be formed over the substrate, in addition to the coplanar interconnection, microstrip interconnection can be formed.

In the above-described embodiments, as the semi-insulating semiconductor substrate, the SI-InP substrate 14 is used. However, the semi-insulating semiconductor substrate is not limited to this and can be any other semi-insulating semiconductor substrate.

In the above-described embodiments, as the conductive semiconductor substrate, the n-InP substrate 74 and the n-SiC substrate 86 are used. However, the conductive semiconductor substrate is not limited to them and can be any other conductive semiconductor substrate.

In the above-described embodiments, as the buffer layer 16, an i-InAlAs layer is used but the buffer layer 16 is not limited to this. As the buffer layer 16, in addition to an i-InAlAs layer, various semiconductor layers can be used, depending on substrate materials, and devices to be formed over the substrate.

In the above-described embodiments, as the insulating films 34, 36 formed over the buffer layer 16, BCB films are used but the insulating films 34, 36 are not limited to this. As the insulating films 34, 36, in addition to a BCB film, a silicon nitride film and a polyimide film, for example, can be used.

In the above-described embodiments, the PMGI layer is used to form the cavity 46. However, in place of the PMGI layer 60, a resin layer or others which is dissoluble with a solvent or others after hardened can be suitably formed.

In the above-described embodiments, the pillar-shaped supports 50 are formed, arranged in a line or plural lines at a prescribed interval but may be arranged at random.

In the above-described embodiments, the InP-HEMT is formed over the substrate. However, the device to be formed over the substrate is not limited to this, and various devices can be formed.

What is claimed is:

1. A semiconductor device comprising:
   a semiconductor layer formed over a substrate;
   an insulating film formed over the semiconductor layer;
   an interconnection formed over the insulating film;
   a cavity formed in at least the semiconductor layer below the interconnection; and
   a support formed on the substrate in the cavity supporting the insulating film, the support being located immediately below the interconnection.

2. A semiconductor device according to claim 1, wherein the support is a pillar-shaped support formed over the substrate in the cavity.

3. A semiconductor device according to claim 1, wherein the cavity is formed down to an upper part of the substrate below the semiconductor layer.

4. A semiconductor device according to claim 1, wherein an opening is formed in the insulating film down to the cavity.

5. A semiconductor device according to claim 1, wherein the interconnection is a signal line formed over the insulating film over the cavity, and the semiconductor device further comprises ground lines formed over the insulating film on both sides of the signal line.

6. A semiconductor device according to claim 5, wherein the substrate is a conductive substrate, and the ground line includes a connection buried in an opening formed in the insulating film and the semiconductor layer and connected to the substrate.

7. A semiconductor device according to claim 6, wherein the cavity is formed, extended to below a part of the ground line on a side of the signal line with respect to the connection.

8. A semiconductor device according to claim 7, further comprising
   a sidewall layer formed on a side wall of the connection, the sidewall layer formed on the side wall of the connection on the side of the signal line being partially exposed in the cavity.

9. A semiconductor device according to claim 1, further comprising
   a protective film formed on surfaces of the substrate, the semiconductor layer and the insulating film exposed in the cavity.

* * * * *